(12) United States Patent
Shibayama

(10) Patent No.: US 7,964,898 B2
(45) Date of Patent: Jun. 21, 2011

(54) BACK ILLUMINATED PHOTODETECTOR

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 71 days.

(21) Appl. No.: 12/453,232

(22) Filed: May 4, 2009

(65) Prior Publication Data

US 2010/0019340 A1    Jan. 28, 2010

Related U.S. Application Data

(63) Continuation of application No. 10/565,942, filed as application No. PCT/JP2004/010503 on Jul. 23, 2004, now Pat. No. 7,560,790.

(30) Foreign Application Priority Data

Jul. 29, 2003  (JP) ................................ P2003-282164

(51) Int. Cl.
*H01L 27/146*  (2006.01)
(52) U.S. Cl. ................. 257/228; 257/222; 257/E31.117
(58) Field of Classification Search .................. 257/222, 257/226, 228, 434, E31.117
See application file for complete search history.

(56) References Cited

U.S. PATENT DOCUMENTS

| | | | | |
|---|---|---|---|---|
| 6,674,159 B1 * | 1/2004 | Peterson et al. | ............... | 257/680 |
| 6,686,588 B1 * | 2/2004 | Webster et al. | ............... | 250/239 |
| 7,250,663 B2 * | 7/2007 | Campbell | ..................... | 257/433 |
| 2008/0268563 A1 | 10/2008 | Derderian et al. | | |

FOREIGN PATENT DOCUMENTS

| | | |
|---|---|---|
| EP | 0 697 743 | 2/1996 |
| EP | 1 548 836 | 6/2005 |
| JP | 55-065448 | 5/1980 |
| JP | 60-211858 | 10/1985 |
| JP | 2-185070 | 7/1990 |
| JP | 5-136261 | 6/1993 |
| JP | 6-204336 | 7/1994 |
| JP | 6-310043 | 11/1994 |
| JP | 7-183255 | 7/1995 |
| JP | 8-111542 | 4/1996 |
| JP | 8-293476 | 11/1996 |
| JP | 9-172029 | 6/1997 |
| JP | 9-219421 | 8/1997 |

(Continued)

*Primary Examiner* — Jerome Jackson, Jr.
*Assistant Examiner* — Paul A Budd
(74) *Attorney, Agent, or Firm* — Drinker Biddle & Reath LLP

(57) ABSTRACT

The present invention provides a back illuminated photodetector having a sufficiently small package as well as being capable of suppressing the scattering of to-be-detected light and method for manufacturing the same. A back illuminated photodiode 1 comprises an N-type semiconductor substrate 10, a P$^+$-type impurity semiconductor region 11, a recessed portion 12, and a window plate 13. In the surface layer on the upper surface S1 side of the N-type semiconductor substrate 10 is formed the P$^+$-type impurity semiconductor region 11. In the rear surface S2 of the N-type semiconductor substrate 10 and in an area opposite the P$^+$-type impurity semiconductor region 11 is formed the recessed portion 12 that functions as an incident part for to-be-detected light. Also, the window plate 13 is bonded to the outer edge portion 14 of the recessed portion 12. The window plate 13 covers the recessed portion 12 and seals the rear surface S2 of the N-type semiconductor substrate 10.

8 Claims, 69 Drawing Sheets

FOREIGN PATENT DOCUMENTS

| | | |
|---|---|---|
| JP | 10-83974 | 3/1998 |
| JP | 2000-299489 | 10/2000 |
| JP | 2000-100980 | 11/2000 |
| JP | 2002-319669 | 10/2002 |
| WO | 96/36999 | 5/1996 |
| WO | 97/23897 | 7/1997 |
| WO | 2004/019411 | 3/2004 |
| WO | 2005/008788 | 1/2005 |

\* cited by examiner

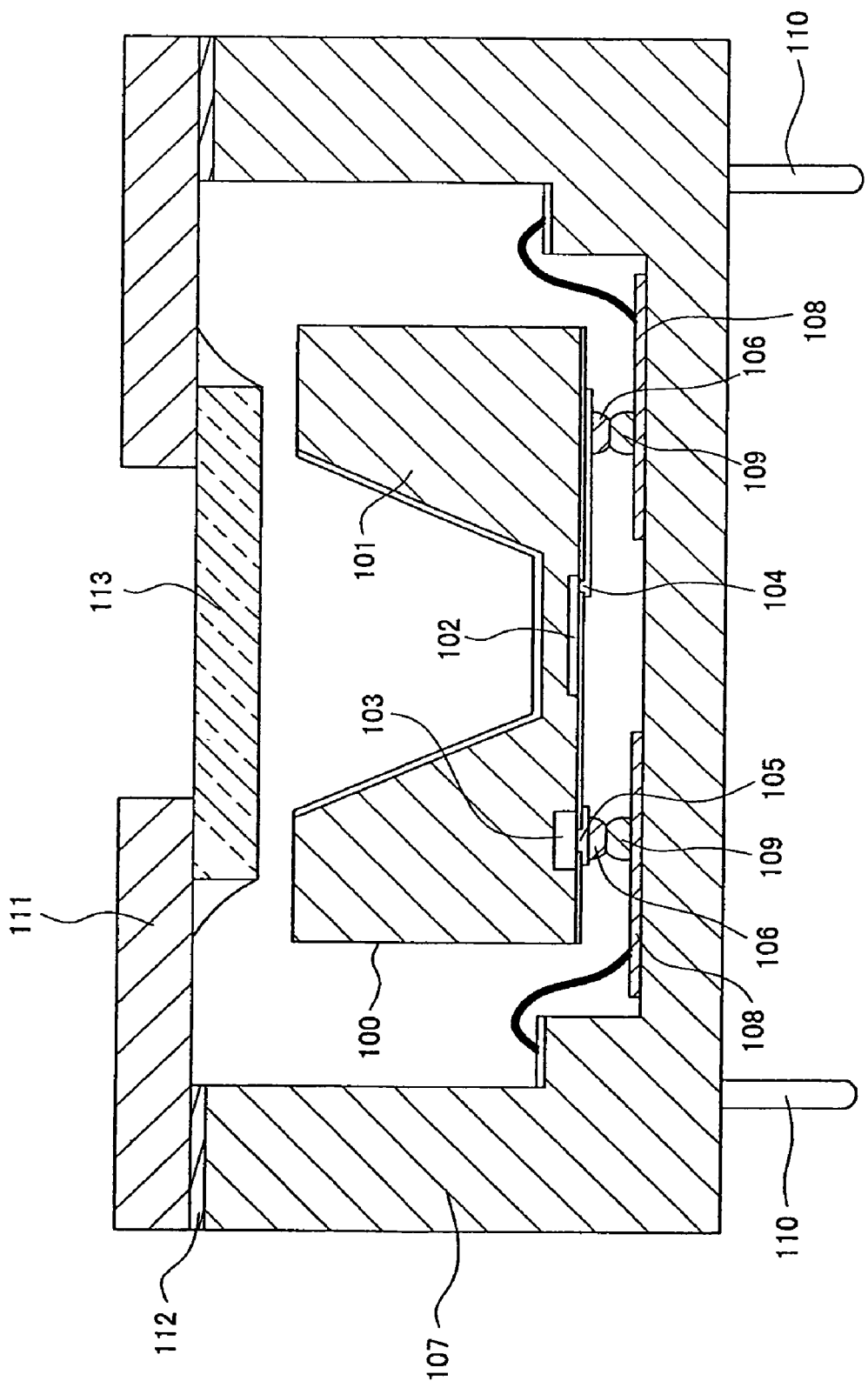

BACK ILLUMINATED PHOTODETECTOR

This is a continuation application of application Ser. No. 10/565,942, having a §371 date of Jul. 12, 2006 now U.S. Pat. No. 7,560,790, which is a national stage filing based on PCT International Application No. PCT/JP2004/010503, filed on Jul. 23, 2004. The application Ser. No. 10/565,942 is incorporated by reference herein in its entirety.

TECHNICAL FIELD

The present invention relates to a back illuminated photodetector and method for manufacturing the same.

BACKGROUND ART

In such a conventional back illuminated photodiode 100 as shown in FIG. 69, in the superficial surface layer of an N-type silicon substrate 101 are formed a $P^+$-type highly-doped impurity semiconductor region 102 and an $N^+$-type highly-doped impurity semiconductor region 103. The $P^+$-type highly-doped impurity semiconductor region 102 and the $N^+$-type highly-doped impurity semiconductor region 103 are connected, respectively, with an anode electrode 104 and a cathode electrode 105. On the electrodes 104 and 105 are formed bump electrodes 106 made from solder. Also, the N-type silicon substrate 101 is thinned in the portion corresponding to the $P^+$-type highly-doped impurity semiconductor region 102 from the rear surface side thereof The thinned portion functions as an incident part for to-be-detected light.

As shown in FIG. 69, the back illuminatedback illuminated photodiode 100 is packed into a ceramic package 107 by flip-chip bonding. That is, the bump electrodes 106 of the back illuminated photodiode 100 are connected to solder pads 109 provided on a bottom wiring 108 of the ceramic package 107. The bottom wiring 108 is connected to output terminal pins 110 through wire bonding. Also, on the surface of the ceramic package 107 is seam-welded a window frame 111 using brazing material 112. In the window frame 111 is formed an opening at the position corresponding to the thinned portion of the back illuminated photodiode 100, and in the opening is provided a transparent window member 113 such as kovar glass for transmitting to-be-detected light.

Patent Document 1: Japanese Published Unexamined Patent Application No. H09-219421

DISCLOSURE OF THE INVENTION

Problems to be Solved by the Invention

However, in such an arrangement of using a ceramic package in a back illuminated photodiode as above, there is a problem in that the package becomes larger.

Meanwhile, in Patent Document 1 is disclosed a CSP (Chip Size Package) technique for semiconductor electronic components. This technique is adapted to seal the both surfaces of a wafer with semiconductor electronic components built therein using organic material such as resin, and then to form an opening in the organic material provided on one surface side of the wafer by photolithography to form electrodes therein.

Although it can be considered to apply such a CSP technique to a back illuminated photodiode to reduce the package size, there occurs the following problem in this case. That is, in the case of a back illuminated photodiode with the rear surface being sealed with resin, the resin surface functions as an incident plane for to-be-detected light. However, it may be difficult to flatten the resin surface sufficiently on the order of the wavelength of the to-be-detected light. Unless the resin surface is flattened sufficiently, the incident plane for to-be-detected light remains rough, resulting accordingly in a problem in that the to-be-detected light may be scattered at the incident plane. Then, the scattering of to-be-detected light also leads to a reduction in the sensitivity of the back illuminated photodiode.

The present invention has been made to solve the above-described problems, and an object thereof is to provide a back illuminated photodetector having a sufficiently small package as well as being capable of suppressing the scattering of to-be-detected light and method for manufacturing the same.

Means for Solving the Problems

The present invention is directed to a back illuminated photodetector comprising: a first conductive type semiconductor substrate; a second conductive type impurity semiconductor region provided in the first superficial surface layer of the semiconductor substrate; a recessed portion for incidence of to-be-detected light formed in the second surface of the semiconductor substrate and in an area opposite the impurity semiconductor region; and a window plate bonded to the outer edge portion of the recessed portion in such a manner as to cover the recessed portion to transmit the to-be-detected light In the back illuminated photodetector, the window plate is bonded to the outer edge portion of the semiconductor substrate. This eliminates the use of an external package such as a ceramic package, whereby it is possible to obtain a chip-sized back illuminated photodetector. Accordingly, it is possible to achieve a back illuminated photodetector having a sufficiently small package.

Further, in the back illuminated photodetector, the surface of the window plate functions as an incident plane for to-be-detected light. Since the surface of the window plate can be flattened more easily than resin, it is possible to suppress the scattering of to-be-detected light at the incident plane.

The back illuminated photodetector preferably comprises a supporting film provided on the first surface of the semiconductor substrate to support the semiconductor substrate. In this case, the mechanical strength of the back illuminated photodetector can be increased.

The back illuminated photodetector preferably comprises a filling electrode penetrating through the supporting film and connected electrically to the impurity layer at one end thereof. In this case, it is possible to take a detected signal easily outside the back illuminated photodetector.

It is preferred that the window plate is made of an optically transparent material and is bonded to the outer edge portion by anodic bonding. In this case, it is possible to bond the window plate and the outer edge portion solidly at the interface therebetween.

It is preferred that the optically transparent material is quartz, and that the window plate is bonded to the outer edge portion via glass containing alkali metal and formed on the window plate. In this case, since quartz has an especially high transmissivity for visible light and UV light, the sensitivity of the back illuminated photodetector can be increased. Also, alkali metal, for example, Pyrex (registered trademark) glass can be cited, which ensures solid anodic bonding between the window plate made of quartz and the outer edge portion.

It is preferred that the window plate is bonded to the outer edge portion via a metal layer. In this case, the window plate and the outer edge portion can be bonded solidly by metal bonding.

The back illuminated photodetector may be characterized in that a stepped portion is formed in a side surface of the semiconductor substrate or in a side surface of the window plate. The stepped portion can be formed by performing a plurality of dicing steps and using a blade having a different thickness in each step. Performing a plurality of dicing steps allows the semiconductor substrate and the window plate having their respective different hardnesses to be diced using a blade suitable for each thereof. It is therefore possible to prevent chipping at the interface between the semiconductor substrate and the window plate in a dicing operation.

It is preferred that a highly-doped impurity semiconductor layer with impurities of the first conductive type added thereto at a high concentration is provided in the second superficial surface layer in the outer edge portion of the semiconductor substrate. In this case, even if there may be crystal defects in the vicinity of the second superficial surface in the outer edge portion, the provided highly-doped impurity semiconductor layer can suppress dark current and/or noise caused by unnecessary carriers due to the crystal defects.

It is preferred that a highly-doped impurity semiconductor layer with impurities of the first conductive type added thereto at a high concentration is provided in the bottom portion of the recessed portion within the second superficial surface layer of the semiconductor substrate. The highly-doped impurity semiconductor layer functions as an accumulation layer. This allows carriers generated upon incidence of to-be-detected light to be guided to the PN junction effectively by the electric field distribution in the layer, resulting in an increase in sensitivity.

It is preferred that a highly-doped impurity semiconductor region with impurities of the first conductive type added thereto at a high concentration is exposed across the entire side surface of the semiconductor substrate. In this case, even if a side surface of the semiconductor substrate may be damaged mechanically through dicing, etc., the provided highly-doped impurity semiconductor region can suppress dark current and/or noise caused by unnecessary carriers that are generated in the vicinity of the side surface of the semiconductor substrate.

It is preferred for the back illuminated photodetector that the window plate has a square cross-sectional shape with at least one corner being chamfered in a plane perpendicular to the thickness direction thereof. In this case, it is possible to prevent chipping when dicing the back illuminated photodetector.

A method for manufacturing a back illuminated photodetector according to the present invention is characterized by comprising a impurity semiconductor region forming step of forming a second conductive type impurity semiconductor region in the first superficial surface layer of a first conductive type semiconductor substrate; a recessed portion forming step of forming a recessed portion for incidence of to-be-detected light in the second surface of the semiconductor substrate and in an area opposite the impurity semiconductor region; and a window plate bonding step of bonding a window plate for transmitting the to-be-detected light to the outer edge portion of the recessed portion in such a manner as to cover the recessed portion.

In accordance with the manufacturing method above, the window plate is bonded to the outer edge portion of the semiconductor substrate in the window plate bonding step. This eliminates the use of an external package such as a ceramic package, whereby it is possible to obtain a chip-sized back illuminated photodetector. In accordance with the present manufacturing method, it is therefore possible to achieve a back illuminated photodetector having a sufficiently small package.

It is preferred that the window plate is made of an optically transparent material, and in the window plate bonding step, the window plate is bonded to the outer edge portion by anodic bonding. In this case, it is possible to bond the window plate and the outer edge portion solidly at the interface therebetween.

It is preferred that in the window plate bonding step,: the window plate is bonded to the outer edge portion via a metal layer. In this case, the window plate and the outer edge portion can be bonded solidly by metal bonding.

It is preferred that in the impurity semiconductor region forming step, a plurality of the impurity semiconductor regions are formed; in the recessed portion forming step, a plurality of the recessed portions are formed, respectively, for the plurality of impurity semiconductor regions; and in the window plate bonding step, the window plate is bonded to the outer edge portion in such a manner as to cover the plurality of recessed portions, and that the method further comprises a dicing step of performing a plurality of dicing steps from the first surface of the semiconductor substrate to the surface of the window plate so that a plurality of pairs of the impurity semiconductor regions and the recessed portions provided opposite the respective impurity semiconductor regions are divided into respective pairs.

In this case, it is possible to dice the semiconductor substrate and the window plate in different steps separately. This allows the semiconductor substrate and the window plate having their respective different hardnesses to be diced using a blade suitable for each thereof. It is therefore possible to prevent chipping at the interface between the semiconductor substrate and the window plate in a dicing operation. Additionally, "dicing from the first surface of the semiconductor substrate to the surface of the window plate" shall not restrict the direction of dicing. That is, in the dicing step, the semiconductor substrate may be diced from the first to the second surface side, or from the second to the first surface side.

EFFECTS OF THE INVENTION

In accordance with the present invention, it is possible to achieve a back illuminated photodetector having a sufficiently small package as well as being capable of suppressing the scattering of to-be-detected light and method for manufacturing the same.

BRIEF DESCRIPTION OF THE DRAWINGS

FIG. 69 is a cross-sectional view of a conventional back illuminated photodiode.

DESCRIPTION OF SYMBOLS

Figure 1:
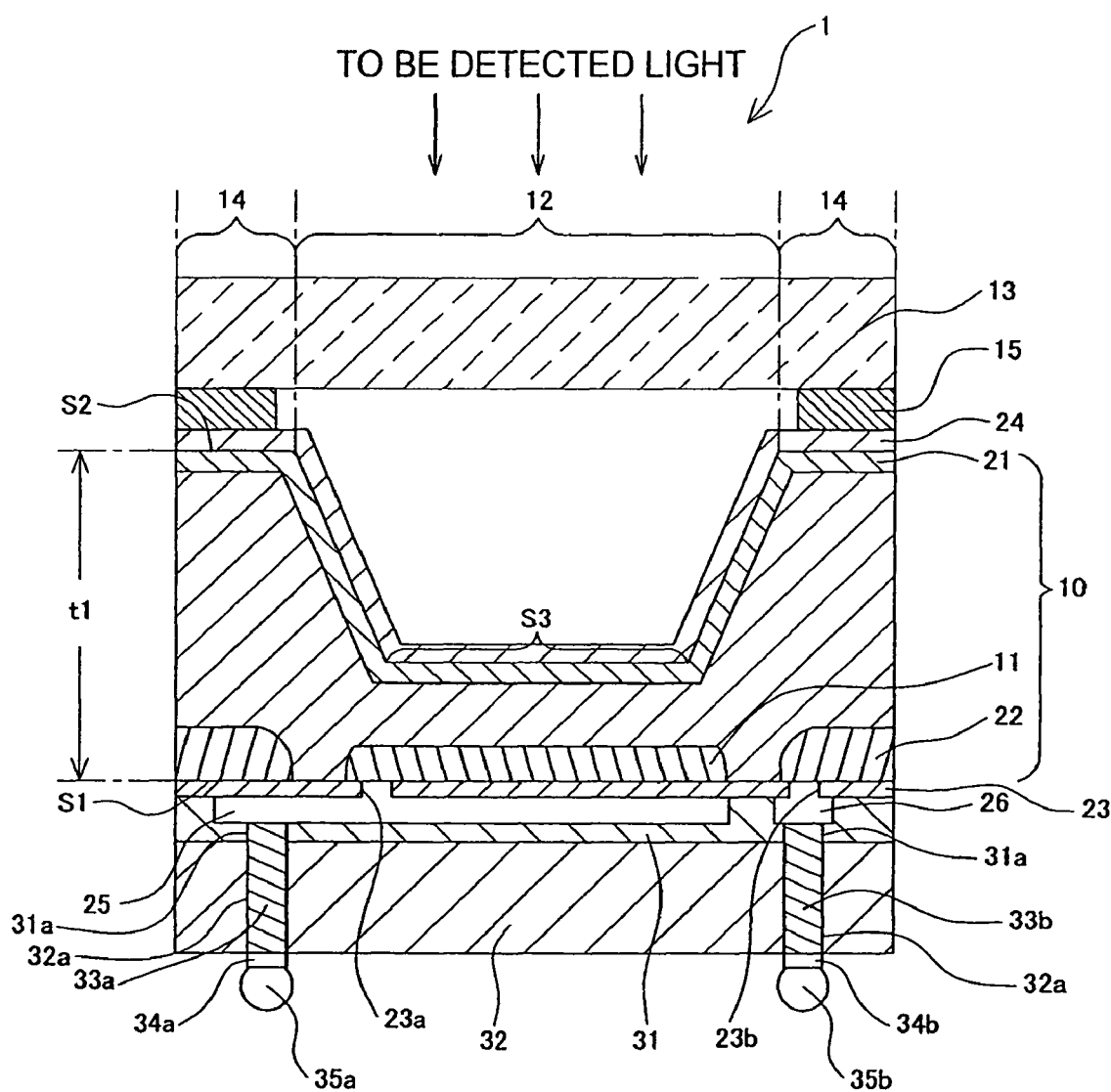
FIG. 1 is a cross-sectional view showing a first embodiment of a back illuminated photodetector according to the present invention.

1; 1a; 1b; 1c; 2; 4; 5 and 6: Back illuminated photodiodes, 3 and 3a: Back illuminated photodiode arrays, 10; 20 and 50: N-type semiconductor substrates, 11 and 51: P$^+$-type impurity semiconductor regions, 12 and 52: Recessed portions, 13 and 53: Window plates, 13a: Chamfered portion, 13b: Hole portion, 14 and 54: Outer edge portions, 15 and 55: Resin layers, 16: Pyrex glass, 17a and 17b: Metal layers, 18: Intermediate metal layer, 21 and 61: N$^+$-type highly-doped impurity semiconductor layers, 22; 28 and 62: N$^+$-type highly-doped impurity semiconductor regions, 23; 24; 63 and 64: Insulating films, 25 and 65: Anode electrodes, 26 and 66: Cathode electrodes, 31 and 71: Passivating films, 32 and 72: Supporting films, 33a; 33b; 73a and 73b: Filling electrodes, 34a; 34b; 74a and 74b: UBMs, 35a; 35b; 75a and 75b: Bumps, S1: Upper surface, S2: Rear surface, S3: Bottom surface of recessed portion, S4: Side surf-ace of the N-type semiconductor substrate

BEST MODES FOR CARRYING OUT THE INVENTION

Preferred embodiments of a back illuminated photodetector and method for manufacturing the same according to the present invention will hereinafter be described in detail with reference to the accompanying drawings. Additionally, in the descriptions of the drawings, identical components are designated by the same reference numerals to omit redundant description. Also, the dimensional ratios in the drawings do not necessarily correspond to those in the descriptions.

FIG. 1 is a cross-sectional view showing a first embodiment of a back illuminated photodetector according to the present invention. The back illuminated photodiode 1 is adapted to receive to-be-detected light through the rear surface thereof, to generate carriers upon incidence of the to-be-detected light, and then to output the generated carriers as a detected signal via the superficial surface thereof. The back illuminated photodiode 1 comprises an N-type semiconductor substrate 10, a P$^+$-type impurity semiconductor region 11, a recessed portion 12, and a window plate 13. As the N-type semiconductor substrate 10, for example, a silicon substrate with N-type impurities such as phosphorous added thereto can be used. The impurity concentration of the N-type semiconductor substrate 10 is $10^{12}$ to $10^{15}/cm^3$, for example. Also, the thickness t1 of the N-type semiconductor substrate 10 is 200 to 500 μm, for example.

In the surface layer on the upper surface (first surface) S1 side of the N-type semiconductor substrate 10 is partially formed the P$^+$-type impurity semiconductor region 11. The P$^+$-type impurity semiconductor region 11 is provided with P-type impurities such as boron to form a PN junction with the N-type semiconductor substrate 10. The impurity concentration of the P$^+$-type impurity semiconductor region 11 is $10^{15}$ to $10^{20}/cm^3$, for example. Also, the depth of the P$^+$-type impurity semiconductor region 11 is 0.1 to 20 μm, for example.

In the rear surface (second surface) S2 of the N-type semiconductor substrate 10 and in an area opposite the P$^+$-type impurity semiconductor region 11 is formed the recessed portion 12. The recessed portion 12 functions as an incident part for to-be-detected light. The recessed portion 12 has a shape that narrows gradually from the rear surface S2 to the upper surface S1. More specifically, the recessed portion 12 may have, for example, a square pyramid shape or a tapered shape that narrows gradually from the rear surface S2 to the upper surface S1. The depth of the recessed portion 12 is 2 to 400 μm, for example. Also, due to the thus formed recessed portion 12, the area between the bottom surface S3 of the recessed portion and the P$^+$-type impurity semiconductor region 11 within the N-type semiconductor substrate 10 is made thinner than the other areas so that carriers generated upon incidence of to-be-detected light via the rear surface S2 can easily reach near the P$^+$-type impurity semiconductor region 11 provided in the surface layer on the upper surface S1 side. In addition, the thickness of the thinned area is 10 to 200 μm, for example.

On the rear surface S2 of the N-type semiconductor substrate 10 is provided the window plate 13. The window plate 13 is bonded to the outer edge portion 14 of the recessed portion 12. The bonding is made via a resin layer 15 provided between the window plate 13 and the outer edge portion 14. The window plate 13 also has a flat plate shape and is made of a material that has a sufficient transmissivity for the wavelength of to-be-detected light. The window plate 13 covers the recessed portion 12 and seals the rear surface S2 of the N-type semiconductor substrate 10. As a material of the window plate 13, glass or optical crystal can be used. As a material of the window plate 13, quartz, sapphire, kovar glass, etc., can specifically be cited. Also, the thickness of the window plate 13 is 0.2 mm to 1 mm, for example. In addition, the window plate 13 may be coated with AR (Anti Reflection) coating. Additionally, the outer edge portion 14 indicates the portion laterally surrounding the recessed portion 12 within the N-type semiconductor substrate 10. Also, as a resin of the resin layer 15, for example, epoxy-based, silicon-based, acryl-based or polyimide-based one, or composite material thereof can be used.

The back illuminated photodiode 1 also comprises an N$^+$-type highly-doped impurity semiconductor layer 21, an N$^+$-type highly-doped impurity semiconductor region 22, insulating films 23 and 24, an anode electrode 25, and a cathode electrode 26. The N$^+$-type highly-doped impurity semiconductor layer 21 is formed in the entire surface layer on the rear surface S2 side of the N-type semiconductor substrate 10. The N$^+$-type highly-doped impurity semiconductor layer 21 is provided with N-type impurities at a concentration higher than in the N-type semiconductor substrate 10. The impurity concentration of the N$^+$-type highly-doped impurity semiconductor layer 21 is $10^{15}$ to $10^{20}/cm^3$, for example. Also, the depth of the N$^+$-type highly-doped impurity semiconductor layer 21 is 0.1 to 20 μm, for example.

The N$^+$-type highly-doped impurity semiconductor region 22 is formed in the surface layer on the upper surface S1 side of the N-type semiconductor substrate 10 at a predetermined distance from the P$^+$-type impurity semiconductor region 11. The N$^+$-type highly-doped impurity semiconductor region 22 is also provided with N-type impurities at a high concentration, as is the case with the N$^+$-type highly-doped impurity semiconductor layer 21, to be a contact layer for the cathode electrode 26 to be described hereinafter. The impurity concentration of the N$^+$-type highly-doped impurity semiconductor region 22 is $10^{15}$ to $10^{20}/cm^3$, for example. Also, the depth of the N$^+$-type highly-doped impurity semiconductor region 22 is 0.1 to 30 μm, for example.

The insulating films 23 and 24 are formed, respectively, on the upper surface S1 and the rear surface S2 of the N-type semiconductor substrate 10. The insulating films 23 and 24 are made of SiO$_2$, for example. The thickness of the insulating film 23 is 0.1 to 2 μm, for example. Meanwhile, the thickness of the insulating film 24 is 0.05 to 1 μm, for example. Also, in the insulating film 23 are formed openings (contact holes) 23a and 23b, one opening 23a being provided within the range of the P$^+$-type impurity semiconductor region 11, while the other opening 23b being provided within the range of the N$^+$-type highly-doped impurity semiconductor region 22.

On the insulating film 23 and in the areas including the openings 23a and 23b are formed, respectively, the anode electrode 25 and the cathode electrode 26. The thickness of the electrodes 25 and 26 is 1 μm, for example. The electrodes 25 and 26 are provided in such a manner as to fill the respective openings 23a and 23b. Thus, the anode electrode 25 is connected directly to the P$^+$-type impurity semiconductor region 11 through the opening 23a, while the cathode electrode 26 is connected directly to the N$^+$-type highly-doped impurity semiconductor region 22 through the opening 23b. As the anode and cathode electrodes 25 and 26, for example, Al, can be used.

The back illuminated photodiode 1 further comprises a passivating film 31, a supporting film 32, filling electrodes 33a and 33b, UBMs (Under Bump Metals) 34a and 34b, and bumps 35a and 35b. The passivating film 31 is provided on the upper surface S1 of the N-type semiconductor substrate 10 in such a manner as to cover the insulating film 23, anode electrode 25, and cathode electrode 26. Also, in the portions provided on the anode electrode 25 and the cathode electrode 26 within the passivating film 31 are formed through-holes 31a to be filled with the filling electrodes 33a and 33b to be described hereinafter. The passivating film 31 is made of SiN, for example, to protect the upper surface S1 of the N-type semiconductor substrate 10. The passivating film 31 can be formed by, for example, a plasma-CVD method. Also, the thickness of the passivating film 31 is 1 μm, for example.

On the passivating film 31 is formed the supporting film 32. The supporting film 32 is adapted to support the N-type semiconductor substrate 10. Also, in the portions corresponding to the through-holes 31a in the passivating film 31 within the supporting film 32 are formed through-holes 32a to be filled with the filling electrodes 33a and 33b that also fill the through-holes 31a. As a material of the supporting film 32, for example, resin or SiO$_2$, etc., that can be formed by, for example, a plasma-CVD method can be used. Also, the thickness of the supporting film 32 is 2 to 100 μm, for example, and preferably about 50 μm.

The filling electrodes 33a and 33b fill the through-holes 31a and 32a, and are brought into contact, respectively, with the anode electrode 25 and the cathode electrode 26 at one end thereof to be connected electrically to the P$^+$-type impurity semiconductor region 11 and the N$^+$-type highly-doped impurity semiconductor region 22. Also, the other end of the filling electrodes 33a and 33b is exposed at the surface of the supporting film 32. That is, the filling electrodes 33a and 33b penetrate through the passivating film 31 and the supporting film 32 to extend, respectively, from the anode electrode 25 and the cathode electrode 26 to the surface of the supporting film 32. In addition, the filling electrodes 33a and 33b each have an approximately cylindrical shape. The filling electrodes 33a and 33b are adapted to connect, respectively, the electrodes 25 and 26 and the bumps 35a and 35b to be described hereinafter electrically with each other. The filling electrodes 33a and 33b are made of Cu, for example. Also, the diameter of the through-holes 31a and 32a is 10 to 200 μm, for example, and preferably about 100 μm.

On the exposed portions of the filling electrodes 33a and 33b at the surface of the supporting film 32 are formed the UBMs 34a and 34b. The UBMs 34a and 34b are composed of laminated films made of Ni and Au, for example. Also, the thickness of the UBMs 34a and 34b is 0.1 to 10 μm, for example.

On the surfaces of the UBMs 34a and 34b on the opposite side of the filling electrodes 33a and 33b are formed the bumps 35a and 35b. The bumps 35a and 35b are therefore connected, respectively, to the anode electrode 25 and the cathode electrode 26 electrically. The bumps 35a and 35b each have an approximately spherical shape except for the surfaces in contact with the UBMs 34a and 34b. As the bumps 35a and 35b, for example, solder, gold, Ni—Au, Cu, or resin containing metal filler can be used.

Figure 2:
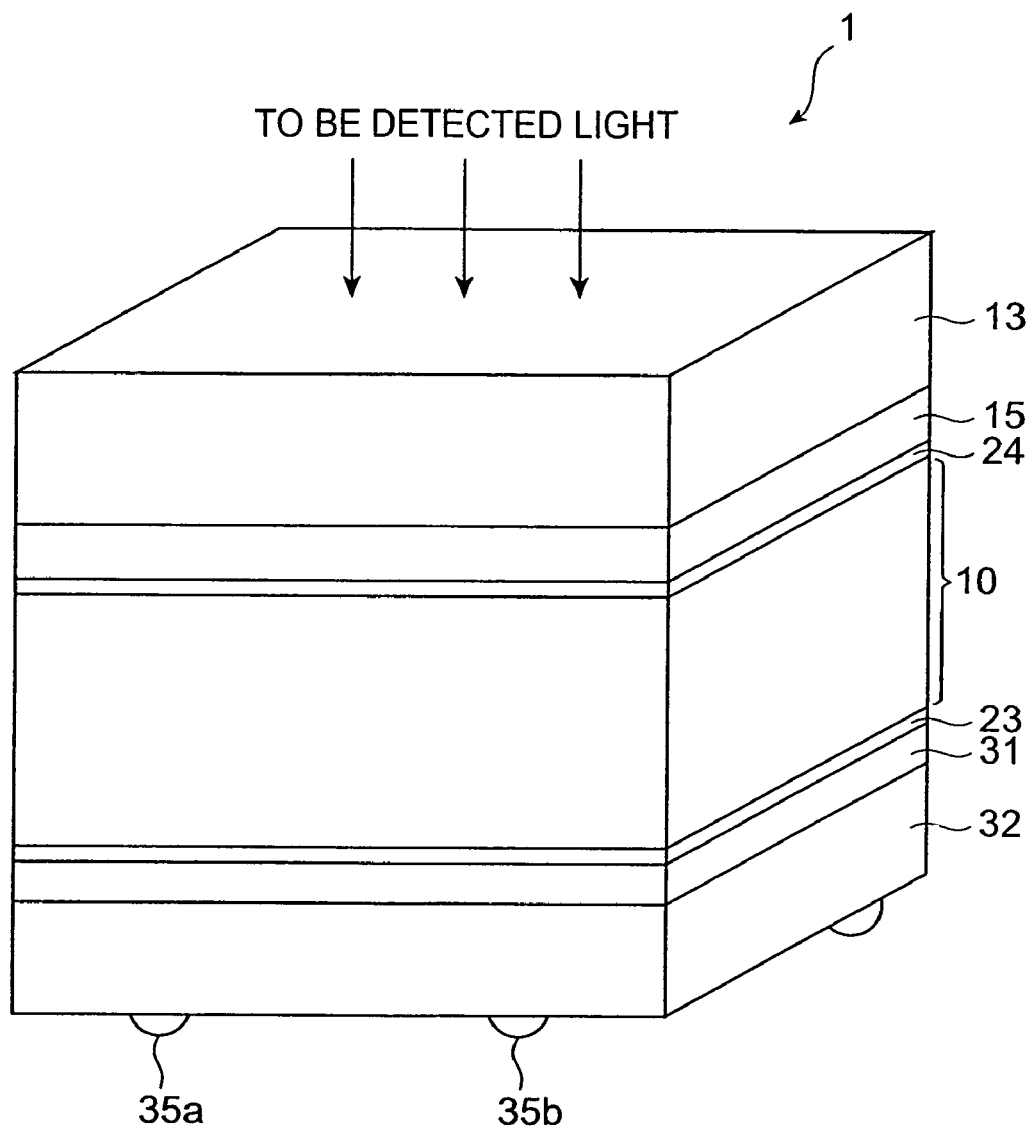
FIG. 2 is a perspective view of the back illuminated photodiode 1 shown in FIG. 1.

FIG. 2 is a perspective view of the thus arranged back illuminated photodiode 1. As can be seen from this figure, the back illuminated photodiode 1 is obtained through dicing to be an approximately rectangular solid overall shape excluding the UBMs 34a and 34b and the bumps 35a and 35b. Additionally, the N$^+$-type highly-doped impurity semiconductor layer 21 and the N$^+$-type highly-doped impurity semiconductor region 22 exposed at the side surfaces of the N-type semiconductor substrate 10 are omitted in FIG. 2.

The operation of the back illuminated photodiode 1 will here be described. It is assumed here that the back illuminated photodiode 1 is applied with a reverse bias voltage, and that there is generated a depletion layer around the thinned area in the N-type semiconductor substrate 10. When to-be-detected light penetrates through the window plate 13 and then enters the N-type semiconductor substrate 10 through the recessed portion 12, the light is absorbed mainly in the thinned area to generate carriers (holes and electrons) in the area The generated holes and electrons are moved, respectively, to the P$^+$-type impurity semiconductor region 11 and the N$^+$-type highly-doped impurity semiconductor region 22 in accordance with the reverse bias electric field. Holes and electrons that have reached the P$^+$-type impurity semiconductor region 11 and the N$^+$-type highly-doped impurity semiconductor region 22 are moved to the bumps 35a and 35b through the filling electrodes 33a and 33b and the UBMs 34a and 34b to be output as a detected signal from the bumps 35a and 35b.

The effect of the back illuminated photodiode 1 will here be described. In the back illuminated photodiode 1, the window plate 13 is bonded to the outer edge portion 14 of the N-type semiconductor substrate 10. This eliminates the use of an external package such as a ceramic package, whereby it is possible to obtain a chip-sized back illuminated photodiode 1. Accordingly, there is achieved a back illuminated photodiode 1 having a sufficiently small package. In addition, since there is no need for a ceramic package, etc., it is possible to reduce the cost of manufacturing a back illuminated photodiode 1. Further, the window plate 13 seals the rear surface S2 of the N-type semiconductor substrate 10 to increase the reliability of the back illuminated photodiode 1. There is thus achieved an inexpensive and highly reliable as well as small back illuminated photodiode 1.

Further, in the back illuminated photodiode 1, the surface of the window plate 13 functions as an incident plane for to-be-detected light. Since the surface of the window plate 13 can be flattened more easily than resin, it is possible to suppress the scattering of to-be-detected light at the incident plane. There is thus achieved a back illuminated photodiode 1 capable of detecting light at a high sensitivity.

Also, the provided window plate 13 increases the mechanical strength of the back illuminated photodiode 1.

In addition, at the rear surface S2 of the N-type semiconductor substrate 10, the recessed portion 12 functions as an incident part for to-be-detected light. Therefore, the window plate 13 bonded to the outer edge portion 14 that has a structure of being protruded from the bottom surface S3 of the recessed portion 12 is not in contact with the bottom surface S3 that functions as an incident plane for to-be-detected light entering the N-type semiconductor substrate 10. This prevents the bottom surface S3 from being damaged by contact with the window plate 13, whereby it is possible to suppress sensitivity reduction, dark current and noise.

The provided supporting film 32 increases the mechanical strength of the back illuminated photodiode 1. In back illuminated photodiodes with part of the substrate being thinned, it is generally required to pay attention to the handling of the thinned portion so as not to be damaged. On the contrary, the back illuminated photodiode 1, the mechanical strength of which is increased so as to be unlikely to be damaged, can be handled easily. The back illuminated photodiode 1, which is unlikely to be damaged, can also be diced easily.

The provided filling electrodes 33a and 33b make it easy to take a detected signal outside from the electrodes 25 and 26. Additionally, the filling electrodes 33a and 33b may be formed on the sidewalls of the through holes 31a and 32a to be connected electrically to the anode electrode 25 and the cathode electrode 26.

The $N^+$-type highly-doped impurity semiconductor layer 21 is formed in the entire surface layer on the rear surface S2 side of the N-type semiconductor substrate 10. The $N^+$-type highly-doped impurity semiconductor layer 21 provided in the portion exposed at the bottom surface S3 of the recessed portion 12 within the surface layer of the rear surface S2 functions as an accumulation layer. It is thus possible to guide carriers generated in the N-type semiconductor substrate 10 effectively to the PN junction on the upper surface S1 side by the electric field distribution in the layer. There is thus achieved a more highly sensitive back illuminated photodiode 1. Here, the impurity concentration of the $N^+$-type highly-doped impurity semiconductor layer 21 is preferably $10^{15}/cm^3$ or more. In this case, the $N^+$-type highly-doped impurity semiconductor layer 21 can suitably function as an accumulation layer.

Also, even if there may be crystal defects in the outer edge portion 14, the $N^+$-type highly-doped impurity semiconductor layer 21, which is provided in the surface layer on the rear surface S2 side within the outer edge portion 14 of the N-type semiconductor substrate 10, can suppress dark current and/or noise due to the crystal defects. Therefore, in accordance with the back illuminated photodiode 1, it is possible to obtain a detected signal at a high S/N ratio. Also, here, the impurity concentration of the $N^+$-type highly-doped impurity semiconductor layer 21 is preferably $10^{15} cm^3$ or more. In this case, the $N^+$-type highly-doped impurity semiconductor layer 21 can suppress dark current and/or noise due to crystal defects sufficiently.

Figure 3:
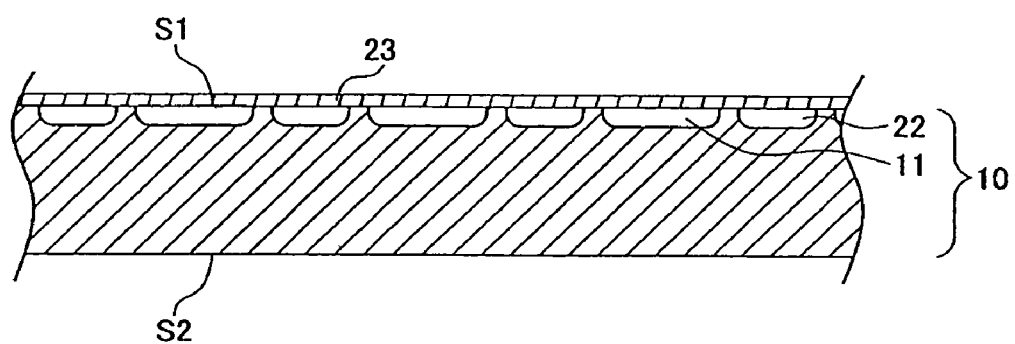
FIG. 3 is a step chart showing a method for manufacturing the back illuminated photodiode 1 shown in FIG. 1.

An exemplary method for manufacturing the back illuminated photodiode 1 shown in FIG. 1 will here be described with reference to FIG. 3 to FIG. 17. First, there is prepared an N-type semiconductor substrate 10 made of an N-type silicon wafer with the upper surface S1 and the rear surface S2 thereof being formed into (100) planes. The N-type semiconductor substrate 10 is thermally oxidized to form an insulating film made of $SiO_2$ on the upper surface S1 of the N-type semiconductor substrate 10. Also, in predetermined portions of the insulating film are formed openings, and then phosphorous is doped into the N-type semiconductor substrate 10 through the openings to form $N^+$-type highly-doped impurity semiconductor regions 22. Subsequently, the N-type semiconductor substrate 10 is oxidized to form an insulating film on the upper surface S1. Similarly, in predetermined portions of the insulating film are formed openings, and then boron is doped into the N-type semiconductor substrate 10 through the openings to form $P^+$-type impurity semiconductor regions 11 (impurity semiconductor region forming step). Subsequently, the N-type semiconductor substrate 10 is oxidized to form an insulating film 23 on the upper surface S1. Then, the rear surface S2 of the N-type semiconductor substrate 10 is polished (FIG. 3).

Figure 4:
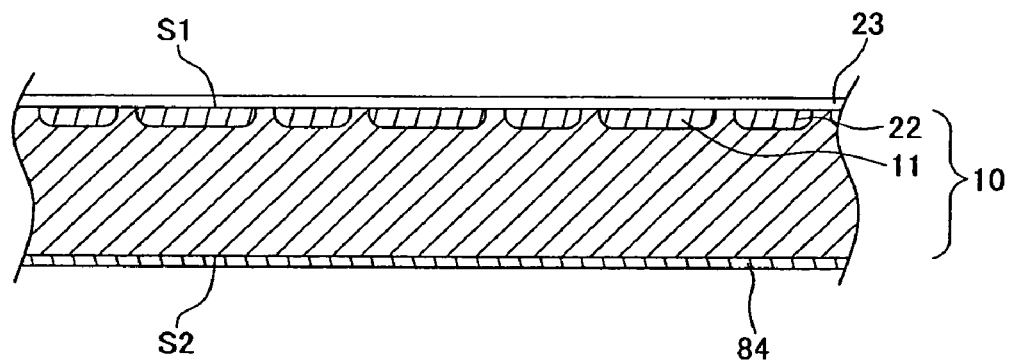
FIG. 4 is a step chart showing a method for manufacturing the back illuminated photodiode 1 shown in FIG. 1.
Figure 5:
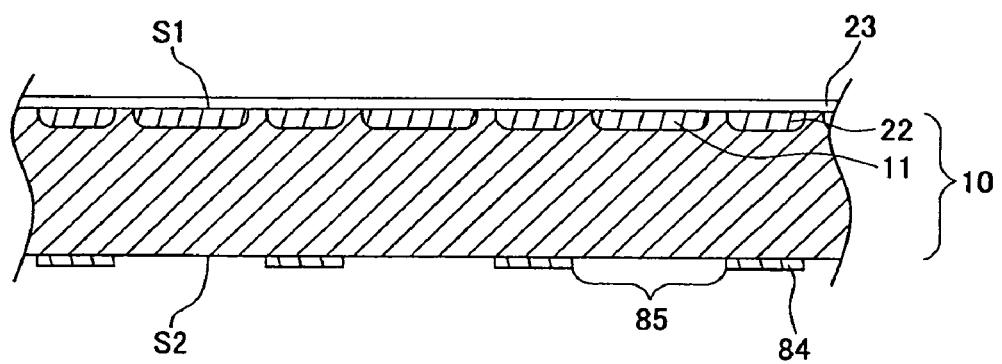
FIG. 5 is a step chart showing a method for manufacturing the back illuminated photodiode 1 shown in FIG. 1.
Figure 6:
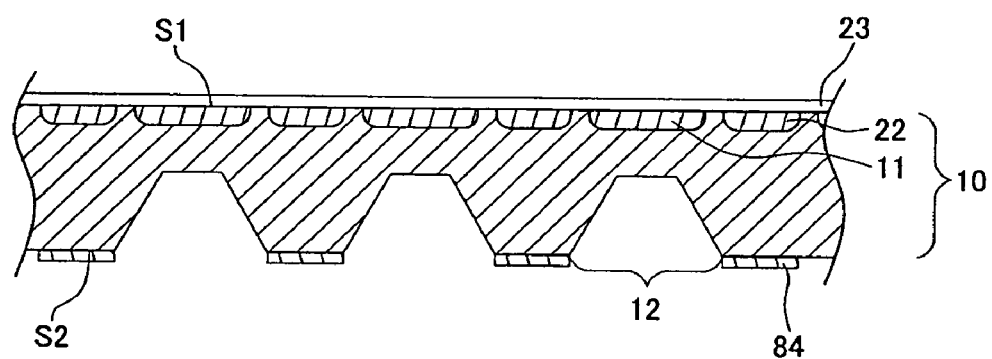
FIG. 6 is a step chart showing a method for manufacturing the back illuminated photodiode 1 shown in FIG. 1.

Next, SiN 84 is deposited on the rear surface S2 of the N-type semiconductor substrate 10 by LP-CVD (FIG. 4). Also, in the SiN 84 on the rear surface S2 are formed openings 85 to form recessed portions 12 (FIG. 5). Then, an etching operation is performed using KOH, etc., through the openings 85 to form recessed portions 12 (recessed portion forming step; FIG. 6).

Figure 7:
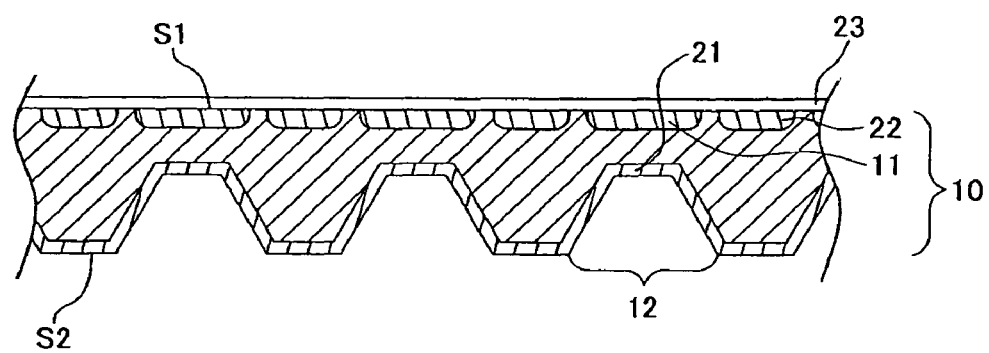
FIG. 7 is a step chart showing a method for manufacturing the back illuminated photodiode 1 shown in FIG. 1.
Figure 8:
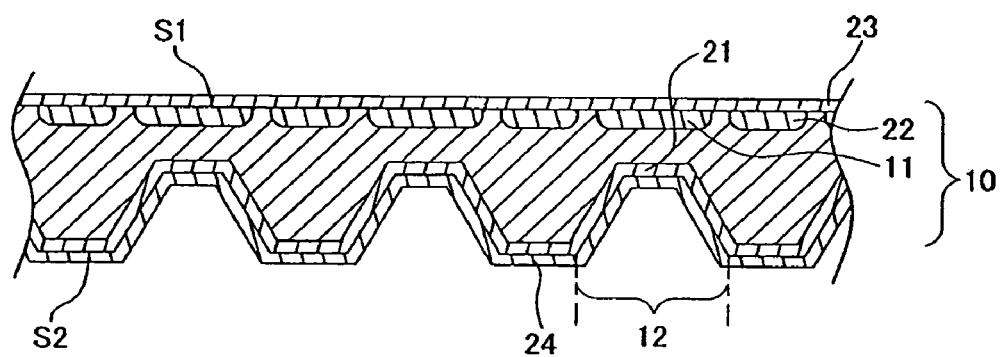
FIG. 8 is a step chart showing a method for manufacturing the back illuminated photodiode 1 shown in FIG. 1.
Figure 9:
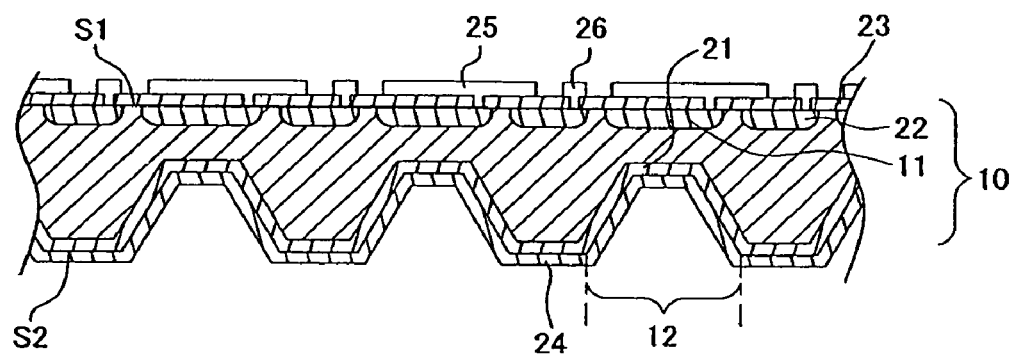
FIG. 9 is a step chart showing a method for manufacturing the back illuminated photodiode 1 shown in FIG. 1.

Next, after the SiN 84 on the rear surface S2 is removed, ion implantation, etc., is performed against the rear surface S2 of the N-type semiconductor substrate 10 with the recessed portions 12 formed therein to dope N-type impurities and thereby to form an $N^+$-type highly-doped impurity semiconductor layer 21 in the entire surface layer on the rear surface S2 side (FIG. 7). Then, the substrate is thermally oxidized to form an insulating film 24 on the rear surface S2 (FIG. 8). Contact holes for electrodes are formed in the insulating film 23 on the upper surface S1, and after aluminum is deposited on the upper surface S1, a predetermined pattern is made to form anode electrodes 25 and cathode electrodes 26 (FIG. 9).

Figure 10:
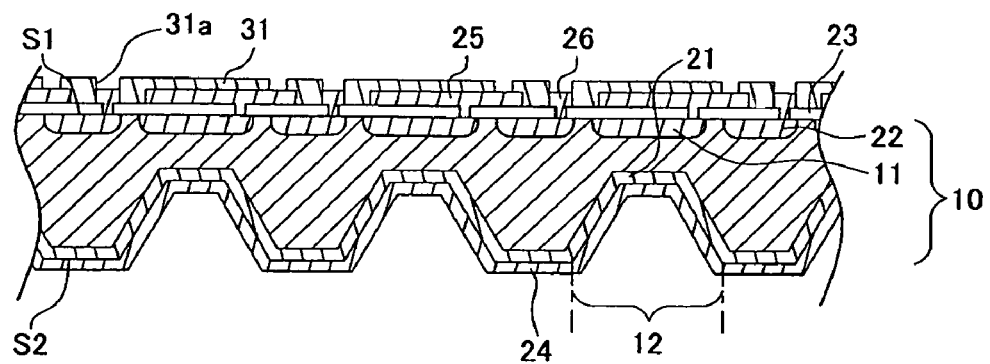
FIG. 10 is a step chart showing a method for manufacturing the back illuminated photodiode 1 shown in FIG. 1.
Figure 11:
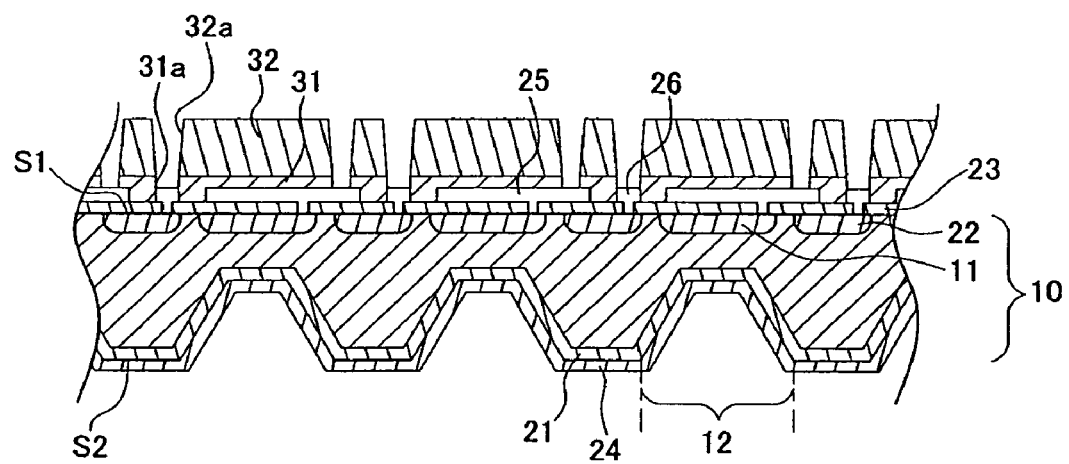
FIG. 11 is a step chart showing a method for manufacturing the back illuminated photodiode 1 shown in FIG. 1.
Figure 12:
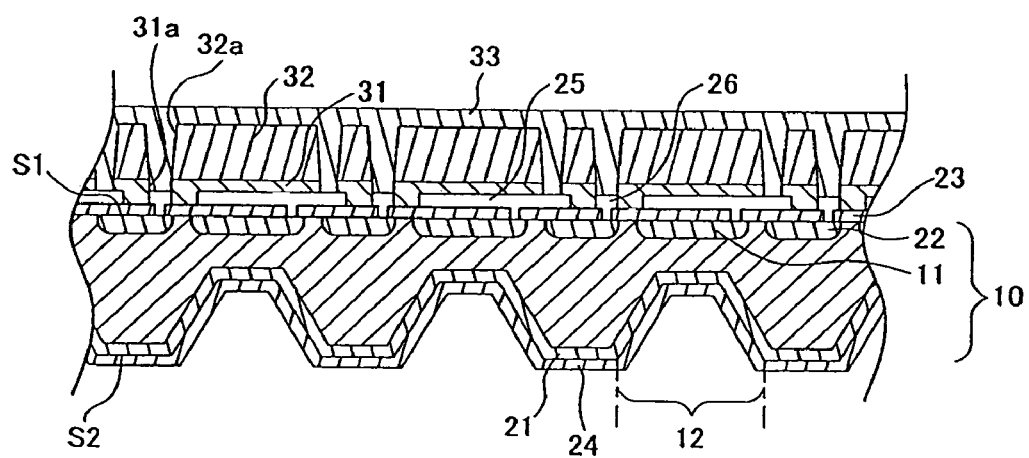
FIG. 12 is a step chart showing a method for manufacturing the back illuminated photodiode 1 shown in FIG. 1.

Next, a passivating film 31 made of SiN is deposited on the upper surface S1 of the N-type semiconductor substrate 10, on which the anode electrodes 25 and the cathode electrodes 26 are formed, by a plasma-CVD method. Also, through-holes 31a are formed in portions corresponding to bumps 35a and 35b within the passivating film 31 (FIG. 10). Further, a thick supporting film 32 made of resin or inorganic insulating films is formed on the upper surface S1, and through-holes 32a are formed in the portions corresponding to the through-holes 31a in the passivating film 31. Here, as the supporting film 32 resin such as epoxy-based, acryl-based or polyimide-based one, or inorganic insulating films such as $SiO_2$ that can be formed by, for example, CVD or SOG (Spin On Glass) can be used. Also, the through-holes 32a in the supporting film 32 can be formed by a photolithography method using, for example, photosensitive resin or by a patterning process such as etching (FIG. 11). Further, a conductive material 33 made of Cu is deposited on the upper surface S1 in such a manner as to fill the through-holes 31a and 32a This can be made through the steps of, for example, depositing a Cu seed layer, etc., by sputtering, etc., on the surface of the anode electrodes 25 and the cathode electrodes 26 that are exposed from the through-holes 31a and 32a, and depositing Cu, etc., by plating on the Cu seed layer. Additionally, on the anode electrodes 25 and the cathode electrodes 26 are provided intermediate metals (not shown in the figure) for improving the bonding to the conductive material 33 (FIG. 12).

Figure 13:
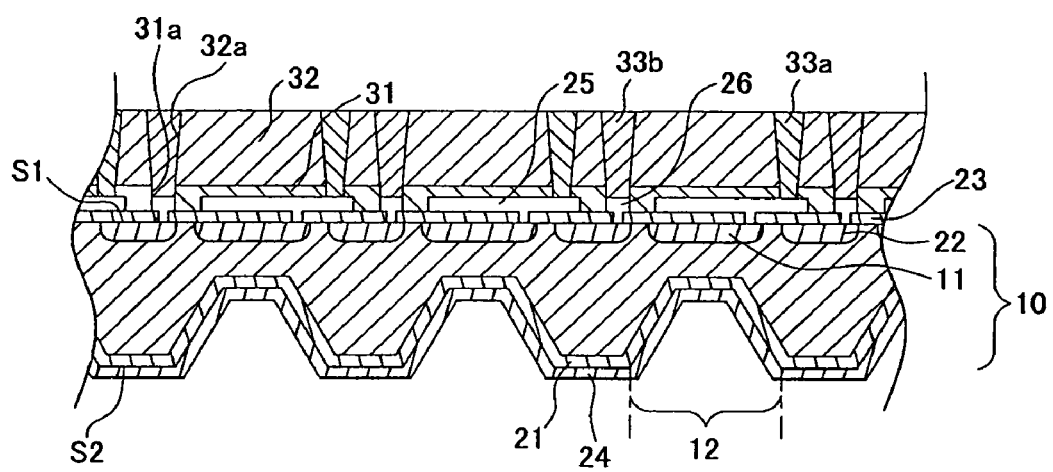
FIG. 13 is a step chart showing a method for manufacturing the back illuminated photodiode 1 shown in FIG. 1.
Figure 14:
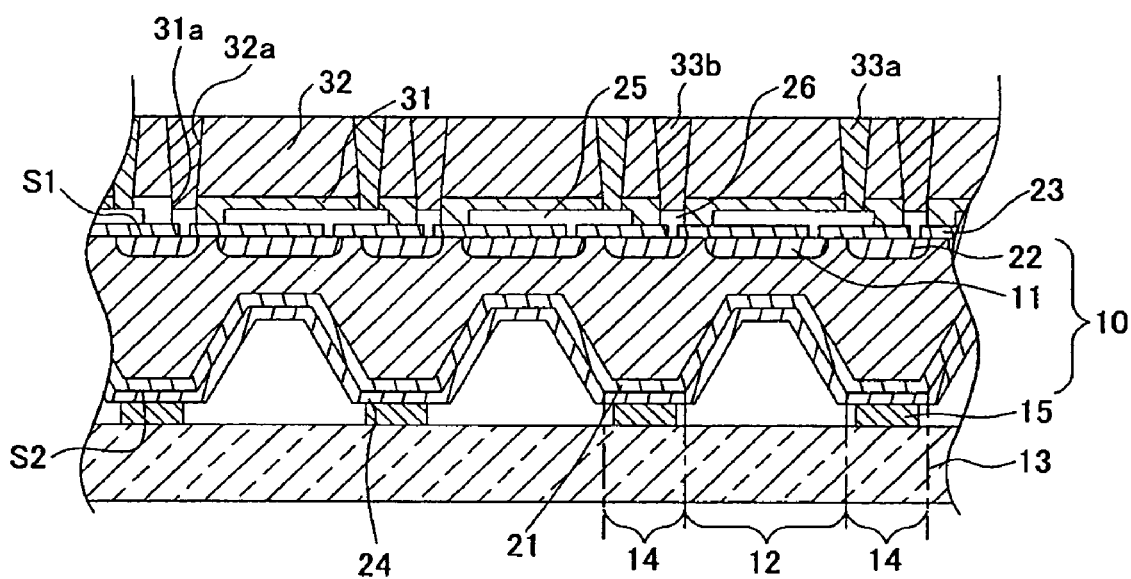
FIG. 14 is a step chart showing a method for manufacturing the back illuminated photodiode 1 shown in FIG. 1.
Figure 15:
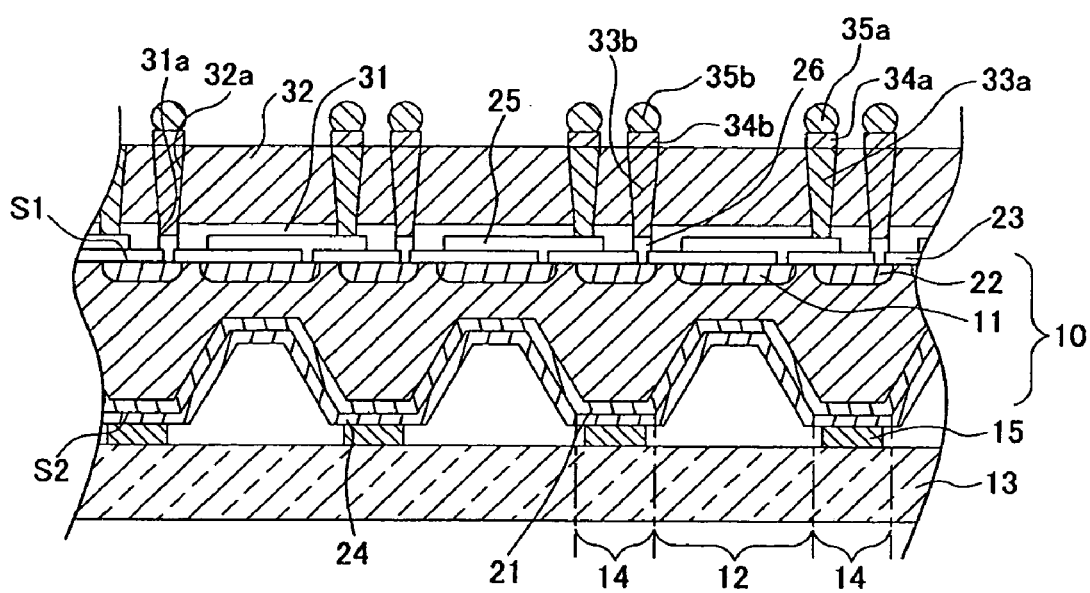
FIG. 15 is a step chart showing a method for manufacturing the back illuminated photodiode 1 shown in FIG. 1.

Next the surface of the conductive material 33 is polished to remove the conductive material 33 deposited on the supporting film 32. Thus, filling electrodes 33a and 33b are formed (FIG. 13). Also, a window plate 13 is bonded to the rear surface S2 of the N-type semiconductor substrate using the outer edge portions 14 of the recessed portions 12 as bond parts (window plate bonding step). The bonding is to be performed by preliminarily forming resin layers 15 by printing, etc., at the positions within the window plate 13 corresponding to the outer edge portions 14, and then by using the resin layers 15. This allows the rear surface S2 of the N-type semiconductor substrate 10 to be sealed. Additionally, as the resin layers 15 is preferably used B-stage resin or thermoplastic resin. Also, in the case of bonding the window plate 13 and the outer edge portions 14 with the resin being in a liquid state, it is preferable to use high-viscosity resin. Further, the bonding between the window plate 13 and the outer edge portions 14 is preferably performed under a dry $N_2$ atmosphere (FIG. 14). In addition, UBMs 34*a* and 34*b* composed of laminated films made of Ni and Au, etc., are formed on the filling electrodes 33*a* and 33*b* on the upper surface S1 by electroless plating. Further, bumps 35*a* and 35*b* made of solder, etc., are formed on the UBMs 34*a* and 34*b* by printing or a ball-mounting method (FIG. 15).

Figure 16:
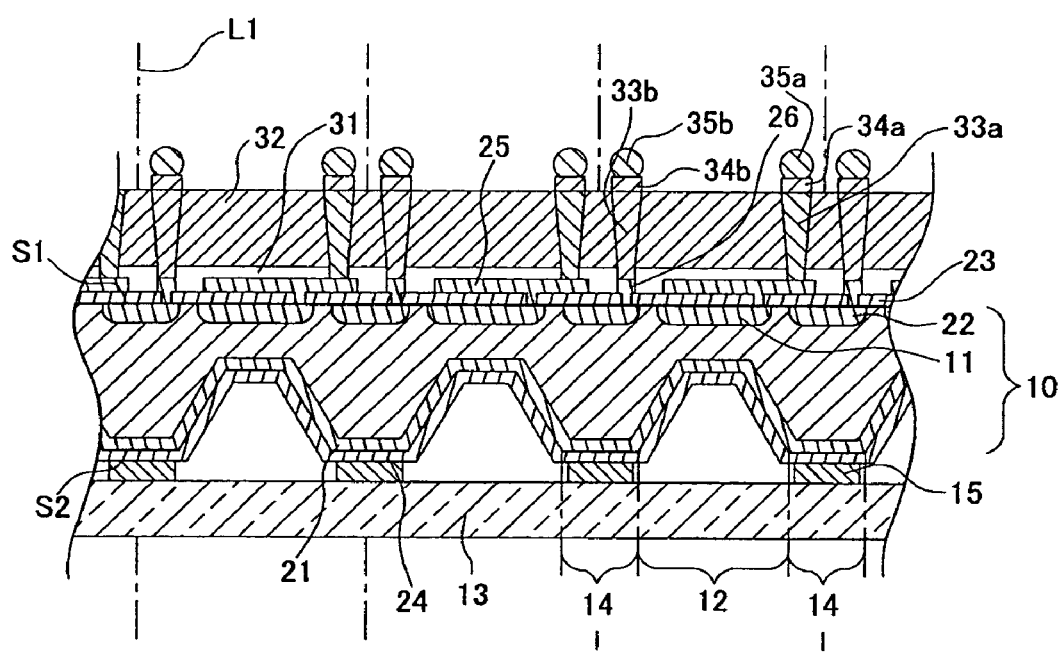
FIG. 16 is a step chart showing a method for manufacturing the back illuminated photodiode 1 shown in FIG. 1.
Figure 17:
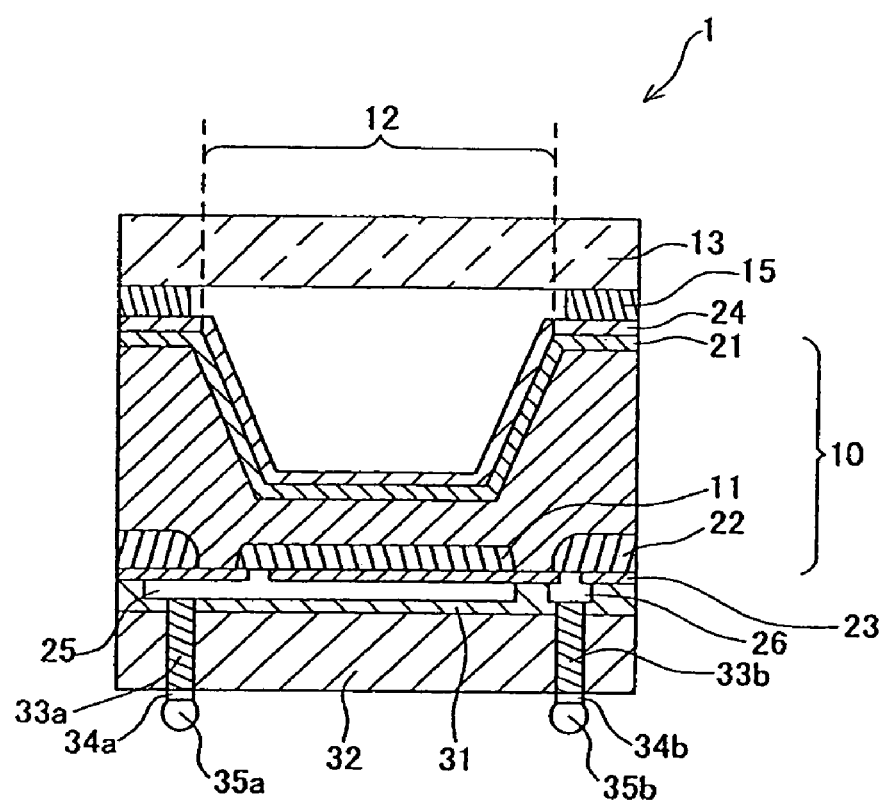
FIG. 17 is a step chart showing a method for manufacturing the back illuminated photodiode 1 shown in FIG. 1.

Finally, in order to obtain individually separated back illuminated photodiodes 1, a dicing step is performed (dicing step). As indicated by the alternate long and short dashed lines L1 in FIG. 16, the N-type semiconductor substrate 10 is diced at the center of each outer edge portion 14 on the rear surface S2 side. The dicing operation is performed from the upper surface S1 side to the rear surface S2 side of the N-type semiconductor substrate 10. More specifically, the wafer shown in FIG. 16 is diced in the order of the supporting film 32, passivating film 31, insulating film 23, N-type semiconductor substrate 10, insulating film 24, resin layers 15, and window plate 13. Thus, the wafer shown in FIG. 16 is to be separated individually to obtain back illuminated photodiodes 1 each having a pair of a P$^+$-type impurity semiconductor region 11 and a recessed portion 12 (FIG. 17).

In accordance with the manufacturing method shown in FIG. 3 to FIG. 17, the window plate 13 is bonded to the outer edge portions 14 of the N-type semiconductor substrate 10 in the window plate bonding step (refer to FIG. 14). This eliminates the use of an external package such as a ceramic package, whereby it is possible to obtain a chip-sized back illuminated photodiode 1. In accordance with the present manufacturing method, it is therefore possible to achieve a back illuminated photodiode 1 having a sufficiently small package. Since this also eliminates the use of a step of packing a back illuminated photodiode 1 into a ceramic package, etc., the manufacturing process for the entire back illuminated photodiode 1 is simplified.

Also, in the case of bonding the window plate 13 and the outer edge portions 14 under a dry $N_2$ atmosphere in the window plate bonding step, the areas between the recessed portions 12 and the window plate 13 are to be sealed with $N_2$, especially resulting in the possibility of highly reliable sealing.

Figure 18:
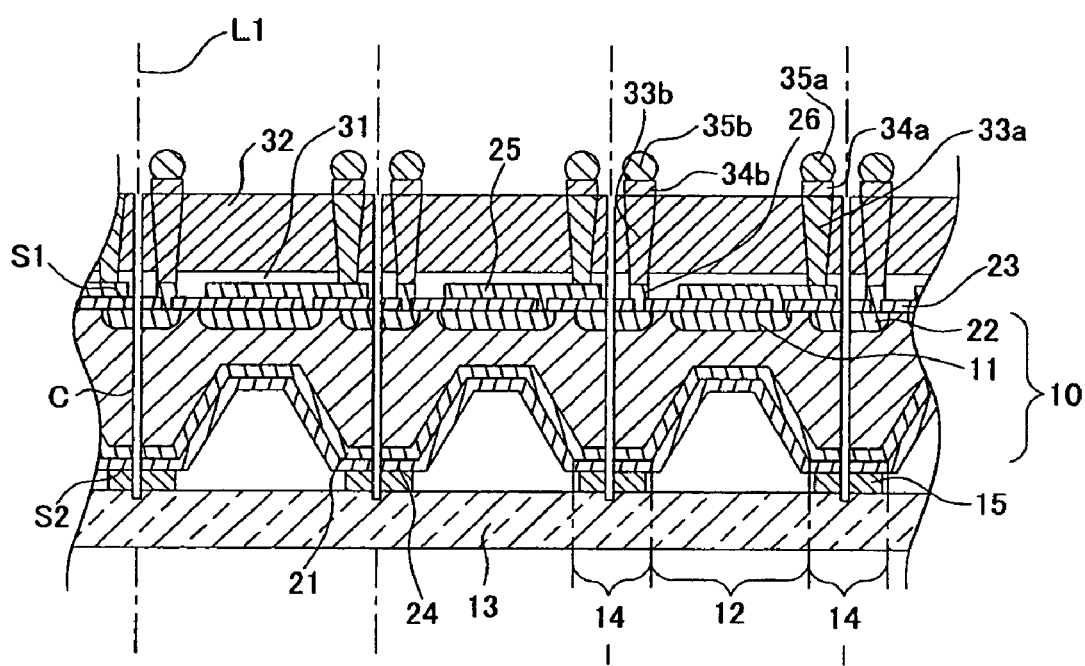
FIG. 18 is a view illustrating an exemplary variation of the dicing step shown in FIG. 16.

FIG. 18 is a view illustrating an exemplary variation of the dicing step shown in FIG. 16. In the dicing step shown in FIG. 16, a plurality of dicing steps may be performed. For example, a first dicing step is performed from the supporting film 32 to part of the window plate 13. In FIG. 18 is shown a state of the wafer immediately after the first step. In the diced portions are formed slits C. Then, the rest of the window plate 13 is to be diced in a second step. In the second dicing step, there is shown the case of using a blade of a width smaller than that used in the first step.

Thus, performing a plurality of dicing steps allows the N-type semiconductor substrate 10 and the window plate 13 to be diced separately in different steps. This allows the N-type semiconductor substrate 10 and the window plate 13 having their respective different hardnesses to be diced using a blade suitable for each thereof. That is, it is possible to dice the N-type semiconductor substrate 10 and the window plate 13 using blades made of different material suitable for their respective hardnesses. It is therefore possible to prevent chipping (crack) at the interface between the N-type semiconductor substrate 10 and the window plate 13 in a dicing operation. Additionally, from the viewpoint of dicing the N-type semiconductor substrate 10 and the window plate 13 separately in different steps, the position where the first dicing step is to be completed (i.e. the position where the second dicing step is to be started) is preferably in the vicinity of the interface between the N-type semiconductor substrate 10 and the window plate 13.

Figure 19:
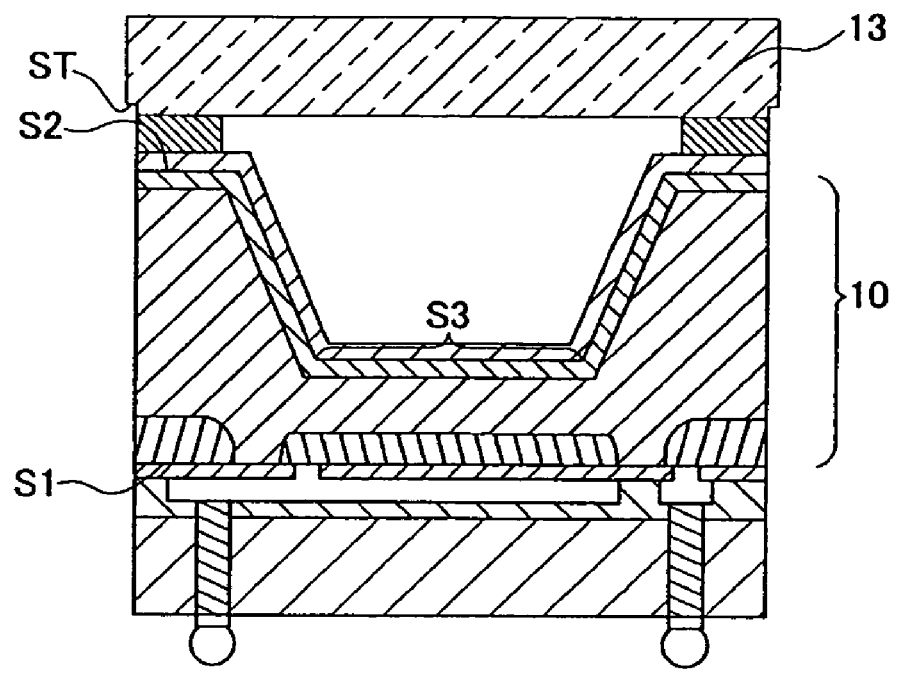
FIG. 19 is a cross-sectional view showing an exemplary structure of a back illuminated photodiode obtained through the dicing step illustrated in FIG 18.
Figure 20:
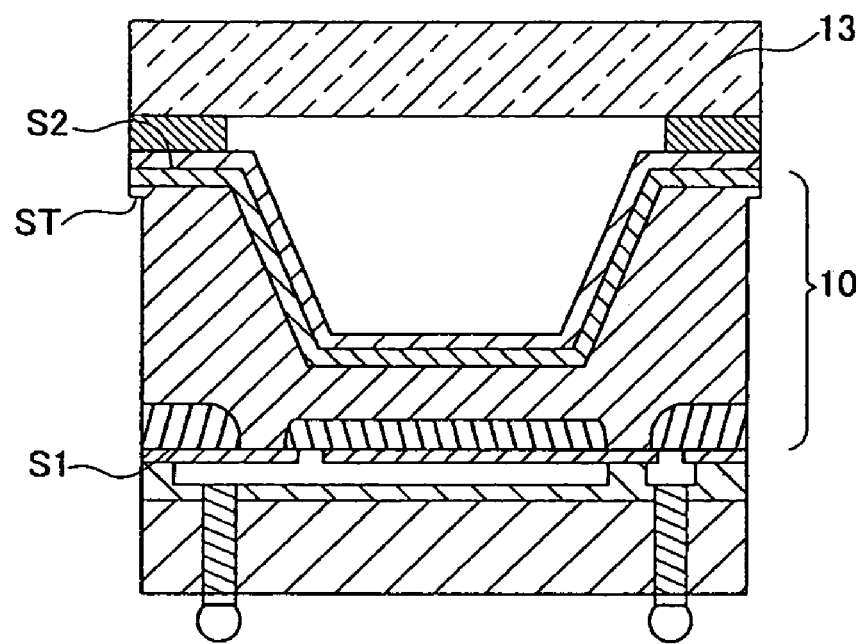
FIG. 20 is a cross-sectional view showing an exemplary structure of a back illuminated photodiode obtained through the dicing step illustrated in FIG. 18.

In FIG. 19 to FIG. 22 are shown exemplary structures of a back illuminated photodiode obtained through the dicing step illustrated in FIG. 18. Since in the first and second steps blades having their respective different thickness to perform a dicing operation are used, in the side surfaces of the window plate 13 and at predetermined positions in the vicinity of the interface between the N-type semiconductor substrate 10 and the window plate 13 are formed stepped portions ST correspondingly to the position where the first dicing step is completed as shown in FIG. 19. Also, in the case where the first dicing step has been completed within the N-type semiconductor substrate 10, in the side surfaces of the N-type semiconductor substrate 10 and in the vicinity of the interface between the N-type semiconductor substrate 10 and the window plate 13 are formed stepped portions ST as shown in FIG. 20. In FIG. 19 and FIG. 20, the window plate 13 side is raised higher than the N-type semiconductor substrate 10 side with respect to the stepped portions ST.

Figure 21:
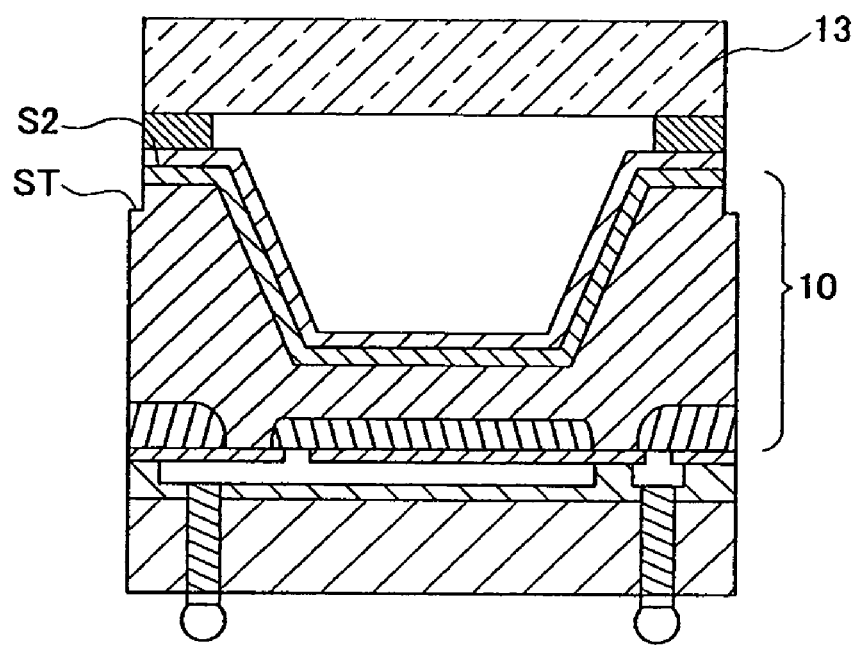
FIG. 21 is a cross-sectional view showing an exemplary structure of a back illuminated photodiode obtained through the dicing step illustrated in FIG. 18.
Figure 22:
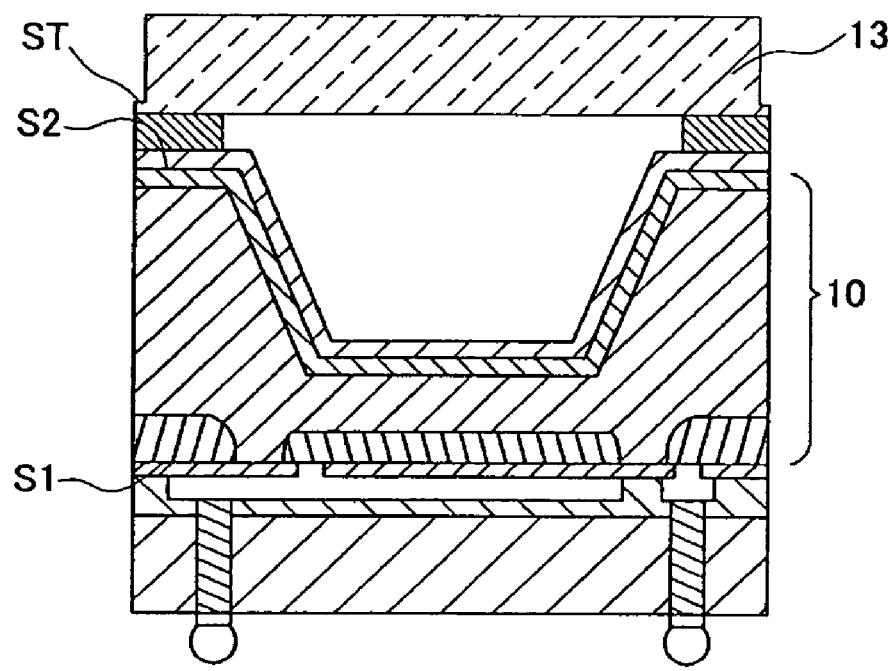
FIG. 22 is a cross-sectional view showing an exemplary structure of a back illuminated photodiode obtained through the dicing step illustrated in FIG. 18.

Additionally, the dicing operation may be performed from the rear surface S2 side to the upper surface S1 side of the N-type semiconductor substrate 10. In the case of performing a first dicing step from the window plate 13 to part of the N-type semiconductor substrate 10 and then a second dicing step from the rest of the N-type semiconductor substrate 10 to the supporting film 32, in the side surfaces of the N-type semiconductor substrate 10 are formed stepped portions ST as shown in FIG. 21. Meanwhile, in the case where the first dicing step has been completed within the window plate 13, in the side surfaces of the window plate 13 are formed stepped portions ST as shown in FIG. 22. In FIG. 21 and FIG. 22, the N-type semiconductor substrate 10 side is raised higher than the window plate 13 side with respect to the stepped portions ST.

Figure 23:
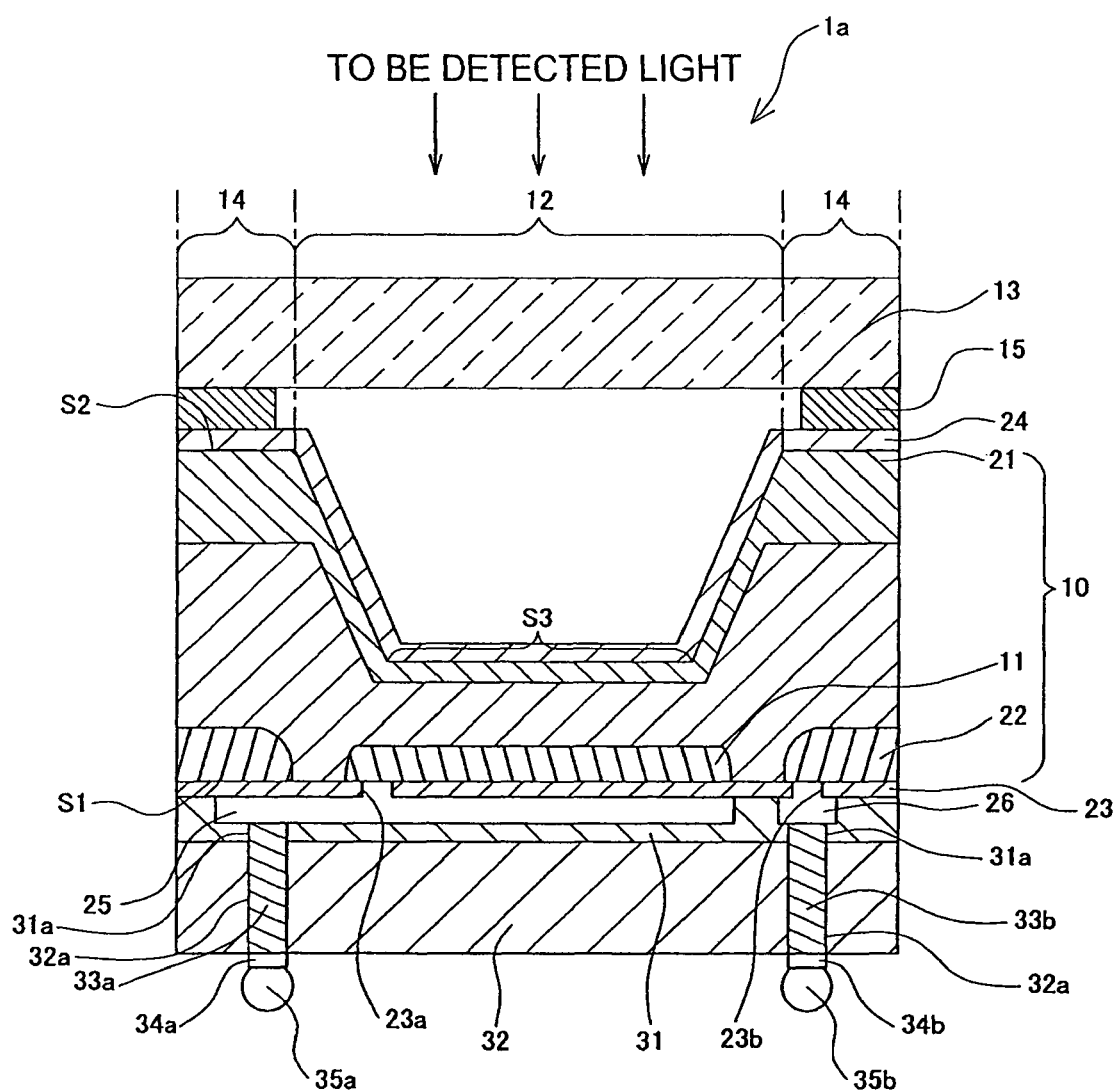
FIG. 23 is a cross-sectional view showing a first exemplary variation of the back illuminated photodiode 1 shown in FIG. 1.

FIG. 23 is a cross-sectional view showing a first exemplary variation of the back illuminated photodiode 1 shown in FIG. 1. In the back illuminated photodiode 1*a*, the shape of the N$^+$-type highly-doped impurity semiconductor layer 21 differs from that in the back illuminated photodiode I shown in FIG. 1. The other arrangements of the back illuminated photodiode 1*a* are the same as those of the back illuminated photodiode 1. That is, in the back illuminated photodiode 1 shown in FIG. 1, the N$^+$-type highly-doped impurity semiconductor layer 21 is formed in the entire surface layer on the rear surface S2 side of the N-type semiconductor substrate 10 at an approximately uniform thickness, while in the back illuminated photodiode 1*a*, the N$^+$-type highly-doped impurity semiconductor layer 21 is formed in such a manner that the portion provided in the surface layer on the rear surface S2 side within the outer edge portion 14 has a thickness greater than that of the other portions.

Also, in the back illuminated photodiode 1*a*, the N$^+$-type highly-doped impurity semiconductor layer 21 provided in the bottom surface S3 portion of the recessed portion 12 can function as an accumulation layer. Also, even if there may be crystal defects in the outer edge portion 14, the N$^+$-type highly-doped impurity semiconductor layer 21, which is provided in the surface layer on the rear surface S2 side within the outer edge portion 14, can suppress dark current and/or noise due to the crystal defects.

Figure 24:
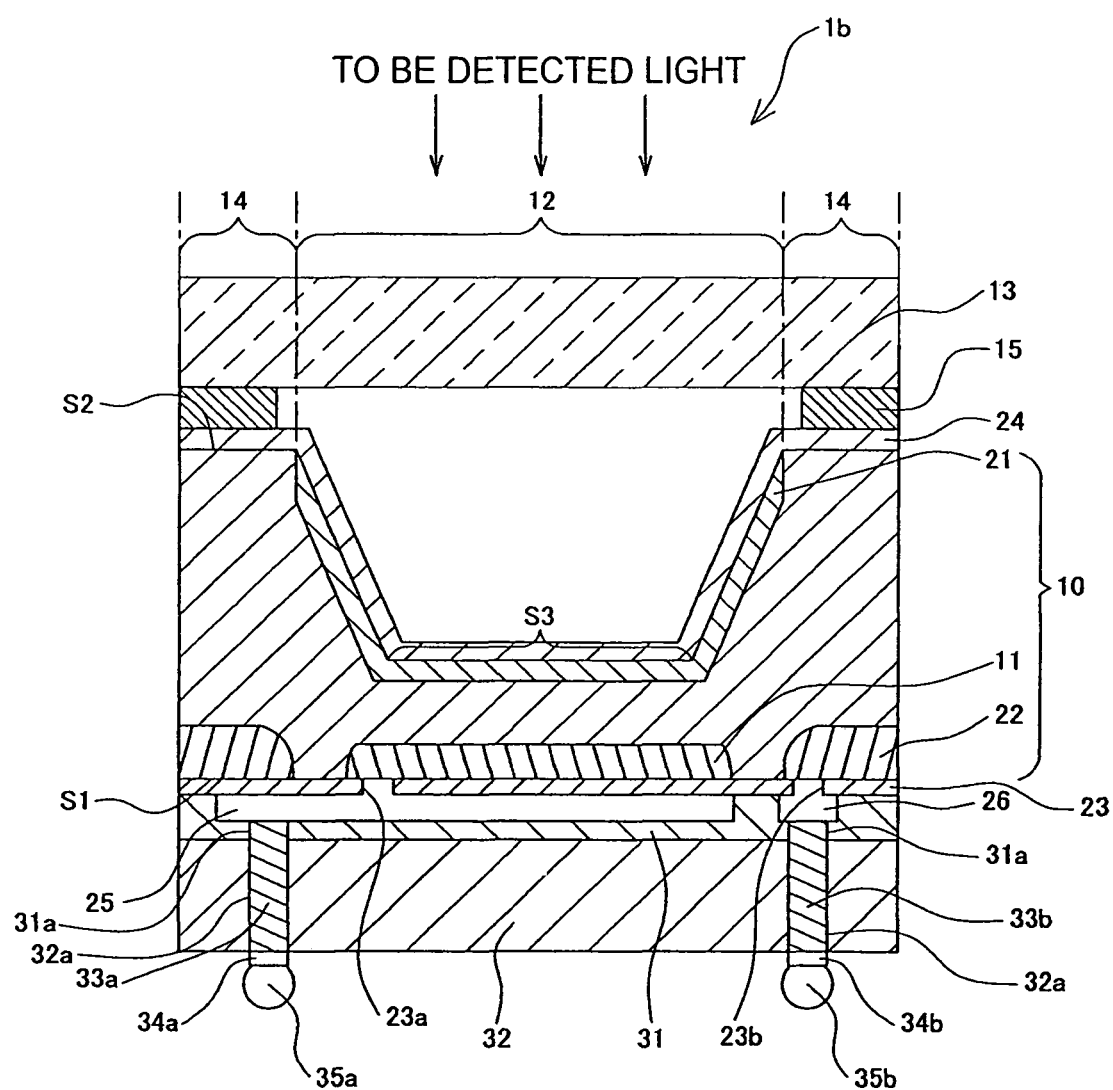
FIG. 24 is a cross-sectional view showing a second exemplary variation of the back illuminated photodiode 1 shown in FIG. 1.

FIG. 24 is a cross-sectional view showing a second exemplary variation of the back illuminated photodiode 1 shown in FIG. 1. In the back illuminated photodiode 1b, the shape of the N$^+$-type highly-doped impurity semiconductor layer 21 differs from that in the back illuminated photodiode 1 shown in FIG. 1. The other arrangements of the back illuminated photodiode 1b are the same as those of the back illuminated photodiode 1. That is, in the back illuminated photodiode 1 shown in FIG. 1, the N$^+$-type highly-doped impurity semiconductor layer 21 is formed in the entire surface layer on the rear surface S2 side of the N-type semiconductor substrate 10, while in the back illuminated photodiode 1b, the N$^+$-type highly-doped impurity semiconductor layer 21 is formed only in the recessed portion 12 within the surface layer on the rear surface S2 side of the N-type semiconductor substrate 10. Also, in the back illuminated photodiode 1b, the N$^+$-type highly-doped impurity semiconductor layer 21 provided in the bottom surface S3 portion of the recessed portion 12 can function as an accumulation layer.

Figure 25:
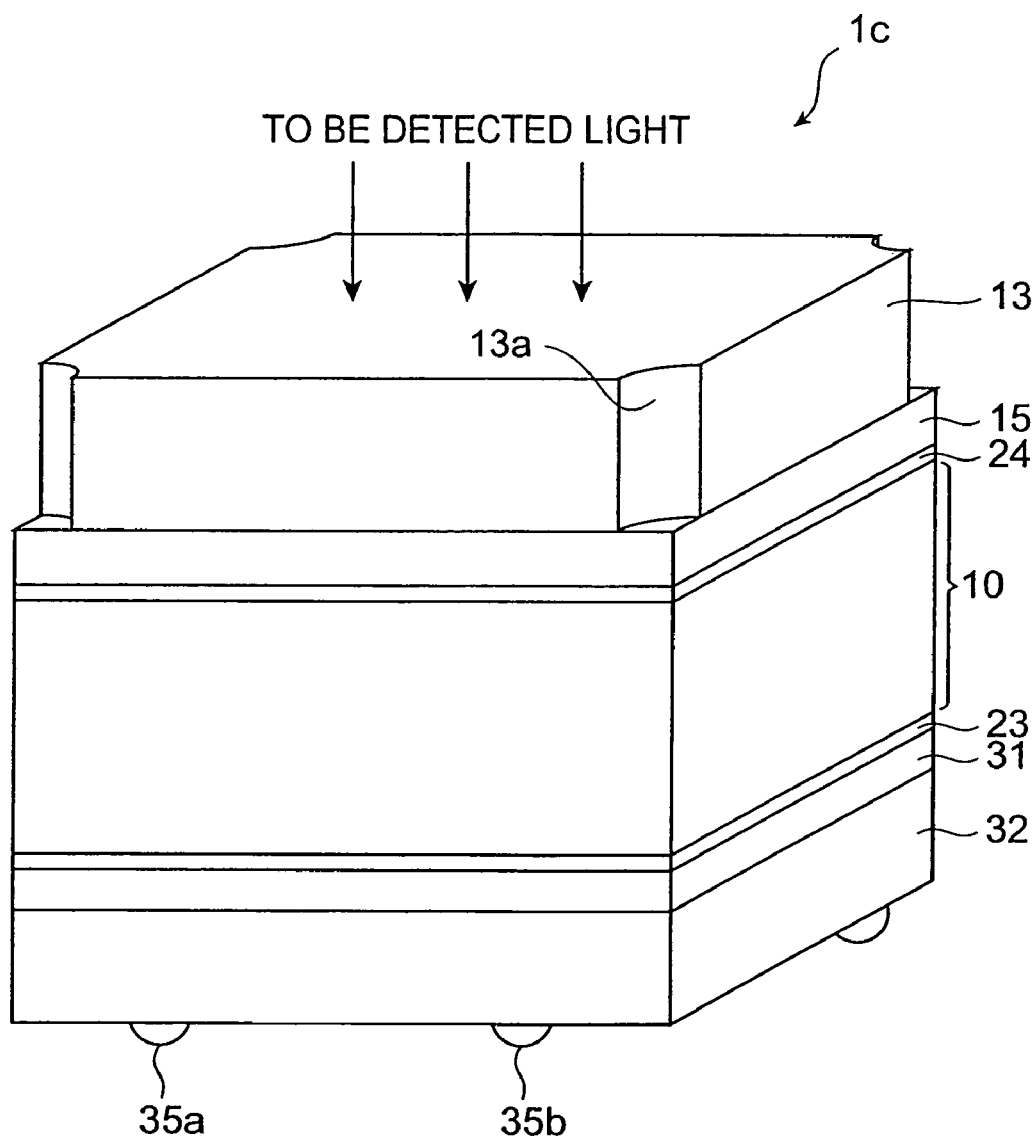
FIG. 25 is a perspective view showing a third exemplary variation of the back illuminated photodiode 1 shown in FIG. 1.

FIG. 25 is a perspective view showing a third exemplary variation of the back illuminated photodiode 1 shown in FIG. 1. The back illuminated photodiode 1c differs from the back illuminated photodiode 1 shown in FIG. 1 in that chamfered portions 13a are formed in the window plate 13. The other arrangements of the back illuminated photodiode 1c are the same as those of the back illuminated photodiode 1. As can be seen from FIG. 25, the window plate 13 has a square cross-sectional shape in a plane perpendicular to the thickness direction thereof, at the four corners of the square being formed chamfered portions 13a. The chamfered portions 13a each have a fan shape with a center angle of 90° centering on each corner of the square in the cross-section. Additionally, the chamfered portions 13a are not restricted to have a fan shape in the cross-section, but may have a rectangular shape.

In the back illuminated photodiode 1c, the chamfered portions 13a are thus formed at the corners of the window plate 13, that is, at the positions where two dicing lines intersect with each other in a dicing operation, which prevents chipping in the dicing operation.

Figure 26:
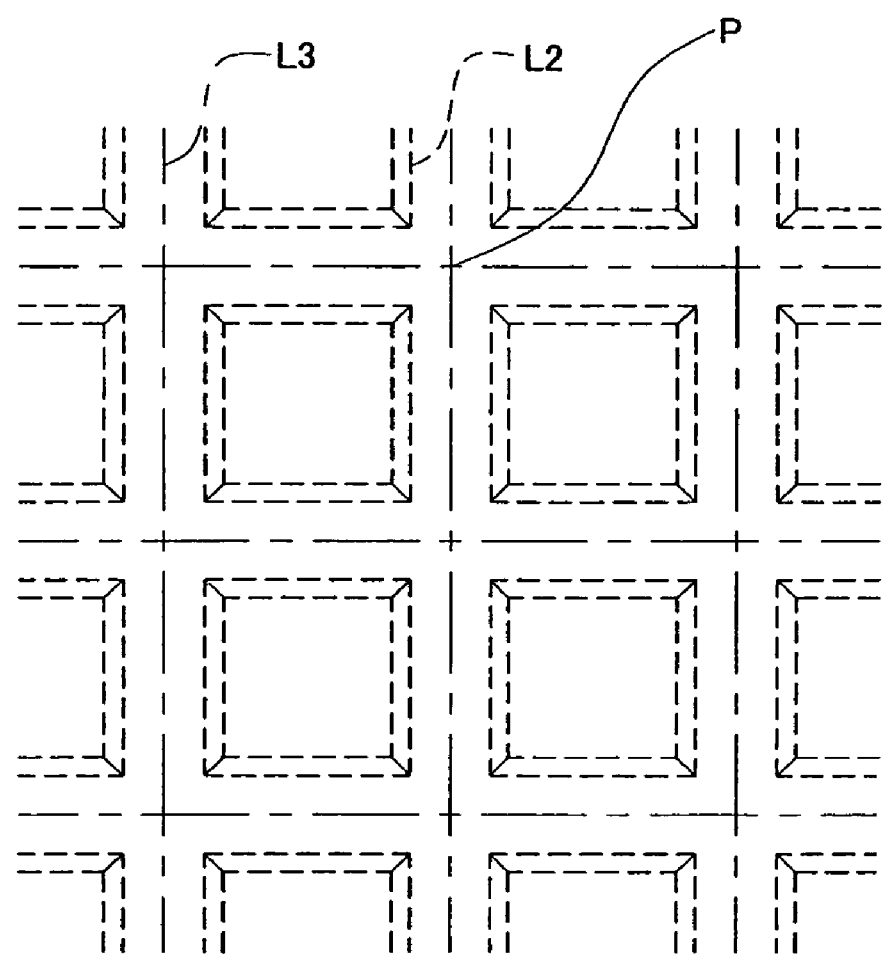
FIG. 26 is a plan view showing the appearance of the wafer of the back illuminated photodiode 1 shown in FIG. 1 before dicing when viewed from the side of the window plate 13.

The positional relationship between the window plate 13 and dicing lines will here be described with reference to FIG. 26. FIG. 26 is a plan view showing the appearance of the wafer of the back illuminated photodiode 1 shown in FIG. 1 before dicing (e.g. the wafer in a state shown in FIG. 16) when viewed from the side of the window plate 13. In this plan view, the portions where recessed portions 12 are formed are indicated by the dashed lines L2. It can be found that the recessed portions 12 are arranged in a grid pattern at a constant spacing in the wafer before dicing. Also, the dicing lines in a dicing operation are indicated by the alternate long and short dashed lines L3. The dicing lines are specified in the vertical direction or the horizontal direction in the figure, and run through the center of the space between adjacent recessed portions 12. Each area surrounded by the dicing lines corresponds to each back illuminated photodiode 1 after dicing. As can be seen from FIG. 26, the corners of the window plate 13 in each back illuminated photodiode 1 after dicing correspond to the positions P where two dicing lines intersect with each other. Since the positions in the N-type semiconductor substrate 10 corresponding to the positions P, that is, the four corners of the rear surface S2 receive stress in a concentrated manner in a dicing operation, there is a possibility of chipping.

On the contrary, in the back illuminated photodiode 1c shown in FIG. 25, at the corners of the window plate 13 are formed chamfered portions 13a, whereby the dicing of the window plate 13 at the positions P where dicing lines intersect with each other is avoided. This relaxes stress to be applied to the four corners of the rear surface S2 of the N-type semiconductor substrate 10, which prevents chipping in the back illuminated photodiode 1c in a dicing operation.

Figure 27:
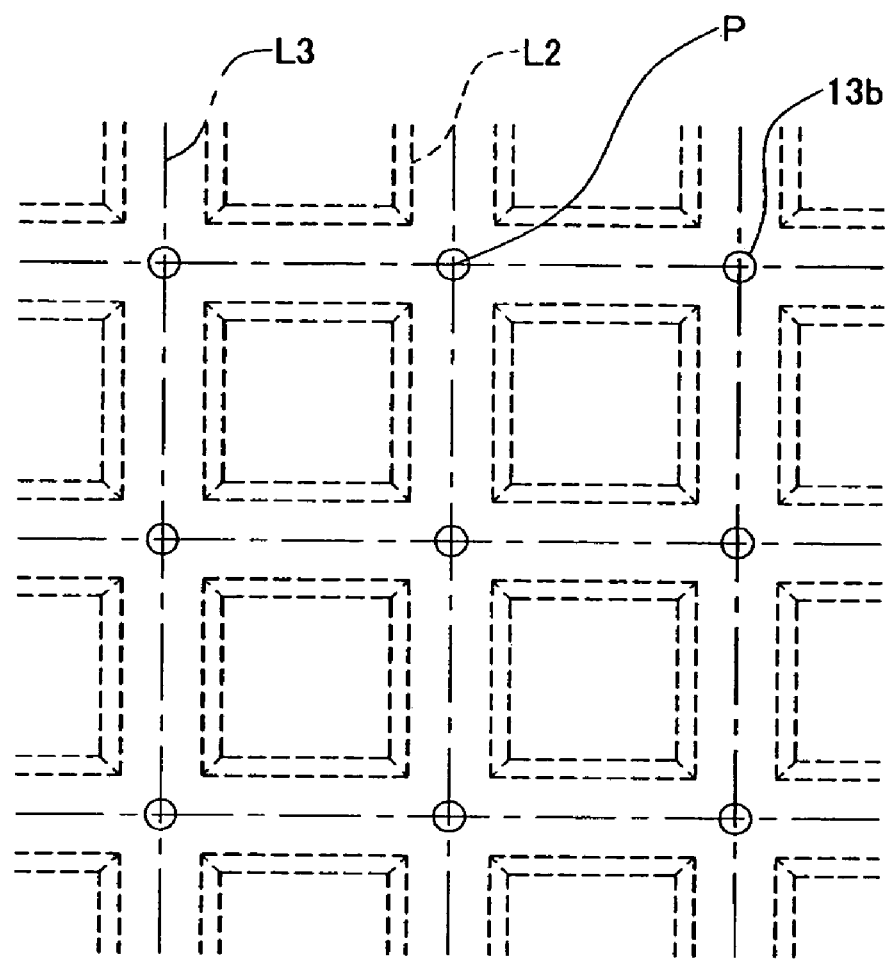
FIG. 27 is a plan view showing the appearance of the wafer of the back illuminated photodiode 1c shown in FIG. 25 before dicing when viewed from the side of the window plate 13.

FIG. 27 is a plan view showing the appearance of the wafer of the back illuminated photodiode 1c shown in FIG. 25 before dicing when viewed from the side of the window plate 13. As shown in this plan view, at the positions P where dicing lines intersect with each other are formed cylindrical hole portions 13b. The hole portions 13b are formed in and penetrate through each window plate 13. The chamfered portions 13a derive from these hole portions 13b. That is, each hole portion 13b is to be divided into quarters by a dicing operation to be chamfered portions 13a in the back illuminated photodiode 1c. Additionally, in the manufacturing process for the back illuminated photodiode 1c, it is only required to bond a window plate 13 with hole portions 13b formed preliminarily at predetermined positions to the rear surface S2 of the N-type semiconductor substrate 10 so that the positions P where dicing lines intersect with each other are aligned with the hole portions 13b. It is also noted that the hole portions 13b are not restricted to have a cylindrical shape, but may have a prismatic shape.

Figure 28:
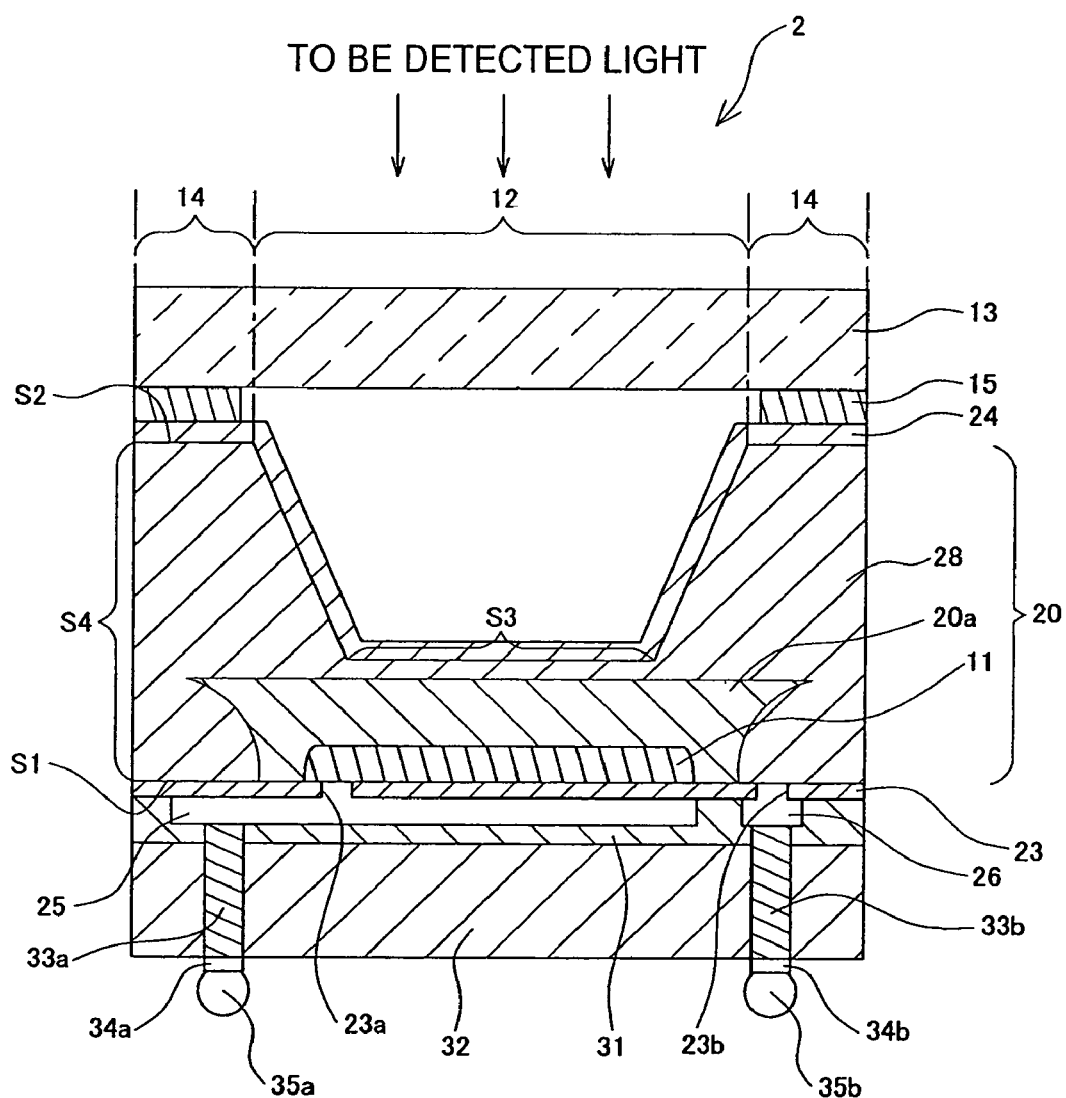
FIG. 28 is a cross-sectional view showing a second embodiment of a back illuminated photodetector according to the present invention.

FIG. 28 is a cross-sectional view showing a second embodiment of a back illuminated photodetector according to the present invention. The back illuminated photodiode 2 comprises an N-type semiconductor substrate 20, a P$^+$-type impurity semiconductor region 11, a recessed portion 12, and a window plate 13.

In the surface layer on the upper surface S1 side of the N-type semiconductor substrate 20 is partially formed the P$^+$-type impurity semiconductor region 11. In the rear surface S2 of the N-type semiconductor substrate 20 and in an area opposite the P$^+$-type impurity semiconductor region 11 is formed the recessed portion 12. Also, the window plate 13 is bonded to the outer edge portion 14 of the recessed portion 12 via a resin layer 15.

The back illuminated photodiode 2 also comprises an N$^+$-type highly-doped impurity semiconductor region 28, insulating films 23 and 24, an anode electrode 25, and a cathode electrode 26. The N$^+$-type highly-doped impurity semiconductor region 28 is formed in such a manner as to be exposed at the entire side surfaces S4 of the N-type semiconductor substrate 20. The N$^+$-type highly-doped impurity semiconductor region 28 also reaches the entire rear surface S2 of the N-type semiconductor substrate 20. Therefore, the portion 20a within the N-type semiconductor substrate 20, in which neither the P$^+$-type impurity semiconductor region 11 nor the N$^+$-type highly-doped impurity semiconductor region 28 is formed, is surrounded entirely by the N$^+$-type highly-doped impurity semiconductor region 28 from the side surface S4 sides and the rear surface S2 side of the N-type semiconductor substrate 20.

Figure 29:
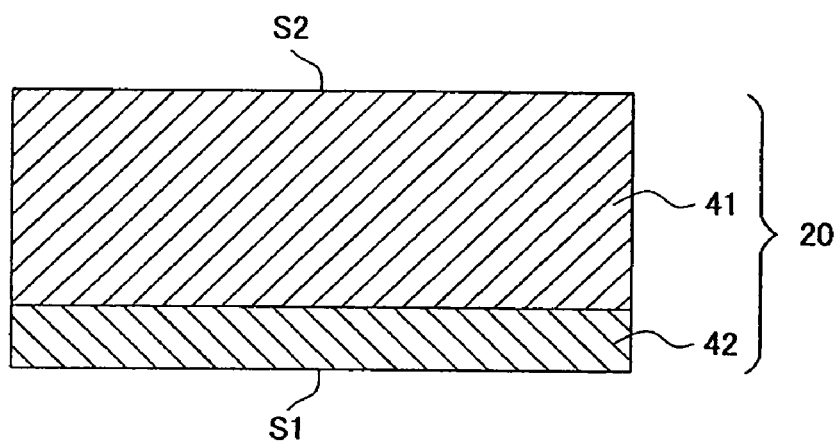
FIG. 29 is a view illustrating an exemplary method of forming the $N^+$-type highly-doped impurity semiconductor region 28 shown in FIG. 28.
Figure 30:
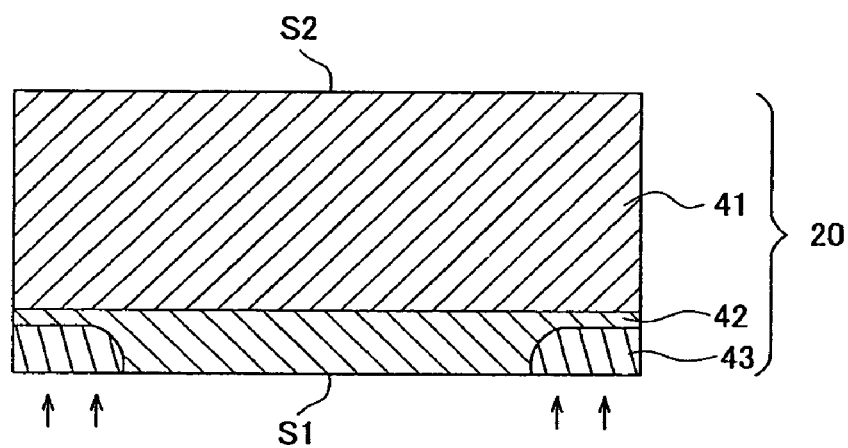
FIG. 30 is a view illustrating an exemplary method of forming the $N^+$-type highly-doped impurity semiconductor region 28 shown in FIG. 28.
Figure 31:
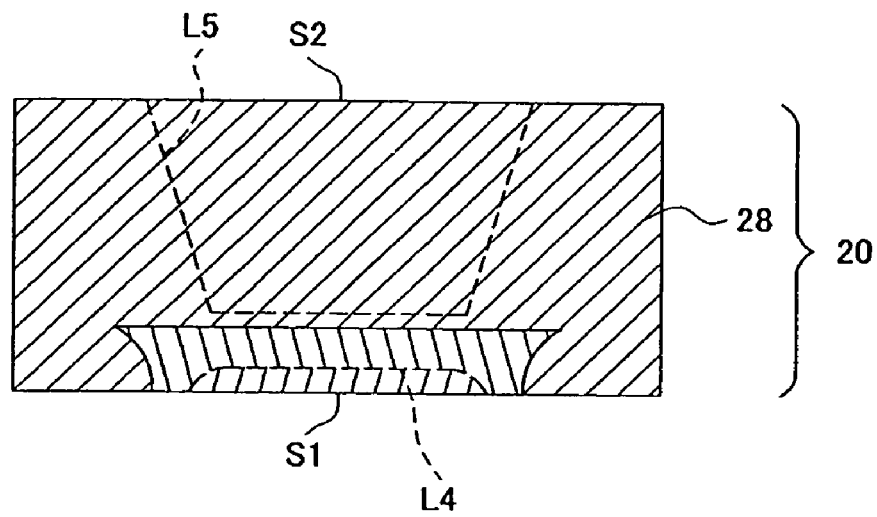
FIG. 31 is a view illustrating an exemplary method of forming the $N^+$-type highly-doped impurity semiconductor region 28 shown in FIG. 28.

An exemplary method of forming the N$^+$-type highly-doped impurity semiconductor region 28 will here be described with reference to FIG. 29 to FIG. 31. First, there is prepared an N-type semiconductor substrate 20. In the N-type semiconductor substrate 20, an N$^+$-type highly-doped impurity semiconductor layer 41 is diffused from the rear surface S2 with a part on the upper surface S1 side remaining. The remaining part on the upper surface S1 side is an N-type impurity semiconductor layer 42 having an impurity concentration lower than that of the N$^+$-type highly-doped impurity semiconductor layer 41 (FIG. 29). Next, N-type impurities are diffused at a high concentration from the upper surface S1 side to form $N^+$-type highly-doped impurity semiconductor regions 43 (FIG. 30). Then, the N-type impurities are diffused further deeply so that the $N^+$-type highly-doped impurity semiconductor regions 43 reach the $N^+$-type highly-doped impurity semiconductor layer 41 (FIG. 31). There is thus formed an $N^+$-type highly-doped impurity semiconductor region 28 composed of the $N^+$-type highly-doped impurity semiconductor layer 41 and the $N^+$-type highly-doped impurity semiconductor regions 43. Additionally, in FIG. 31, the areas where a $P^+$-type impurity semiconductor region 11 and a recessed portion 12 are to be formed are indicated, respectively, by the dashed lines L4 and L5. In accordance with the method, the manufacturing process for the $N^+$-type highly-doped impurity semiconductor region 28 and therefore for the entire back illuminated photodiode 2 is simplified.

Returning to FIG. 28, on the upper surface S1 and the rear surface S2 of the N-type semiconductor substrate 20 are formed, respectively, the insulating films 23 and 24. Also, in the insulating film 23 are formed openings 23a and 23b, one opening 23a being provided within the range of the $P^+$-type impurity semiconductor region 11, while the other opening 23b being provided within the range of the $N^+$-type highly-doped impurity semiconductor region 28.

On the insulating film 23 and in the areas including the openings 23a and 23b are formed, respectively, the anode electrode 25 and the cathode electrode 26. The electrodes 25 and 26 are provided in such a manner as to fill the respective openings 23a and 23b. Thus, the anode electrode 25 is connected directly to the $P^+$-type impurity semiconductor region 11 through the opening 23a, while the cathode electrode 26 is connected directly to the $N^+$-type highly-doped impurity semiconductor region 28 through the opening 23b.

The back illuminated photodiode 2 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 20 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 2 will here be described. In the back illuminated photodiode 2, the window plate 13 is bonded to the outer edge portion 14 of the N-type semiconductor substrate 20. This eliminates the use of an external package such as a ceramic package, whereby it is possible to obtain a chip-sized back illuminated photodiode 2. Accordingly, there is achieved a back illuminated photodiode 2 having a sufficiently small package.

Further, in the back illuminated photodiode 2, the surface of the window plate 13 functions as an incident plane for to-be-detected light. Since the surface of the window plate 13 can be flattened more easily than resin, it is possible to suppress the scattering of to-be-detected light at the incident plane. There is thus achieved a back illuminated photodiode 2 capable of detecting light at a high sensitivity.

Also, in the back illuminated photodiode 2, the $N^+$-type highly-doped impurity semiconductor region 28 is formed in such a manner as to be exposed at the entire side surfaces S4 of the N-type semiconductor substrate 20. Thus, the $N^+$-type highly-doped impurity semiconductor region 28 can suppress dark current and/or noise generated in the vicinity of the side surfaces S4 of the N-type semiconductor substrate 20. Although the side surfaces S4 correspond to dicing lines whereby there is a possibility of causing crystal defects in a dicing operation, the $N^+$-type highly-doped impurity semiconductor region 28 can also suppress dark current and/or noise due to the crystal defects. Therefore, in accordance with the back illuminated photodiode 2, it is possible to obtain a detected signal at a high S/N ratio.

In addition, the portion 20a within the N-type semiconductor substrate 20 is surrounded entirely by the $N^+$-type highly-doped impurity semiconductor region 28 from the side surface S4 sides and the rear surface S2 side of the N-type semiconductor substrate 20. There is thus achieved a PIN structure in which the surrounded portion 20a is employed as an I-layer. Therefore, the back illuminated photodiode 2 achieves a sensitivity increase due to such a PIN structure whereby the depletion layer is thickened to increase the length through which light is absorbed, and a high-speed response due to the thus thickened depletion layer whereby the thickness of the electric double layer is increased to reduce the capacitance thereof.

Figure 32:
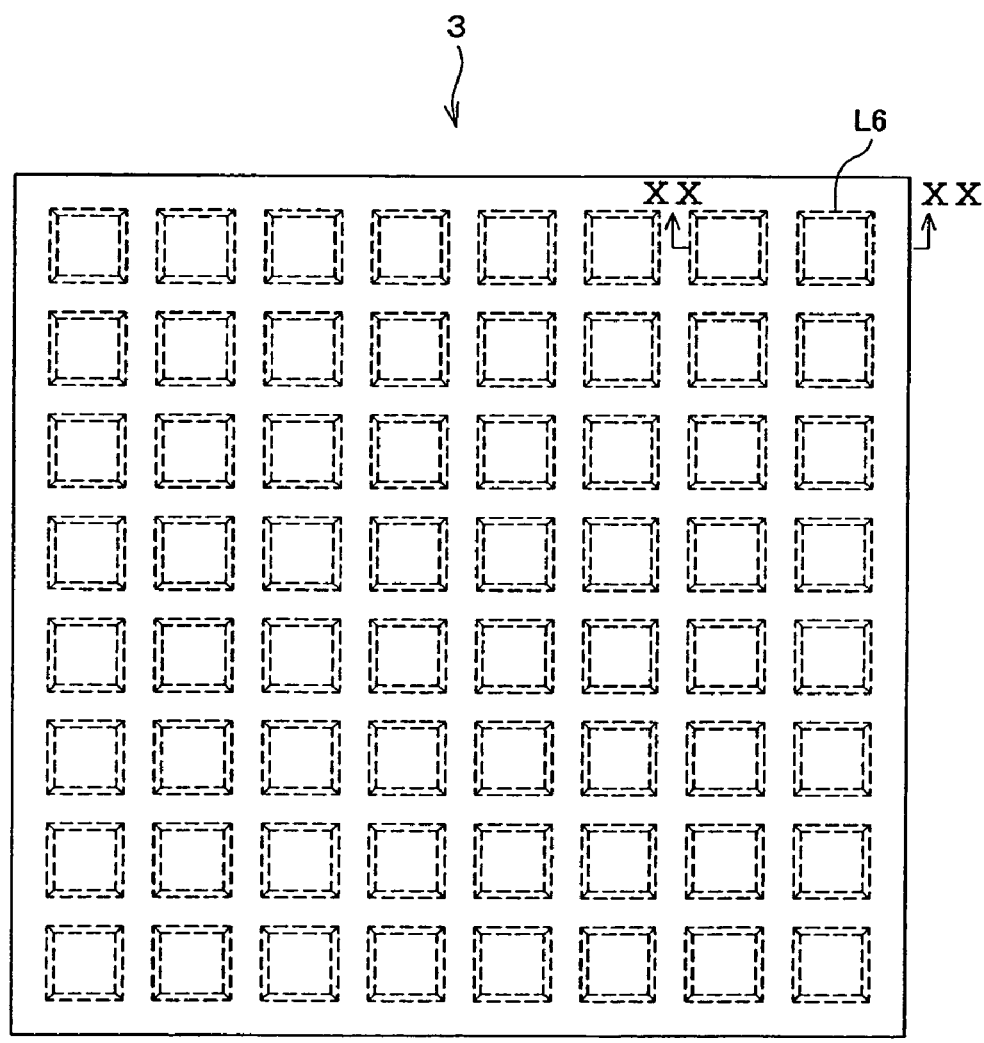
FIG. 32 is a plan view showing a third embodiment of a back illuminated photodetector according to the present invention.

FIG. 32 is a plan view showing a third embodiment of a back illuminated photodetector according to the present invention. The back illuminated photodiode array 3 is composed of a total of sixty-four back illuminated photodiodes that are arranged in an eight-by-eight grid pattern. The arrangement pitch of these photodiodes 1 mm, for example. FIG. 32 shows the appearance of the back illuminated photodiode array 3 when viewed from the rear surface side. The rear surface of each photodiode is covered with a window plate, as is the case with the back illuminated photodiode 1 shown in FIG. 1. Additionally, in FIG. 32, the portions where recessed portions are formed are indicated by the dashed lines L6.

Figure 33:
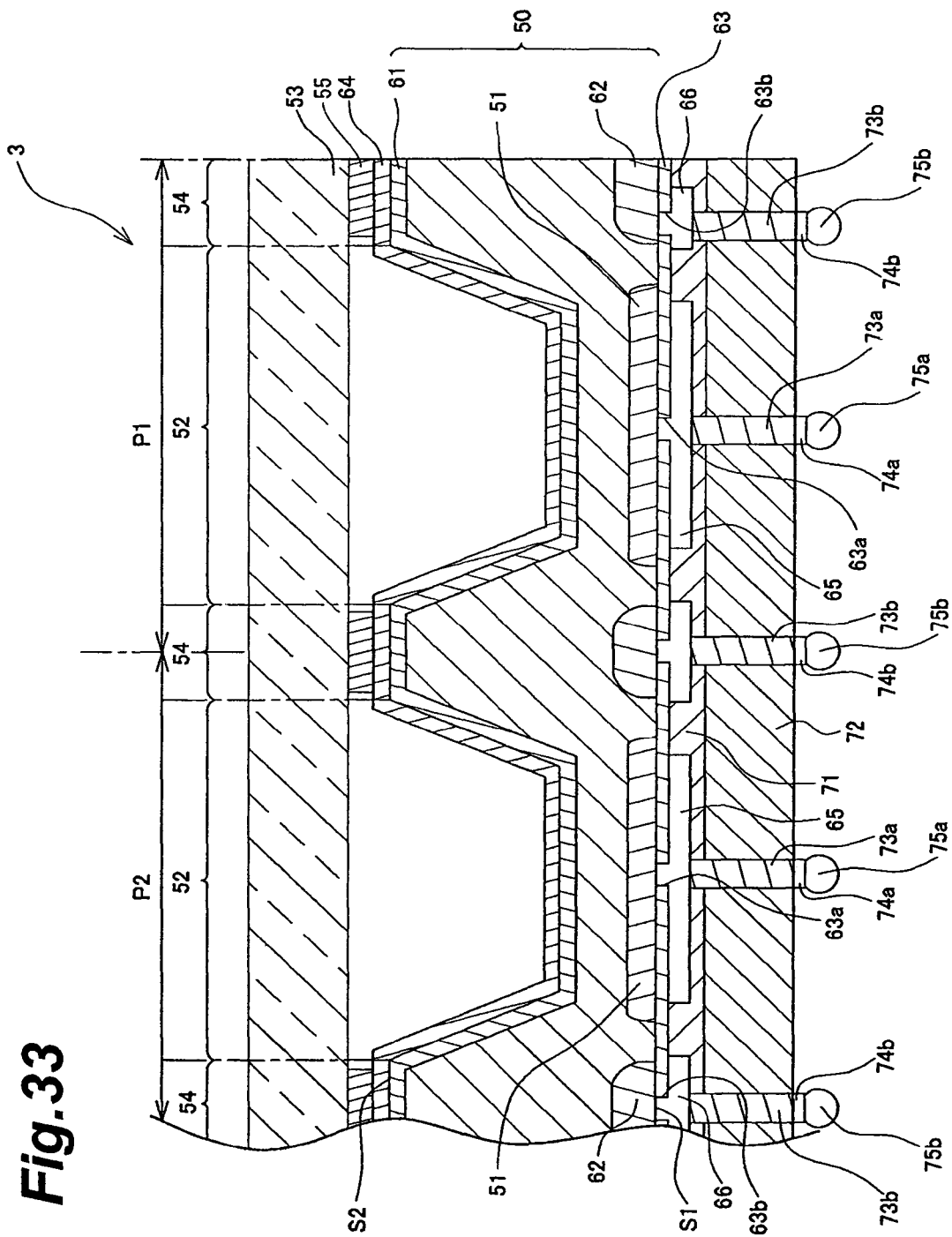
FIG. 33 is a cross-sectional view of the back illuminated photodiode array 3 shown in FIG. 32 along the line XX-XX.

FIG. 33 is a cross-sectional view of the back illuminated photodiode array 3 shown in FIG. 32 along the line XX-XX. In the cross-sectional view are shown two photodiodes P1 and P2 among the sixty-four photodiodes shown in FIG. 32. As shown in FIG. 33, the back illuminated photodiode array 3 comprises an N-type semiconductor substrate 50, a $P^+$-type impurity semiconductor region 51, a recessed portion 52, and a window plate 53.

In the surface layer on the upper surface S1 side of the N-type semiconductor substrate 50 are formed a plurality of the $P^+$-type impurity semiconductor regions 51. The $P^+$-type impurity semiconductor regions 51 are provided, respectively, for the photodiodes P1 and P2. The area of each $P^+$-type impurity semiconductor region 51 is 0.75×0.75 mm$^2$, for example. In the rear surface S2 of the N-type semiconductor substrate 50 and in an area opposite the $P^+$-type impurity semiconductor region 51 is formed the recessed portion 52. Here is formed a plurality of the recessed portions 52 being provided with a plurality of the $P^+$-type impurity semiconductor regions 51. In each of the photodiodes P1 and P2 are provided a pair of a $P^+$-type impurity semiconductor region 51 and a recessed portion 52. Also, the window plate 53 is bonded to the outer edge portions 54 of the recessed portions 52 through resin layers 55.

The back illuminated photodiode array 3 also comprises an $N^+$-type highly-doped impurity semiconductor layer 61, $N^+$-type highly-doped impurity semiconductor regions 62, insulating films 63 and 64, anode electrodes 65, and cathode electrodes 66. The $N^+$-type highly-doped impurity semiconductor layer 61 is formed in the entire surface layer on the rear surface S2 side of the N-type semiconductor substrate 50. The N[+]-type highly-doped impurity semiconductor regions 62 are formed in the surface layer on the upper surface S1 side of the N-type semiconductor substrate 50. The N[+]-type highly-doped impurity semiconductor regions 62 are preferably provided in such a manner as to surround the P[+]-type impurity semiconductor regions 51 constituting the respective photodiodes.

On the upper surface S1 and the rear surface S2 of the N-type semiconductor substrate 50 are formed, respectively, the insulating films 63 and 64. In the insulating film 63 are formed openings 63a and 63b, some openings 63a being provided within the range of the P[+]-type impurity semiconductor regions 51, while the other openings 63b being provided within the range of the N-type highly-doped impurity semiconductor regions 62.

On the insulating film 63 and in the areas including the openings 63a and 63b are formed, respectively, the anode electrodes 65 and the cathode electrodes 66. In each of the photodiodes P1 and P2 are provided a pair of an anode electrode 65 and a cathode electrode 66. The electrodes 65 and 66 are also provided in such a manner as to fill the respective openings 63a and 63b. Thus, the anode electrodes 65 are connected directly to the P[+]-type impurity semiconductor regions 51 through the respective openings 63a, while the cathode electrodes 66 are connected directly to the N[+]-type highly-doped impurity semiconductor regions 62 through the respective openings 63b.

The back illuminated photodiode array 3 further comprises a passivating film 71, a supporting film 72, filling electrodes 73a and 73b, UBMs 74a and 74b, and bumps 75a and 75b. The passivating film 71 is provided on the upper surface S1 of the N-type semiconductor substrate 50 in such a manner as to cover the insulating film 63, anode electrodes 65, and cathode electrodes 66. On the passivating film 71 is formed the supporting film 72. Also, the filling electrodes 73a and 73b penetrate through the passivating film 71 and the supporting film 72 to extend, respectively, from the anode electrodes 65 and the cathode electrodes 66 to the surface of the supporting film 72. On the exposed portions of the filling electrodes 73a and 73b at the surface of the supporting film 72 are formed the UBMs 74a and 74b. On the surfaces of the UBMs 74a and 74b on the opposite side of the filling electrodes 73a and 73b are formed the bumps 75a and 75b.

The effect of the back illuminated photodiode array 3 will here be described. In the back illuminated photodiode array 3, the window plate 53 is bonded to the outer edge portions 54 of the N-type semiconductor substrate 50. This eliminates the use of an external package such as a ceramic package, whereby it is possible to obtain a chip-sized back illuminated photodiode array 3 without extra portions around the array. Accordingly, there is achieved a back illuminated photodiode array 3 having a sufficiently small package.

Further, in the back illuminated photodiode array 3, the surface of the window plate 53 functions as an incident plane for to-be-detected light. Since the surface of the window plate 53 can be flattened more easily than resin, it is possible to suppress the scattering of to-be-detected light at the incident plane. There is thus achieved a back illuminated photodiode array 3 capable of detecting light at a high sensitivity.

There is also constructed a plurality of photodiodes by forming a plurality of P[+]-type impurity semiconductor regions 51 in a plurality of areas in the surface layer on the upper surface S1 side of the N-type semiconductor substrate 50, and by forming a plurality of recessed portions 52 in the rear surface S2 and in areas opposite the respective P[+]-type impurity semiconductor regions 51. Therefore, the back illuminated photodiode array 3 can suitably be used for an image sensor, etc., in which each photodiode represents one pixel.

Figure 34:
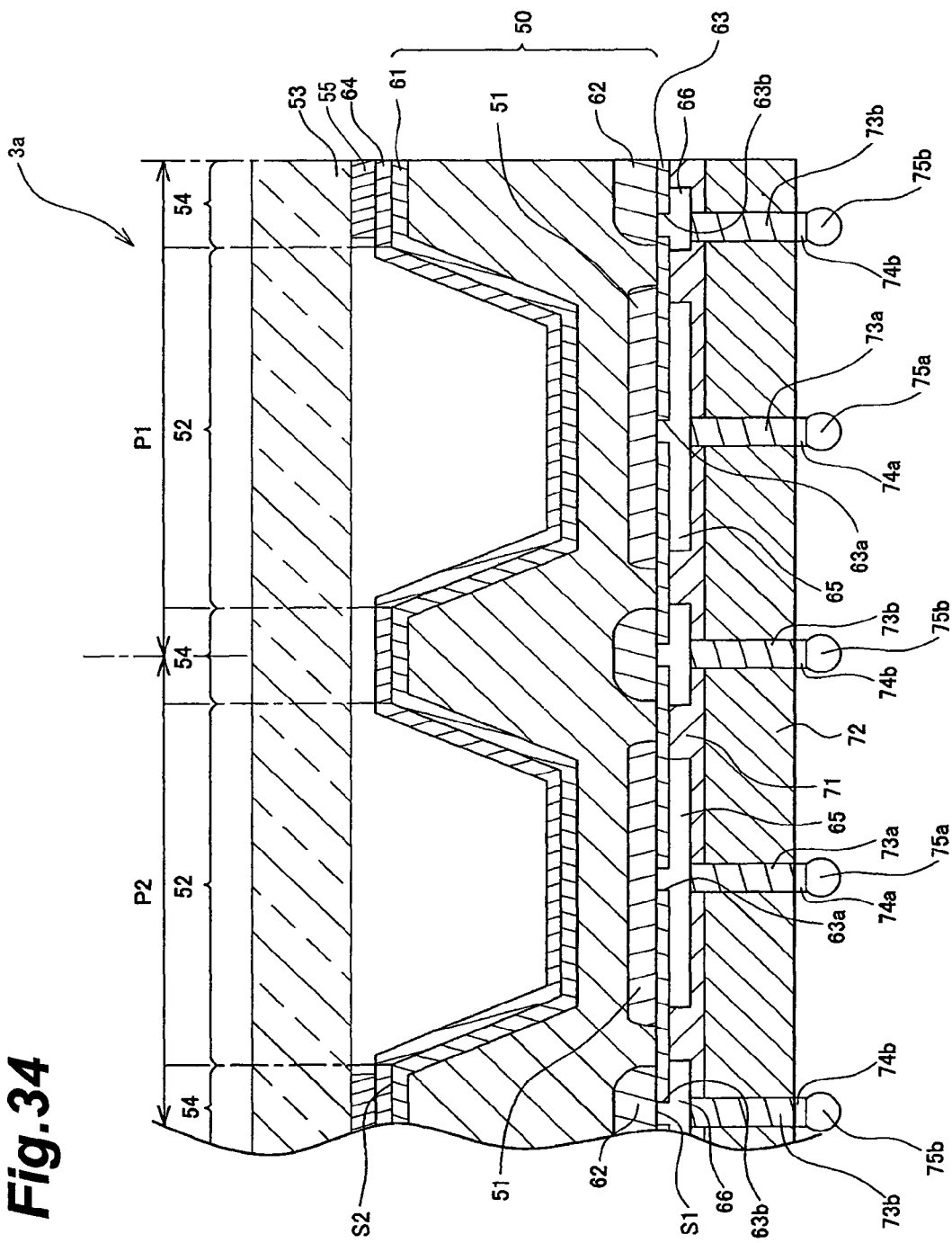
FIG. 34 is a cross-sectional view showing an exemplary variation of the back illuminated photodiode array 3 shown in FIG. 33.

FIG. 34 is a cross-sectional view showing an exemplary variation of the back illuminated photodiode array 3 shown in FIG. 33. The back illuminated photodiode array 3a differs from the back illuminated photodiode array 3 shown in FIG. 33 in that resin layers 55 are provided only on some outer edge portions 54. The other arrangements of the back illuminated photodiode array 3a are the same as those of the back illuminated photodiode array 3. That is, in the cross-sectional view of FIG. 34, resin layers 55 are provided only between the outer edge portions 54 on both ends and the window plate 53, while no resin layer 55 between the central outer edge portion 54 and the window plate 53 is provided. This is achieved by dividing the sixty-four recessed portions indicated by the dashed lines L6 in the plan view of FIG. 32 into groups composed of four (two-by-two) proximal recessed portions, and then by providing resin layers 55 only between the outer edge portions 54 on the periphery of each group and the window plate 53. Thus, providing resin layers 55 only on some outer edge portions 54 allows the process for bonding the window plate 53 and the outer edge portions 54 and therefore the manufacturing process for the entire back illuminated photodiode array 3 to be simplified.

Figure 35:
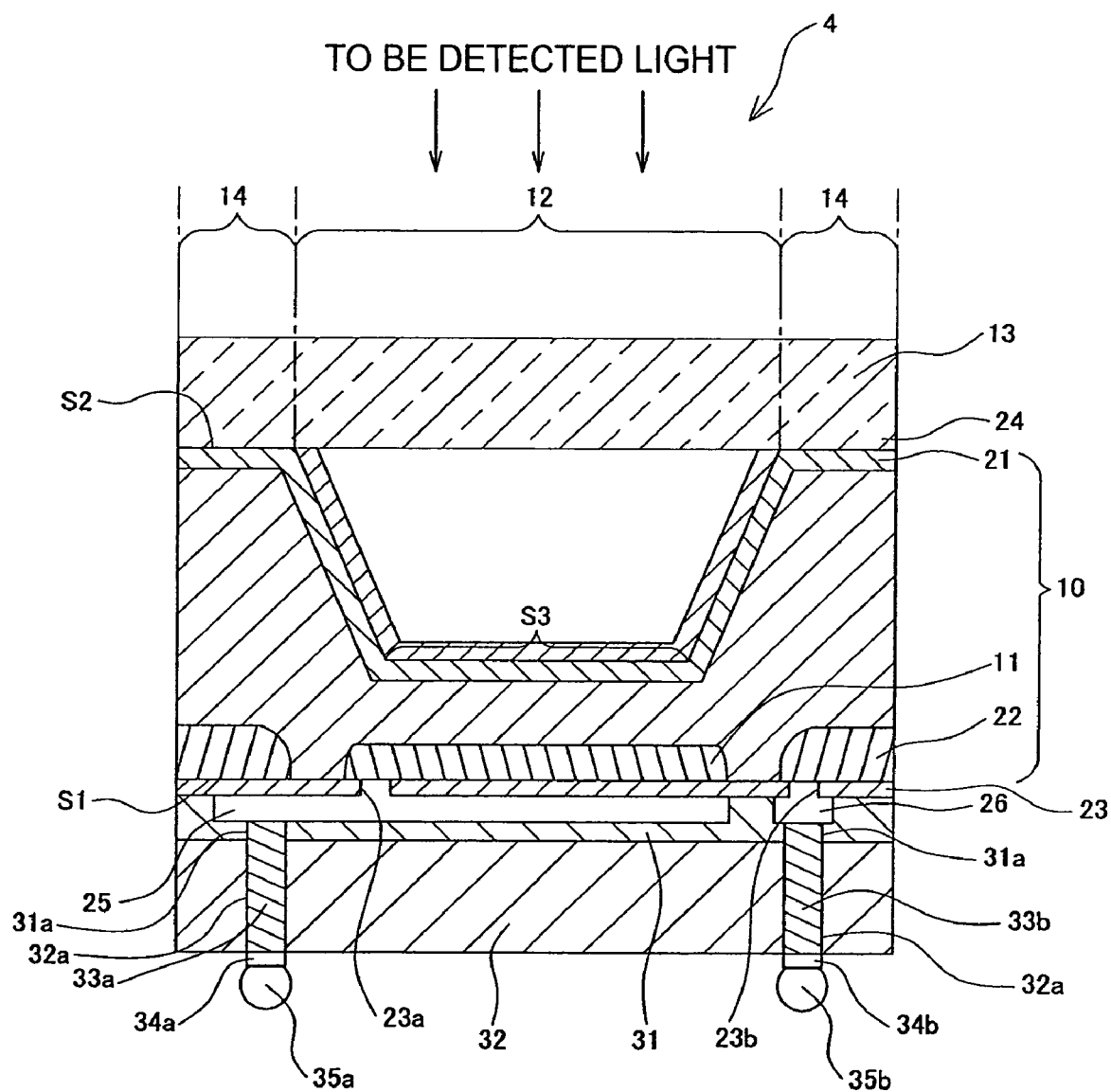
FIG. 35 is a cross-sectional view showing a fourth embodiment of a back illuminated photodetector according to the present invention.

FIG. 35 is a cross-sectional view showing a fourth embodiment of a back illuminated photodetector according to the present invention. The back illuminated photodiode 4 comprises an N-type semiconductor substrate 10, a P[+]-type impurity semiconductor region 11, a recessed portion 12, and a window plate 13. In the surface layer on the upper surface S1 side of the N-type semiconductor substrate 10 is partially formed the P[+]-type impurity semiconductor region 11. In the rear surface S2 of the N-type semiconductor substrate 20 and in an area opposite the P[+]-type impurity semiconductor region 11 is formed the recessed portion 12. Also, the window plate 13 is bonded to the outer edge portion 14 of the recessed portion 12. In the present embodiment, the window plate 13 is made of an optically transparent material and is bonded to the outer edge portion 14 by anodic bonding. As an optically transparent material of the window plate 13, glass containing alkali metal such as Pyrex (registered trademark) glass or kovar glass is preferably used. For example, borosilicate glass containing alkali metal such as #7740 manufactured by Corning Inc. is suitable for a material of the window plate 13. #7740 manufactured by Corning Inc., has a thermal expansion coefficient of $3.4 \times 10^{-6}/°$ C., which approximately corresponds to the thermal expansion coefficient ($3 \times 10^6/°$ C.) of silicon. Also, the thickness of the window plate 13 is preferably 0.5 mm or more but 1 mm or less.

The back illuminated photodiode 4 also comprises an N[+]-type highly-doped impurity semiconductor layer 21, an N[+]-type highly-doped impurity semiconductor region 22, insulating films 23 and 24, an anode electrode 25, and a cathode electrode 26. The N[+]-type highly-doped impurity semiconductor layer 21 is formed in the entire surface layer on the rear surface S2 side of the N-type semiconductor substrate 10. The N[+]-type highly-doped impurity semiconductor region 22 is formed in the surface layer on the upper surface S1 side of the N-type semiconductor substrate 10 at a predetermined distance from the P[+]-type impurity semiconductor region 11. The insulating films 23 and 24 are formed, respectively, on the upper surface S1 and the rear surface S2 of the N-type semiconductor substrate 10. In the insulating film 23 are formed openings 23a and 23b. In the present embodiment, the insulating film 24 is formed only on the recessed portion 12, and not on the outer edge portion 14 that functions as a bond part for the window plate 13.

On the insulating film 23 and in the areas including the openings 23a and 23b are formed, respectively, the anode electrode 25 and the cathode electrode 26. The electrodes 25 and 26 are provided in such a manner as to fill the respective openings 23a and 23b. Thus, the anode electrode 25 is connected directly to the $P^+$-type impurity semiconductor region 11 through the opening 23a, while the cathode electrode 26 is connected directly to the $N^+$-type highly-doped impurity semiconductor region 22 through the opening 23b.

The back illuminated photodiode 4 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 20 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 4 will here be described. In the back illuminated photodiode 4, the window plate 13 is bonded to the outer edge portion 14 of the N-type semiconductor substrate 10. This eliminates the use of an external package such as a ceramic package, whereby it is possible to obtain a chip-sized back illuminated photodiode 4. Accordingly, there is achieved a back illuminated photodiode 4 having a sufficiently small package.

Further, in the back illuminated photodiode 4, the surface of the window plate 13 functions as an incident plane for to-be-detected light. Since the surface of the window plate 13 can be flattened more easily than resin, it is possible to suppress the scattering of to-be-detected light at the incident plane. There is thus achieved a back illuminated photodiode 4 capable of detecting light at a high sensitivity.

Further, the window plate 13 made of glass is bonded to the outer edge portion 14 by anodic bonding. This allows the window plate 13 and the outer edge portion 14 to be bonded solidly at the interface therebetween. In addition, the anodic bonding can seal the rear surface S2 of the N-type semiconductor substrate 10 hermetically, resulting in a further improvement in reliability for the back illuminated photodiode 4. Further, performing anodic bonding under a dry inert gas atmosphere such as dry nitrogen gas or under a vacuum atmosphere results in still a further improvement in reliability.

Since the window plate 13 is bonded to the outer edge portion 14 by anodic bonding, the back illuminated photodiode 4 can suitably be used also in the case of UV light to be detected. That is, in the case of bonding the window plate 13 to the outer edge portion 14 using resin, there is a possibility that gas may be generated from the resin (degassing reaction) by irradiation of UV light. In this case, the gas may be attached to the window plate 13 and/or the recessed portion 12 to be solidified, resulting in a possibility of prevention of to-be-detected light incidence and thereby sensitivity reduction of the back illuminated photodiode 4. On the contrary, in the back illuminated photodiode 4, since the window plate 13 is bonded to the outer edge portion 14 by anodic bonding, there is no possibility of sensitivity reduction due to degassing reaction even in the case of UV light to be detected.

Also, in the case of using glass containing alkali metal such as Pyrex glass or kovar glass as an optically transparent material of the window plate 13, the window plate 13 can be bonded to the outer edge portion 14 more solidly.

Figure 36:
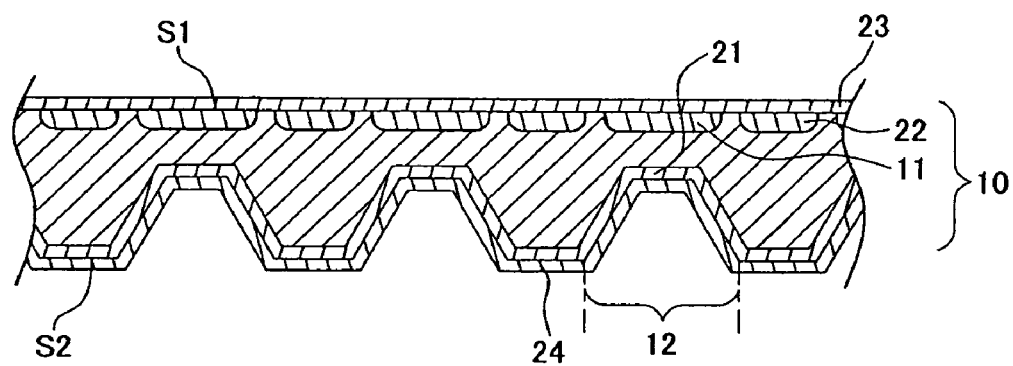
FIG. 36 is a step chart showing a method for manufacturing the back illuminated photodiode 4 shown in FIG. 35.
Figure 37:
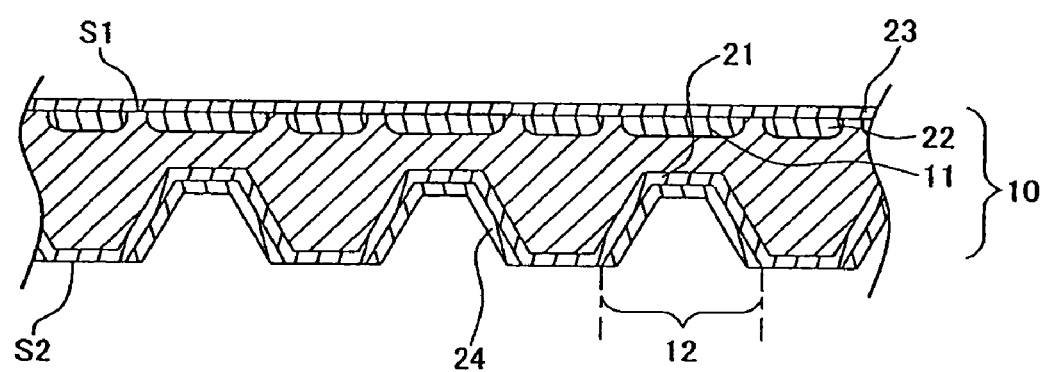
FIG. 37 is a step chart showing a method for manufacturing the back illuminated photodiode 4 shown in FIG. 35.
Figure 38:
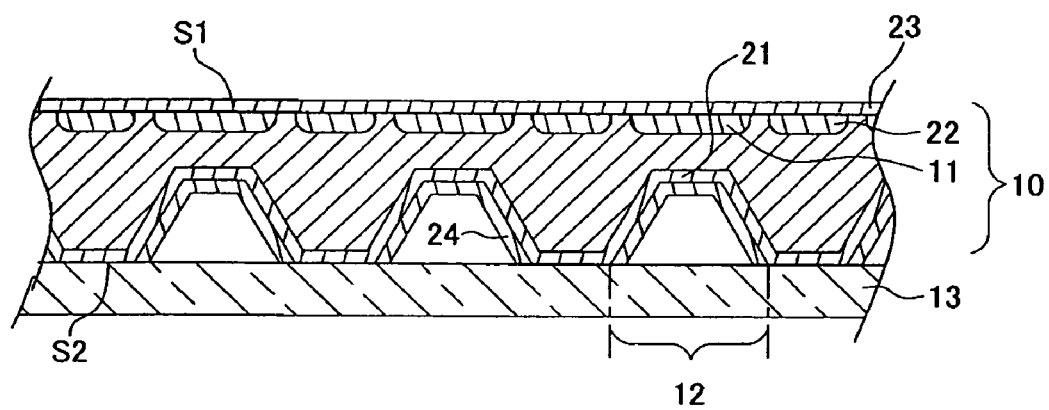
FIG. 38 is a step chart showing a method for manufacturing the back illuminated photodiode 4 shown in FIG. 35.

An exemplary method for manufacturing the back illuminated photodiode 4 shown in FIG. 35 will here be described with reference to FIG. 36 to FIG. 46. There is prepared an N-type semiconductor substrate 10. In the N-type semiconductor substrate 10 are then formed $N^+$-type highly-doped impurity semiconductor regions 22, $P^+$-type impurity semiconductor regions 11, and recessed portions 12, and on the upper surface S1 and the rear surface S2 are formed, respectively, insulating films 23 and 24. The steps so far are the same as the manufacturing method shown in FIG. 3 to FIG. 6, FIG. 7, and FIG. 8 (FIG. 36). In the present manufacturing method, the insulating film 24 on the outer edge portions 14 is further removed by etching (FIG. 37). Next, while a window plate 13 made of glass is in contact with the outer edge portions 14, the window plate 13 is bonded to the outer edge portions 14 by anodic bonding (window plate bonding step). The anodic bonding is to be performed at a temperature of 150 to 500° C., at a voltage of about 200 to 1000V, and under an ambient atmosphere, $N_2$ atmosphere, or vacuum atmosphere, for example (FIG. 38).

Figure 39:
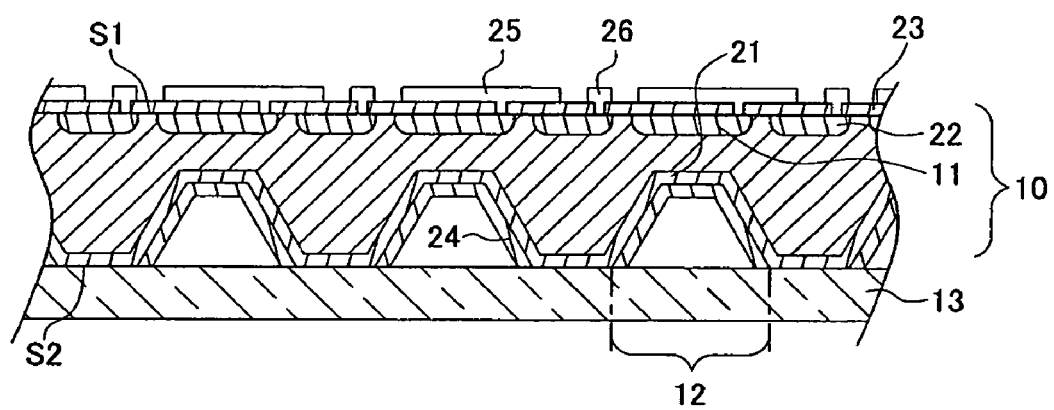
FIG. 39 is a step chart showing a method for manufacturing the back illuminated photodiode 4 shown in FIG. 35.
Figure 40:
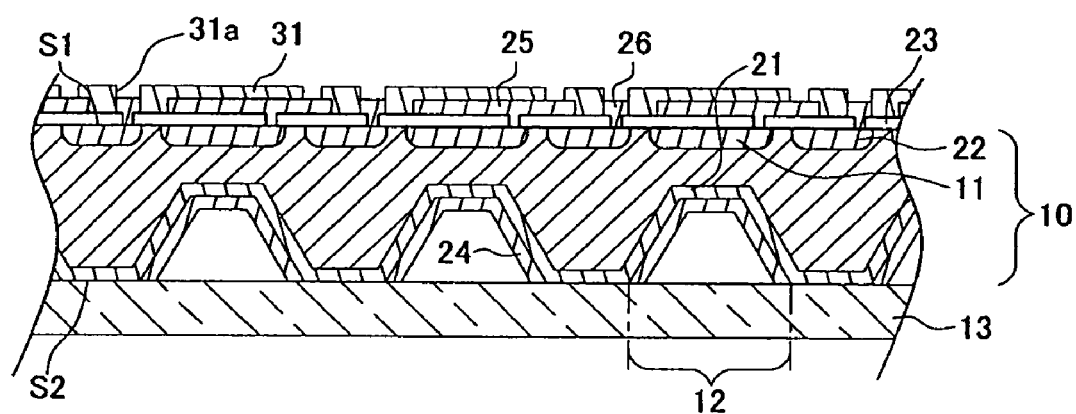
FIG. 40 is a step chart showing a method for manufacturing the back illuminated photodiode 4 shown in FIG. 35.
Figure 41:
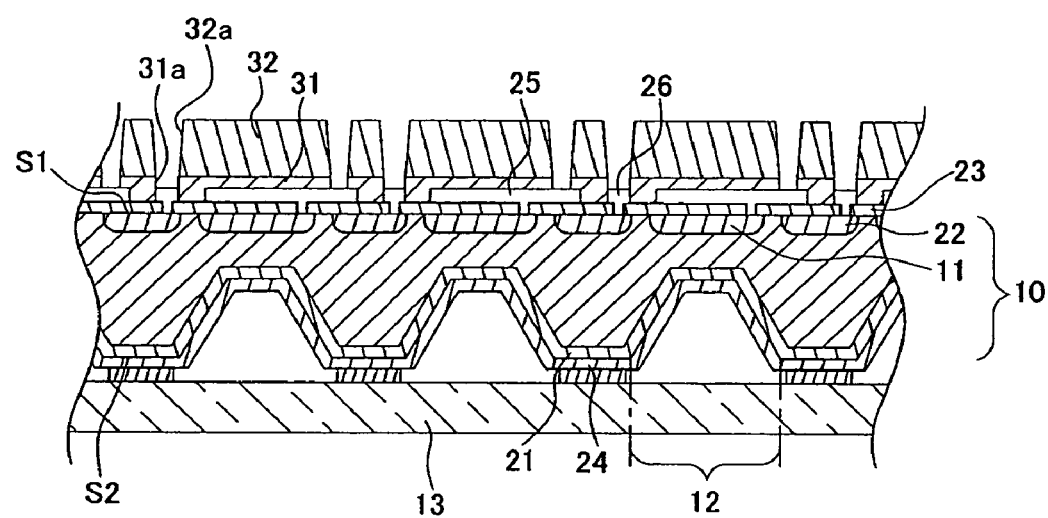
FIG. 41 is a step chart showing a method for manufacturing the back illuminated photodiode 4 shown in FIG. 35.

Next, contact holes are formed in the insulating film 23, and after aluminum is deposited on the upper surface S1, a predetermined pattern is made to form anode electrodes 25 and cathode electrodes 26 (FIG. 39). A passivating film 31 is deposited on the upper surface S1 of the N-type semiconductor substrate 10, on which the anode electrodes 25 and the cathode electrodes 26 are formed, by a plasma-CVD method. Also, through-holes 31a are formed in portions corresponding to bumps 35a and 35b within the passivating film 31 (FIG. 40). Further, a supporting film 32 is formed on the upper surface S1, and through-holes 32a are formed in the portions corresponding to the through-holes 31a in the passivating film 31 (FIG. 41).

Figure 42:
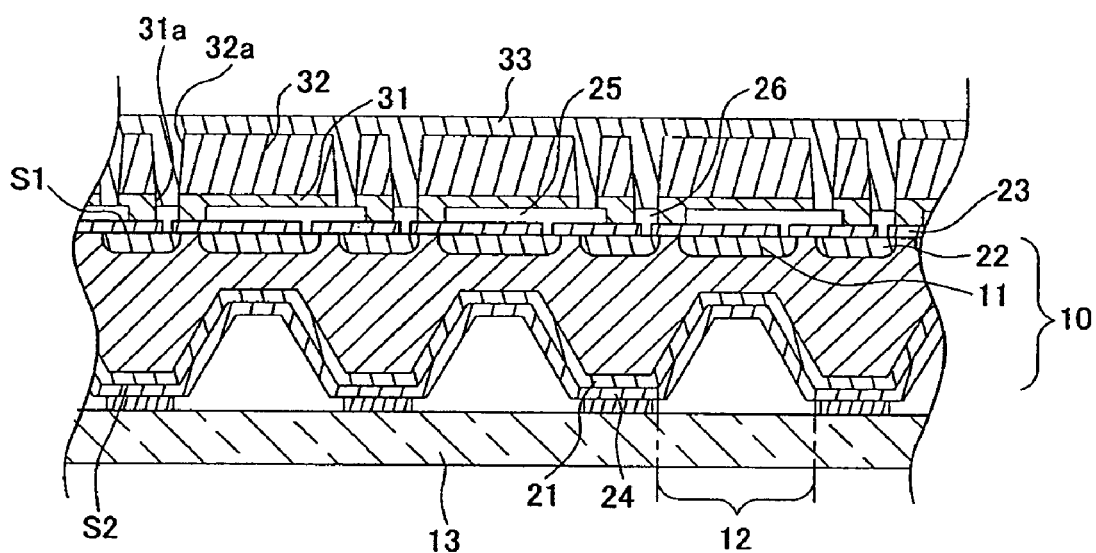
FIG. 42 is a step chart showing a method for manufacturing the back illuminated photodiode 4 shown in FIG. 35.
Figure 43:
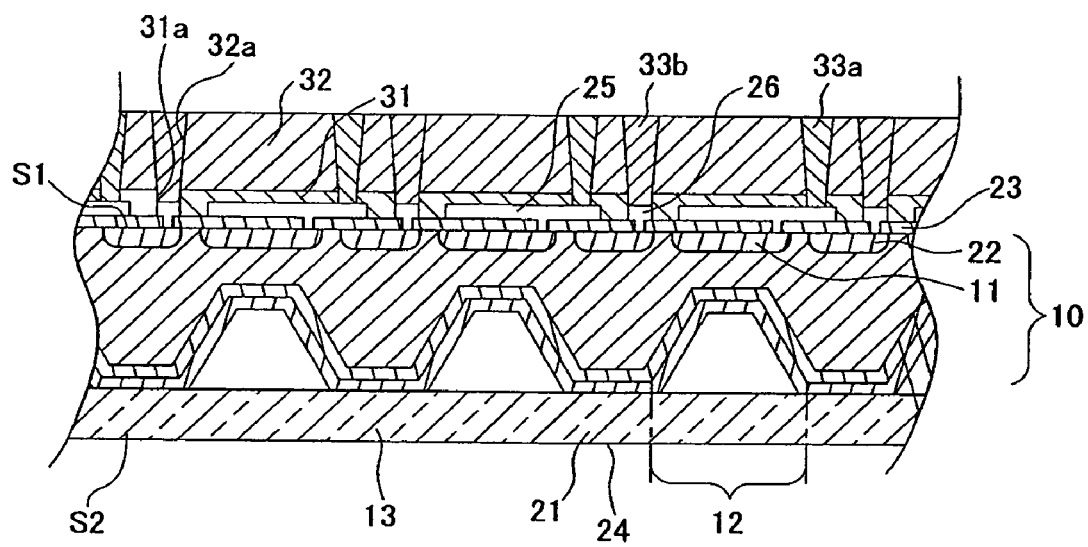
FIG. 43 is a step chart showing a method for manufacturing the back illuminated photodiode 4 shown in FIG. 35.
Figure 44:
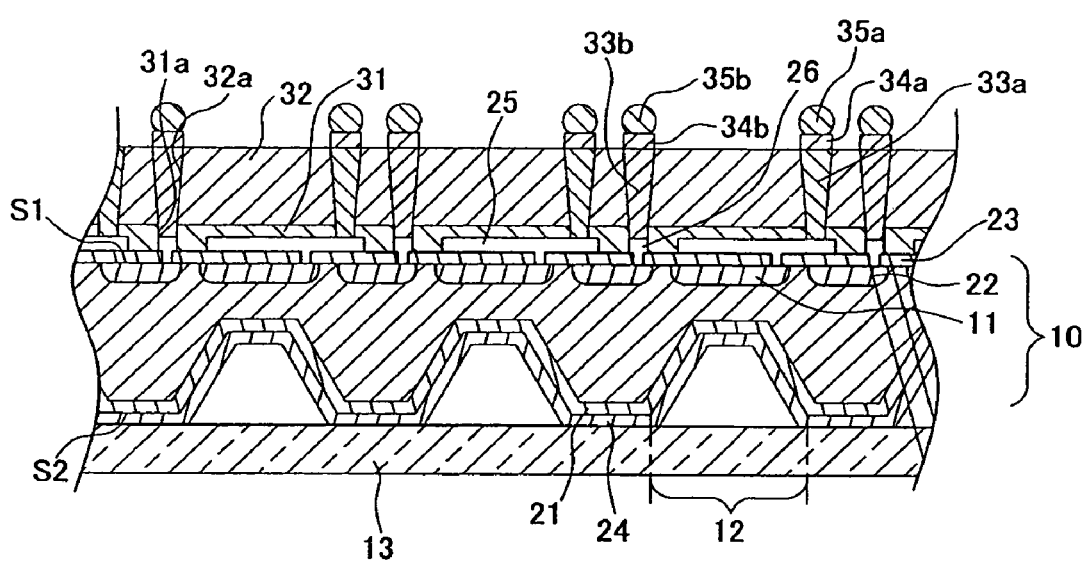
FIG. 44 is a step chart showing a method for manufacturing the back illuminated photodiode 4 shown in FIG. 35.

Next, a conductive material 33 is deposited on the upper surface S1 in such a manner as to fill the through-holes 31a and 32a. On the anode electrodes 25 and the cathode electrodes 26 are provided intermediate metals (not shown in the figure) for improving the bonding to the conductive material 33 (FIG. 42). Further, the surface of the conductive material 33 is polished to remove the conductive material 33 deposited on the supporting film 32. Thus, filling electrodes 33a and 33b are formed (FIG. 43). Additionally, instead of filling the through-holes, a thin film electrode (having a thickness of about 0.5 to 10 μm, for example, and preferably about 1 μm) may be formed in such a manner as to cover the sidewalls of the through-holes 31a and 32a, although not shown in the figure. In this case, it is possible to omit the polishing step. In addition, UBMs 34a and 34b are formed, respectively, on the filling electrodes 33a and 33b on the upper surface S1 by electroless plating. Further, bumps 35a and 35b are formed on the UBMs 34a and 34b by printing, a ball-mounting method, or a transfer method (FIG. 44).

Figure 45:
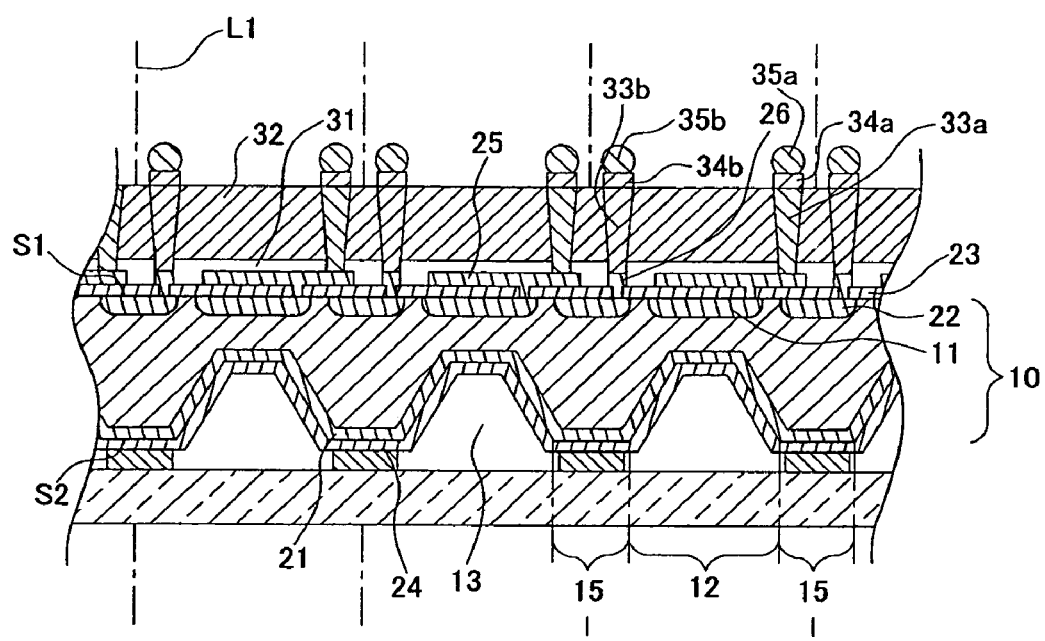
FIG. 45 is a step chart showing a method for manufacturing the back illuminated photodiode 4 shown in FIG. 35.
Figure 46:
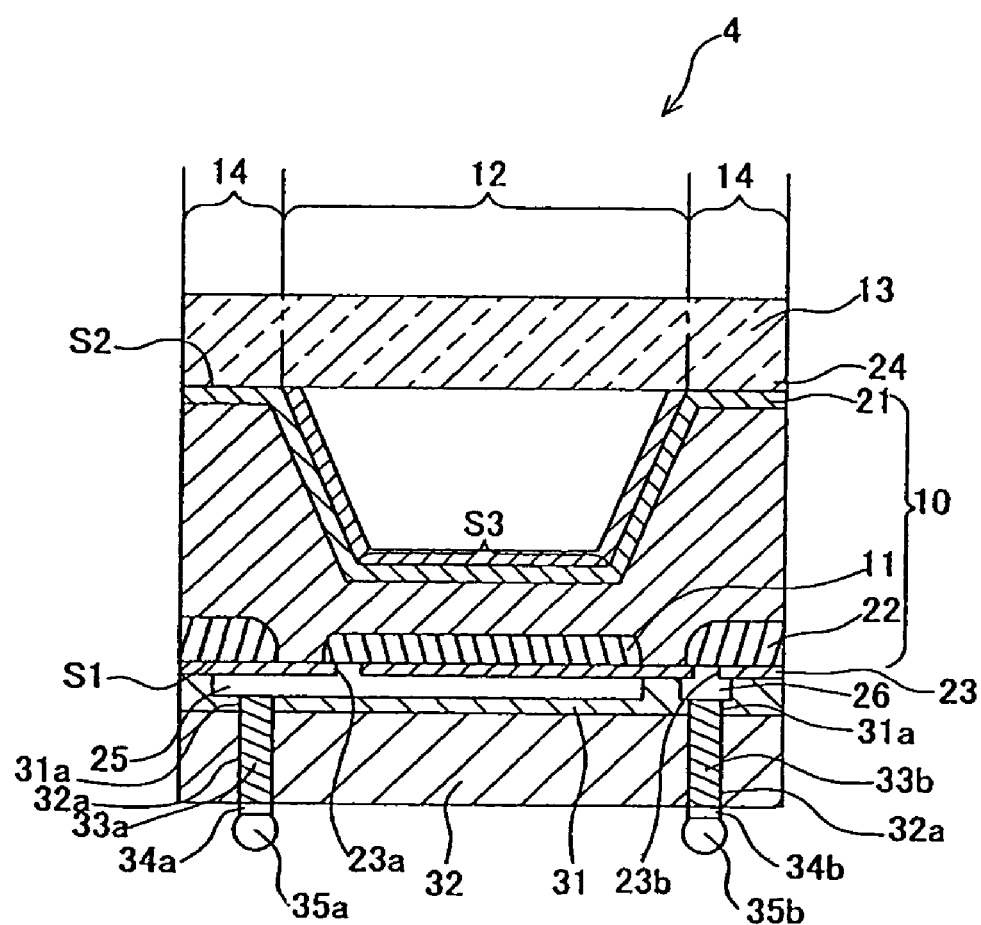
FIG. 46 is a step chart showing a method for manufacturing the back illuminated photodiode 4 shown in FIG. 35.

Finally, in order to obtain individually separated back illuminated photodiodes 4, dicing is performed along the alternate long and short dashed lines L1 shown in FIG. 45 (dicing step). Thus, the wafer shown in FIG. 45 is to be separated individually to obtain back illuminated photodiodes 4 (FIG. 46).

In accordance with the manufacturing method shown in FIG. 36 to FIG. 46, the window plate 13 is bonded to the outer edge portions 14 of the N-type semiconductor substrate 10 in the window plate bonding step (refer to FIG. 38). This eliminates the use of an external package such as a ceramic package, whereby it is possible to obtain a chip-sized back illuminated photodiode 4. In accordance with the present manufacturing method, it is therefore possible to achieve a back illuminated photodiode 4 having a sufficiently small package. Since this also eliminates the use of a step of packing a back illuminated photodiode 4 into a ceramic package, etc., the manufacturing process for the entire back illuminated photodiode 4 is simplified.

Further, the window plate 13 is bonded to the outer edge portion 14 by anodic bonding. This allows the window plate 13 and the outer edge portion 14 to be bonded solidly at the interface therebetween. In addition, the anodic bonding can seal the rear surface S2 of the N-type semiconductor substrate 10 hermetically, resulting in a further improvement in reliability for the back illuminated photodiode 4.

Also, since the insulating film 24 on the outer edge portions 14 is removed in the step shown in FIG. 37, the strength of the anodic bonding between the window plate 13 and the outer edge portions 14 is increased. Additionally, the insulating film 24 on the outer edge portions 14 shall not necessarily be removed, and that even if the insulating film 24 on the outer edge portions 14 may be formed, the window plate 13 can be bonded to the outer edge portions 14 by anodic bonding. However, in this case, the insulating film 24 on the outer edge portions 14 preferably has a small thickness (e.g. 0.1 μm or less).

In addition, in the case of performing anodic bonding under a dry inert gas atmosphere such as dry $N_2$ gas or under a vacuum atmosphere in the window plate bonding step, the areas between the recessed portions 12 and the window plate 13 are to be sealed with $N_2$ or evacuated. Therefore, the reliability for the back illuminated photodiode 4 will further be improved in this case.

FIG. 41 is a cross-sectional view showing a fifth embodiment of a back illuminated photodetector according to the present invention. The back illuminated photodiode 5 comprises an N-type semiconductor substrate 10, a $P^+$-type impurity semiconductor region 11, a recessed portion 12, and a window plate 13. In the surface layer on the upper surface S1 side of the N-type semiconductor substrate 10 is partially formed the $P^+$-type impurity semiconductor region 11. In the rear surface S2 of the N-type semiconductor substrate 10 and in an area opposite the $P^+$-type impurity semiconductor region 11 is formed the recessed portion 12. Also, the window plate 13 is bonded to the outer edge portion 14 of the recessed portion 12. In the present embodiment, the window plate 13 is made of quartz and is bonded to the outer edge portion 14 by anodic bonding. In addition, the window plate 13 and the outer edge portion 14 are bonded to each other via a Pyrex glass 16 provided therebetween. The Pyrex glass 16 contains alkali metal and is formed on the window plate 13. More specifically, the Pyrex glass 16 is formed preliminarily on the window plate 13 and at the position corresponding to the outer edge portion 14. The thickness of the Pyrex glass 16 is about 0.1 to 10 μm, for example. Additionally, the glass between the window plate 13 and the outer edge portion 14 is not restricted to Pyrex glass, but may be one containing alkali metal.

The back illuminated photodiode 5 also comprises an $N^+$-type highly-doped impurity semiconductor layer 21, an $N^+$-type highly-doped impurity semiconductor region 22, insulating films 23 and 24, an anode electrode 25, and a cathode electrode 26. The $N^+$-type highly-doped impurity semiconductor layer 21 is formed in the entire surface layer on the rear surface S2 side of the N-type semiconductor substrate 10. The $N^+$-type highly-doped impurity semiconductor region 22 is formed in the surface layer on the upper surface S1 side of the N-type semiconductor substrate 10 at a predetermined distance from the $P^+$-type impurity semiconductor region 11. The insulating films 23 and 24 are formed, respectively, on the upper surface S1 and the rear surface S2 of the N-type semiconductor substrate 10. In the insulating film 23 are formed openings 23a and 23b. On the insulating film 23 and in the areas including the openings 23a and 23b are formed, respectively, the anode electrode 25 and the cathode electrode 26.

The back illuminated photodiode 5 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 10 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 5 will here be described. In the back illuminated photodiode 5, the window plate 13 is bonded to the outer edge portion 14 of the N-type semiconductor substrate 10. This eliminates the use of an external package such as a ceramic package, whereby it is possible to obtain a chip-sized back illuminated photodiode 5. Accordingly, there is achieved a back illuminated photodiode 5 having a sufficiently small package.

Further, in the back illuminated photodiode 5, the surface of the window plate 13 functions as an incident plane for to-be-detected light Since the surface of the window plate 13 can be flattened more easily than resin, it is possible to suppress the scattering of to-be-detected light at the incident plane. There is thus achieved a back illuminated photodiode 5 capable of detecting light at a high sensitivity.

In addition, as a glass of the window plate 13 quartz is used. Quartz has a transmissivity for visible light especially higher than that of kovar glass or Pyrex, which contributes significantly to increasing the sensitivity of the back illuminated photodiode 5. Further, since quartz has a extremely high transmissivity also for UV light, the back illuminated photodiode 5 can detect light at a high sensitivity even in the case of UV light to be detected.

Also, providing a glass containing alkali metal between the window plate 13 and the outer edge portion 14 allows for favorable anodic bonding between the window plate 13 made of quartz not containing alkali metal and the outer edge portion 14. In addition, the anodic bonding can hermetically seal the rear surface S2 of the N-type semiconductor substrate 10, resulting in a further improvement in reliability for the back illuminated photodiode 5. Further, performing anodic bonding under a dry inert gas atmosphere such as dry nitrogen gas or under a vacuum atmosphere results in still a further improvement in reliability.

Figure 47:
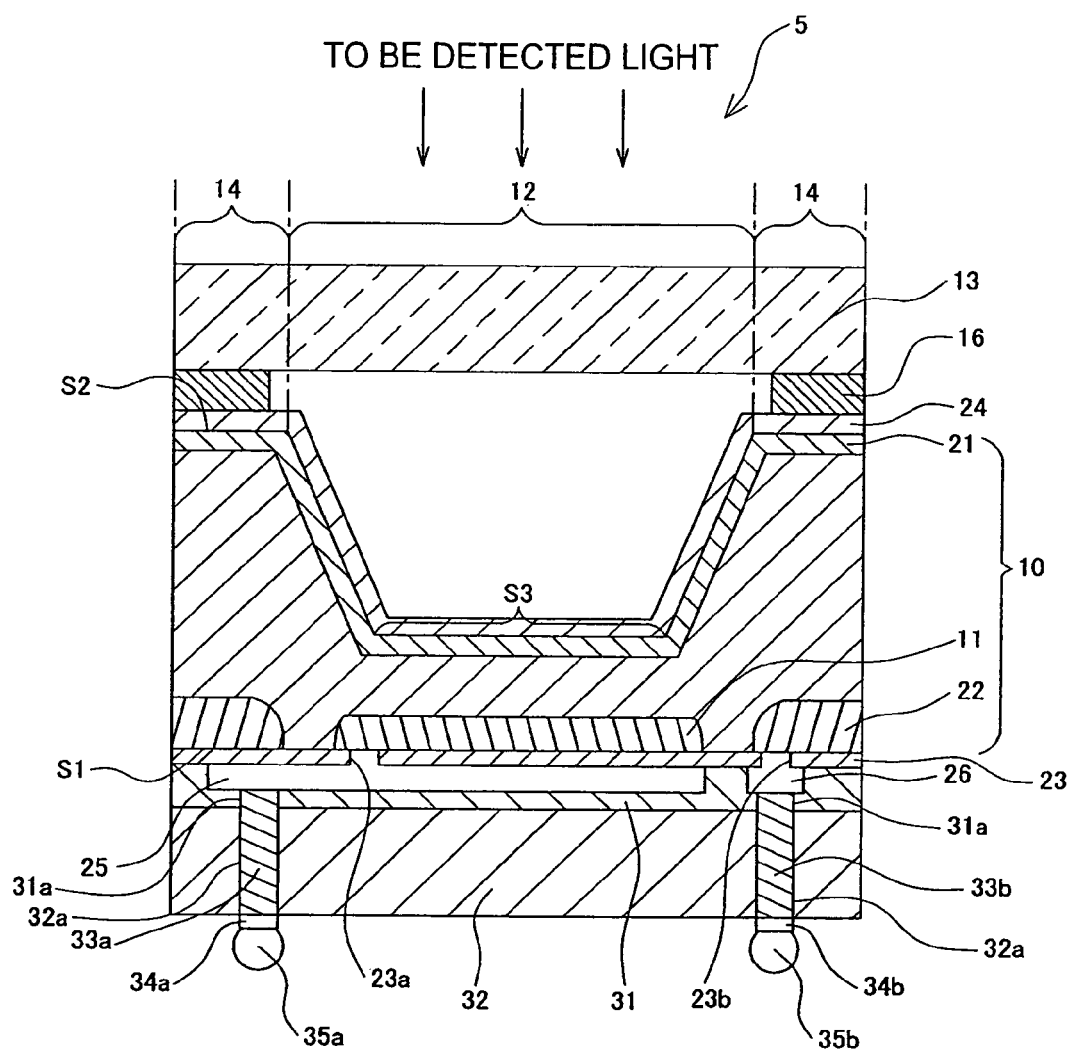
FIG. 47 is a cross-sectional view showing a fifth embodiment of a back illuminated photodetector according to the present invention.
Figure 48:
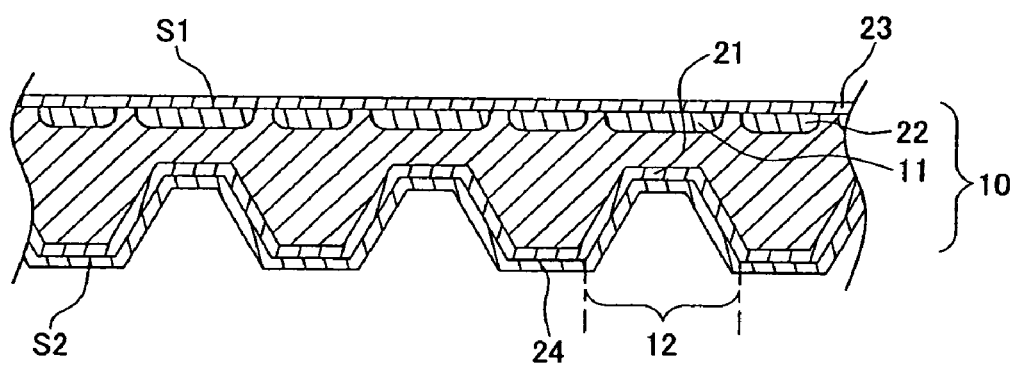
FIG. 48 is a step chart showing a method for manufacturing the back illuminated photodiode 5 shown in FIG. 47.

An exemplary method for manufacturing the back illuminated photodiode 5 shown in FIG. 47 will here be described with reference to FIG. 48 to FIG. 57. There is prepared an N-type semiconductor substrate 10. In the N-type semiconductor substrate 10 are then formed $N^+$-type highly-doped impurity semiconductor regions 22, $P^+$-type impurity semiconductor regions 11, and recessed portions 12, and on the upper surface S1 and the rear surface S2 are formed, respectively, insulating films 23 and 24. The steps so far are the same as the manufacturing method shown in FIG. 3 to FIG. 6, FIG. 7, and FIG. 8 (FIG. 48).

Figure 49:
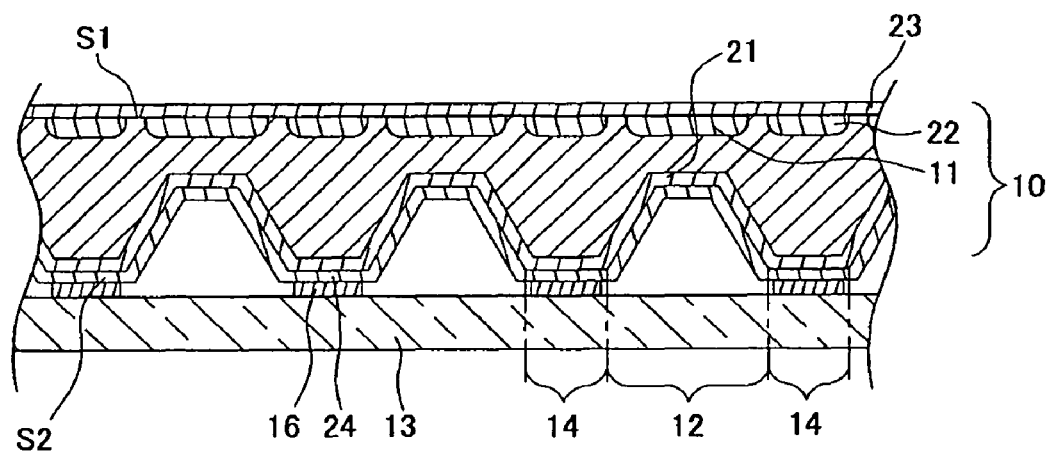
FIG. 49 is a step chart showing a method for manufacturing the back illuminated photodiode 5 shown in FIG. 47.
Figure 50:
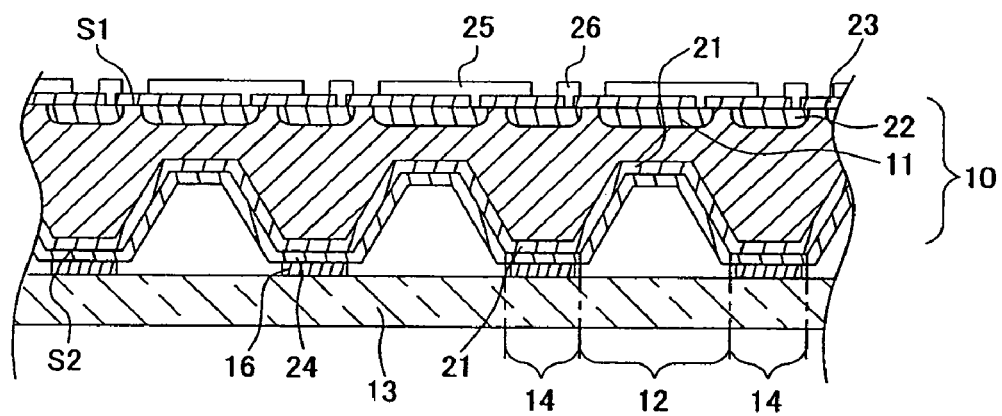
FIG. 50 is a step chart showing a method for manufacturing the back illuminated photodiode 5 shown in FIG. 47.

Next, while the window plate 13 made of quartz is in contact with the outer edge portions 14, the window plate 13 is bonded to the outer edge portions 14 by anodic bonding (window plate bonding step). The bonding is to be performed via Pyrex glasses 16 which are formed preliminarily by vapor deposition or sputtering, etc., at the positions within the window plate 13 corresponding to the outer edge portions 14. In order to form the Pyrex glasses 16 only at the positions within the window plate 13 corresponding to the outer edge portions 14, after forming a Pyrex glass 16 on the entire window plate 13, it is only required to perform patterning so that only the Pyrex glass 16 formed at the positions within the window plate 13 corresponding to the outer edge portions 14 remains (FIG. 49). Additionally, instead of vapor deposition or sputtering, the Pyrex glasses 16 for connecting the window plate 13 and the outer edge portions 14 may be achieved by preparing a plate-like glass formed preliminarily in a shape corresponding to the outer edge portions 14, and then providing it between the window plate 13 and the outer edge portions 14. Also, after aluminum is deposited on the upper surface S1, a predetermined pattern is made to form anode electrodes 25 and cathode electrodes 26 (FIG. 50).

Figure 51:
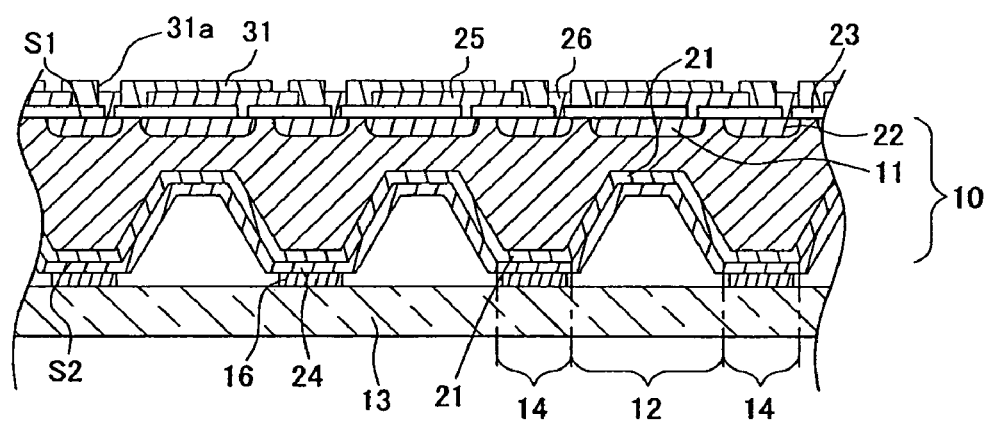
FIG. 51 is a step chart showing a method for manufacturing the back illuminated photodiode 5 shown in FIG. 47.
Figure 52:
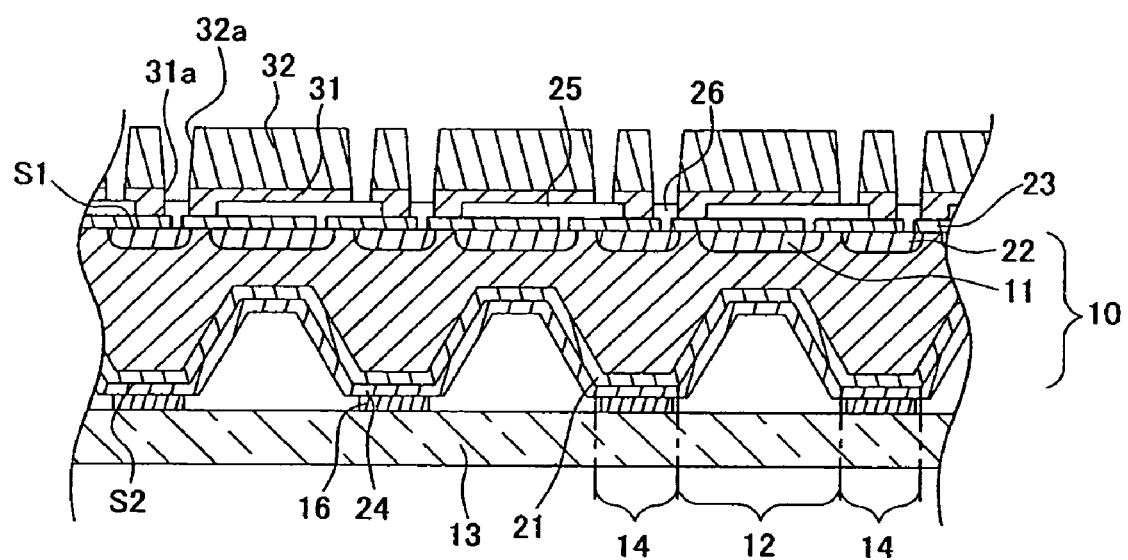
FIG. 52 is a step chart showing a method for manufacturing the back illuminated photodiode 5 shown in FIG. 47.
Figure 53:
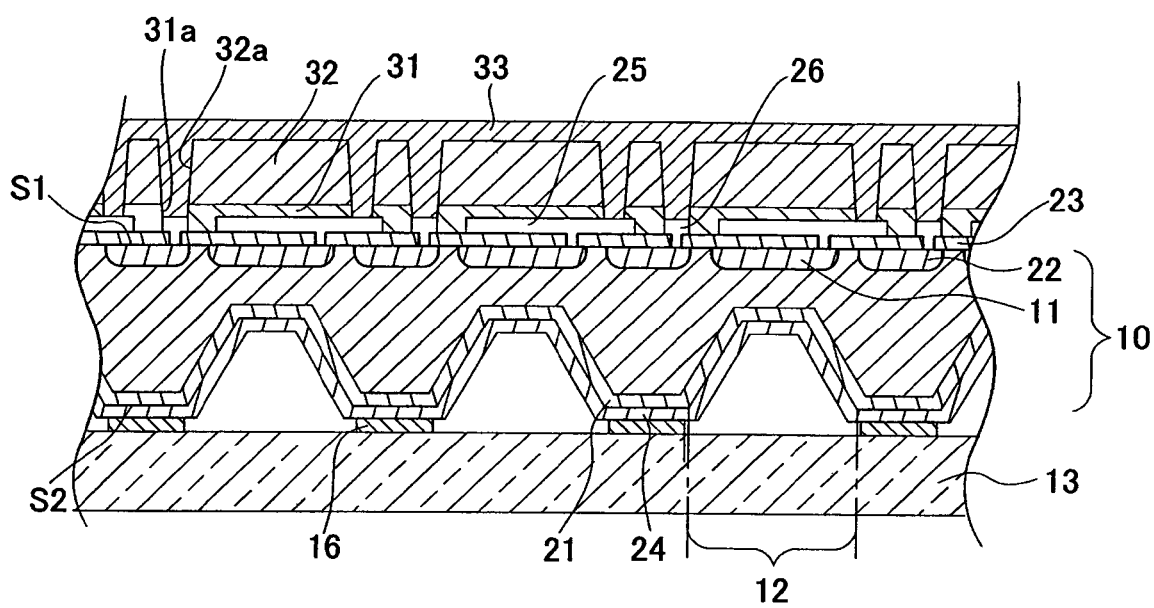
FIG. 53 is a step chart showing a method for manufacturing the back illuminated photodiode 5 shown in FIG. 47.

Next, a passivating film 31 is deposited on the upper surface S1 of the N-type semiconductor substrate 10, on which the anode electrodes 25 and the cathode electrodes 26 are formed, by a plasma-CVD method or the like. Also, through-holes 31a are formed in portions corresponding to bumps 35a and 35b within the passivating film 31 (FIG. 51). Further, a supporting film 32 is formed on the upper surface S1, and through-holes 32a are formed in the portions corresponding to the through-holes 31a in the passivating film 31 (FIG. 52). Also, a conductive material 33 is deposited on the upper surface S1 in such a manner as to fill the through-holes 31a and 32a On the anode electrodes 25 and the cathode electrodes 26 are provided intermediate metals (not shown in the figure) for improving the bonding to the conductive material 33 (FIG. 53).

Figure 54:
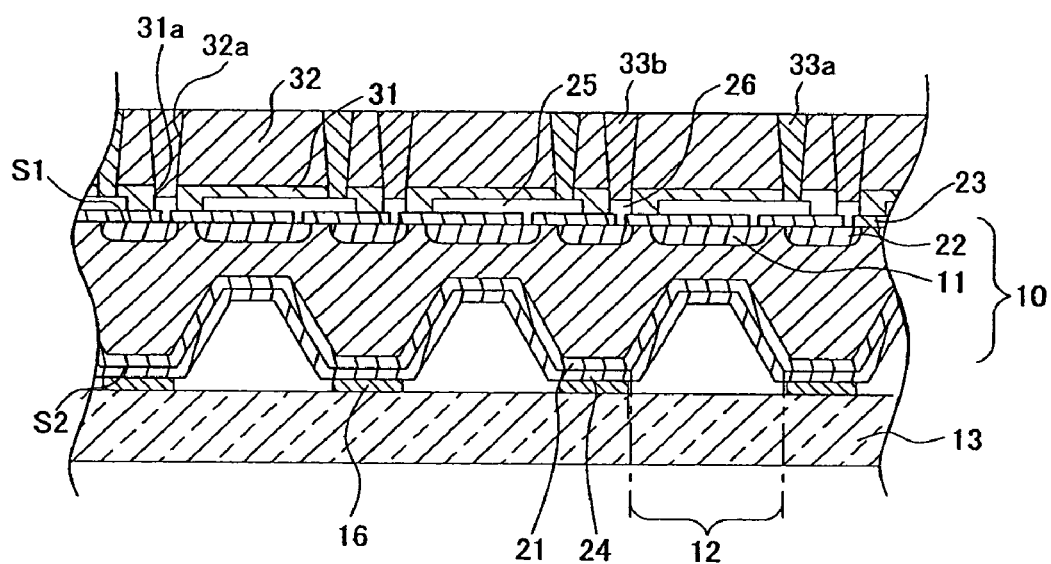
FIG. 54 is a step chart showing a method for manufacturing the back illuminated photodiode 5 shown in FIG. 47.
Figure 55:
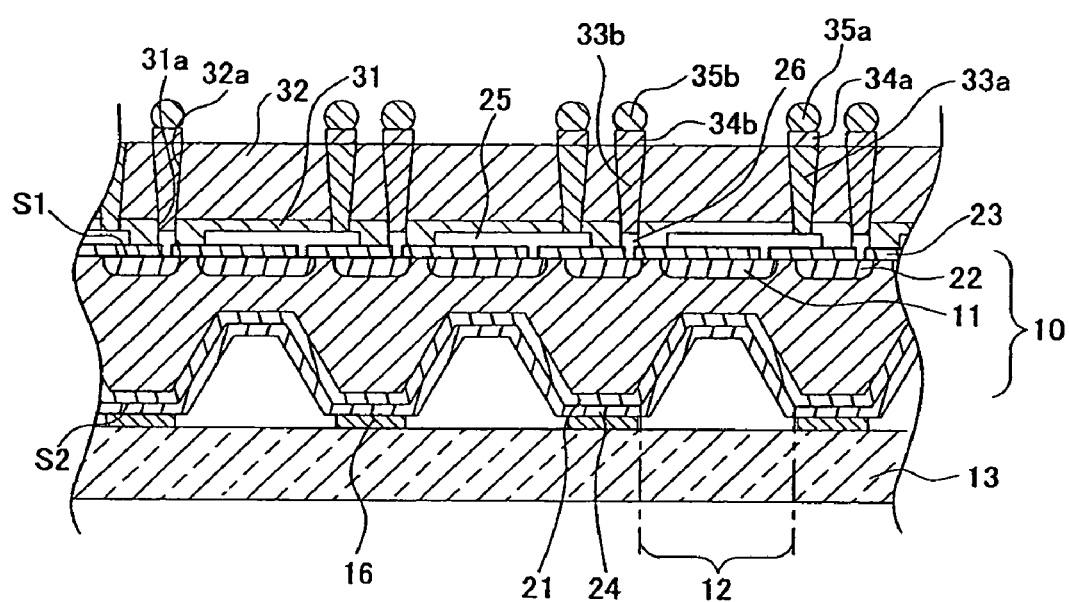
FIG. 55 is a step chart showing a method for manufacturing the back illuminated photodiode 5 shown in FIG. 47.

Next, the surface of the conductive material 33 is polished to remove the conductive material 33 deposited on the supporting film 32. Thus, filling electrodes 33a and 33b are formed (FIG. 54). Additionally, instead of filling the through holes, a thin film electrode (having a thickness of about 0.5 to 10 µm, for example, and preferably about 1 µm) may be formed in such a manner as to cover the sidewalls of the through-holes 31a and 32a, although not shown in the figure. In this case, it is possible to omit the polishing step. In addition, UBMs 34a and 34b are formed, respectively, on the filling electrodes 33a and 33b on the upper surface S1 by electroless plating. Further, bumps 35a and 35b are formed on the UBMs 34a and 34b by printing or a ball-mounting method (FIG. 55).

Figure 56:
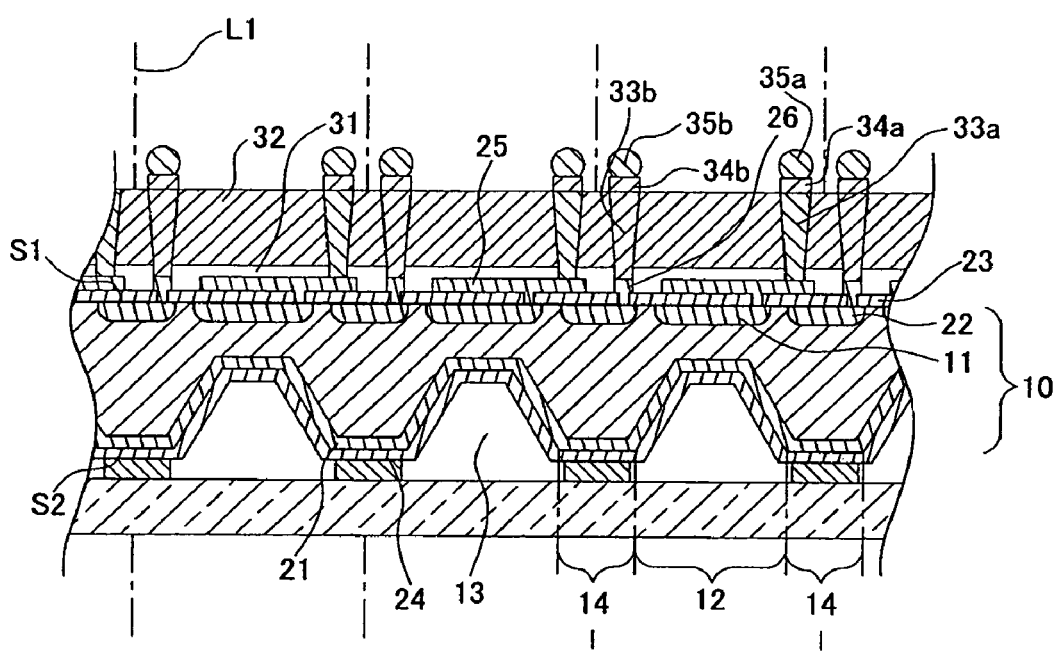
FIG. 56 is a step chart showing a method for manufacturing the back illuminated photodiode 5 shown in FIG. 47.
Figure 57:
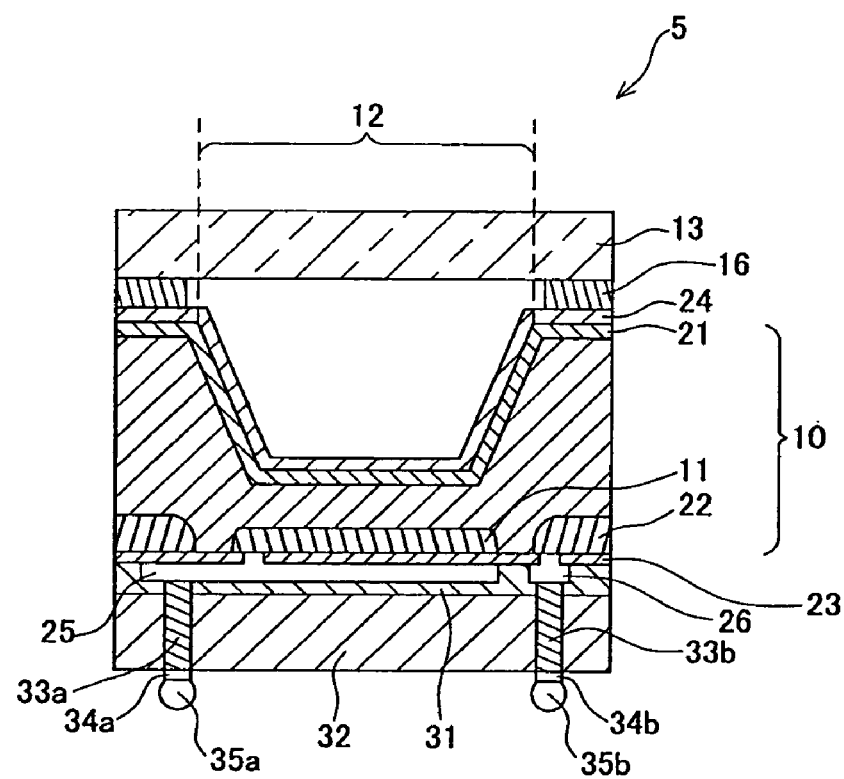
FIG. 57 is a step chart showing a method for manufacturing the back illuminated photodiode 5 shown in FIG. 47.

Finally, in order to obtain individually separated back illuminated photodiodes 5, dicing is performed along the alternate long and short dashed lines L1 shown in FIG. 56 (dicing step). Thus, the wafer shown in FIG. 56 is to be separated individually to obtain back illuminated photodiodes 5 (FIG. 57).

In accordance with the manufacturing method shown in FIG. 48 to FIG. 57, the window plate 13 is bonded to the outer edge portions 14 of the N-type semiconductor substrate 10 in the window plate bonding step (refer to FIG. 49). This eliminates the use of an external package such as a ceramic package, whereby it is possible to obtain a chip-sized back illuminated photodiode 5. In accordance with the present manufacturing method, it is therefore possible to achieve a back illuminated photodiode 5 having a sufficiently small package. Since this also eliminates the use of a step of packing a back illuminated photodiode 5 into a ceramic package, etc., the manufacturing process for the entire back illuminated photodiode 5 is simplified.

In addition, as a glass of the window plate 13 quartz is used. Quartz has a transmissivity for visible light especially higher than that of kovar glass or Pyrex, which significantly contributes to increasing the sensitivity of the back illuminated photodiode 5. Further, since quartz has an extremely high transmissivity also for the wavelength of UV light, it is possible, in accordance with the present manufacturing method, to obtain a back illuminated photodiode 5 capable of detecting light at a high sensitivity even in the case of UV light to be detected.

Also, providing a glass containing alkali metal between the window plate 13 and the outer edge portion 14 allows for favorable anodic bonding between the window plate 13 made of quartz not containing alkali metal and the outer edge portion 14. In addition, providing a metal layer between the window plate 13 and the outer edge portion 14 instead of a glass containing alkali metal may allow the same effect to be achieved.

Figure 58:
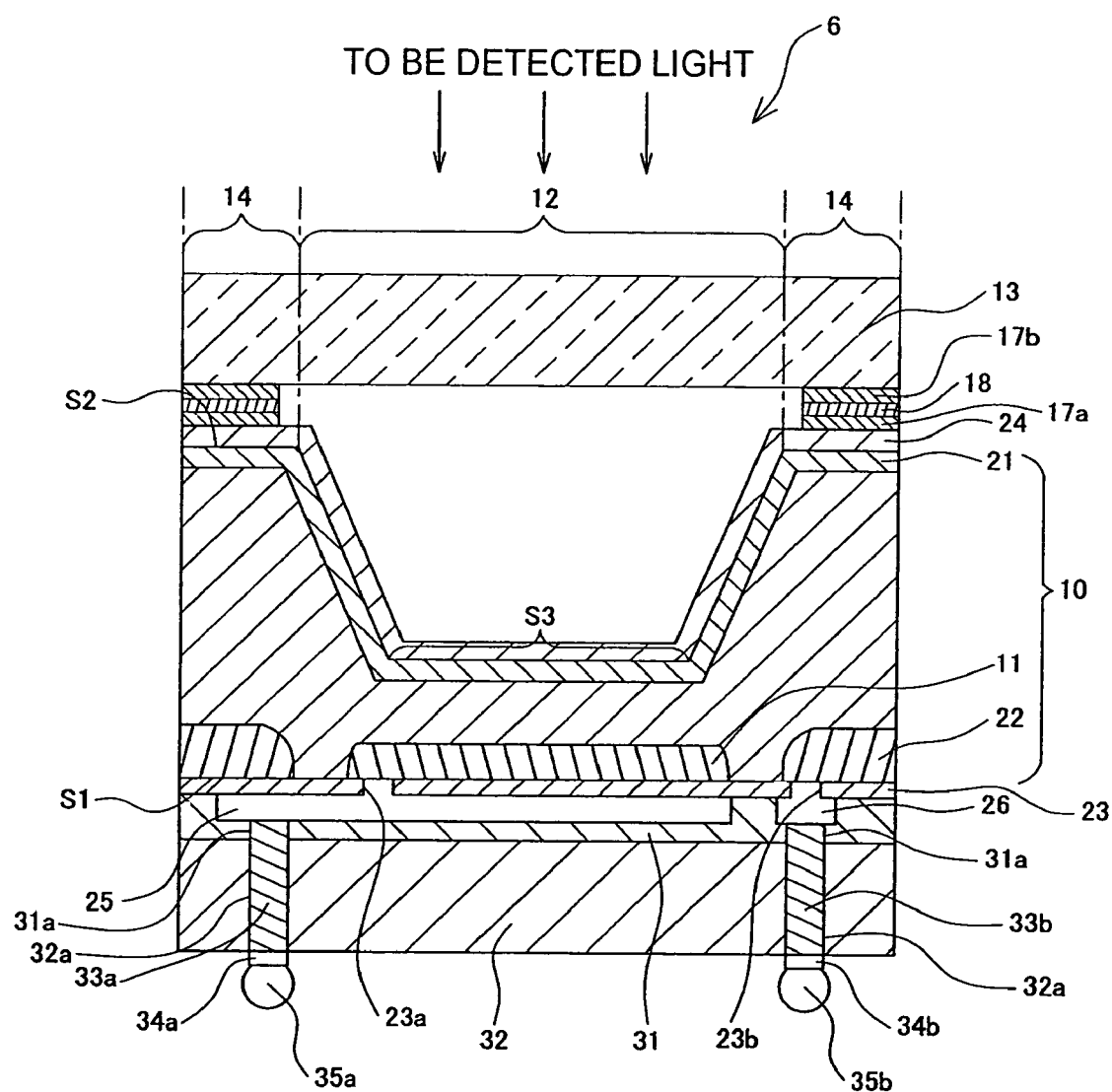
FIG 58 is a cross-sectional view showing a sixth embodiment of a back illuminated photodetector according to the present invention.

FIG. 58 is a cross-sectional view showing a sixth embodiment of a back illuminated photodetector according to the present invention. The back illuminated photodiode 6 comprises an N-type semiconductor substrate 10, a $P^+$-type impurity semiconductor region 11, a recessed portion 12, and a window plate 13. In the surface layer on the upper surface S1 side of the N-type semiconductor substrate 10 is partially formed the $P^+$-type impurity semiconductor region 11. In the rear surface S2 of the N-type semiconductor substrate 10 and in an area opposite the $P^+$-type impurity semiconductor region 11 is formed the recessed portion 12. Also, the window plate 13 is bonded to the outer edge portion 14 of the recessed portion 12. In the present embodiment, the bonding between the window plate 13 and the outer edge portion 14 is preformed via metal layers 17a, 17b and an intermediate metal layer 18. That is, between the window plate 13 and the outer edge portion 14 are provided the metal layer 17a, intermediate metal layer 18, and metal layer 17b in this order from the outer edge portion 14 side. As a metal of the metal layers 17a and 17b, for example, Al, Cu, Au, Ni, Ti, Pt, W, In, Sn, etc., or an laminated film or alloy of some of these metals can be used. Also, as a metal of the intermediate metal layer 18, for example, a metal solder made of Sn, SnPb, SnAg, AuSn, Al or In, etc., can be used.

The back illuminated photodiode 6 also comprises an $N^+$-type highly-doped impurity semiconductor layer 21, an $N^+$-type highly-doped impurity semiconductor region 22, insulating films 23 and 24, an anode electrode 25, and a cathode electrode 26. The $N^+$-type highly-doped impurity semiconductor layer 21 is formed in the entire surface layer on the rear surface S2 side of the N-type semiconductor substrate 10. The $N^+$-type highly-doped impurity semiconductor region 22 is formed in the surface layer on the upper surface S1 side of the N-type semiconductor substrate 10 at a predetermined distance from the $P^+$-type impurity semiconductor region 11. The insulating films 23 and 24 are formed, respectively, on the upper surface S1 and the rear surface S2 of the N-type semiconductor substrate 10. In the insulating film 23 are formed openings 23a and 23b. On the insulating film 23 and in the areas including the openings 23a and 23b are formed, respectively, the anode electrode 25 and the cathode electrode 26.

The back illuminated photodiode 6 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 10 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 6 will here be described. In the back illuminated photodiode 6, the window plate 13 is bonded to the outer edge portion 14 of the N-type semiconductor substrate 10. This eliminates the use of an external package such as a ceramic package, whereby it is possible to obtain a chip-sized back illuminated photodiode 6. Accordingly, there is achieved a back illuminated photodiode 6 having a sufficiently small package.

Further, in the back illuminated photodiode 6, the surface of the window plate 13 functions as an incident plane for to-be-detected light Since the surface of the window plate 13 can be flattened more easily than resin, it is possible to suppress the scattering of to-be-detected light at the incident plane. There is thus achieved a back illuminated photodiode 6 capable of detecting light at a high sensitivity.

In addition, between the window plate and the outer edge portion 14 are provided the metal layers 17a, 17b and the intermediate metal layer 18. This allows the window plate 13 and the outer edge portion 14 to be bonded solidly by metal bonding. In addition, the metal bonding can hermetically seal the rear surface S2 of the N-type semiconductor substrate 10, resulting in a further improvement in reliability for the back illuminated photodiode 6. Further, performing metal bonding under a dry inert gas atmosphere such as dry nitrogen gas or under a vacuum atmosphere results in still a further improvement in reliability. Additionally, the metal layers 17a and 17b may be bonded directly to each other without providing an intermediate metal layer 18.

Since the window plate 13 is bonded to the outer edge portion 14 by metal bonding, the back illuminated photodiode 6 can suitably be used also in the case of UV light to be detected.

Figure 59:
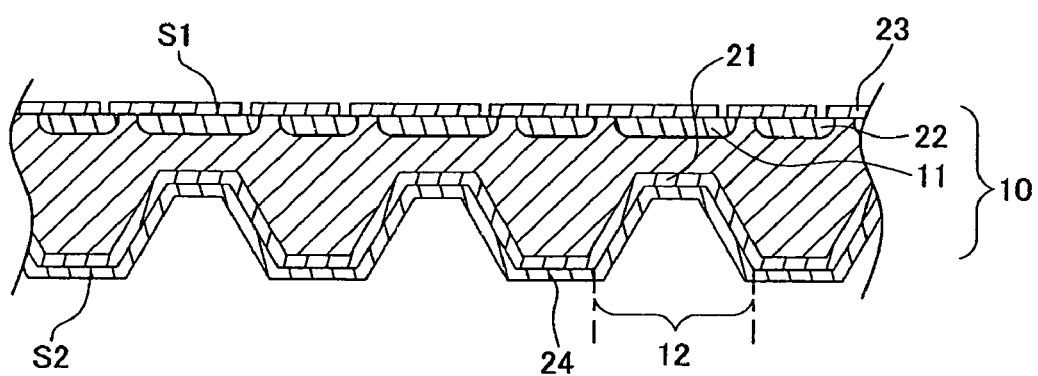
FIG. 59 is a step chart showing a method for manufacturing the back illuminated photodiode 6 shown in FIG. 58.
Figure 60:
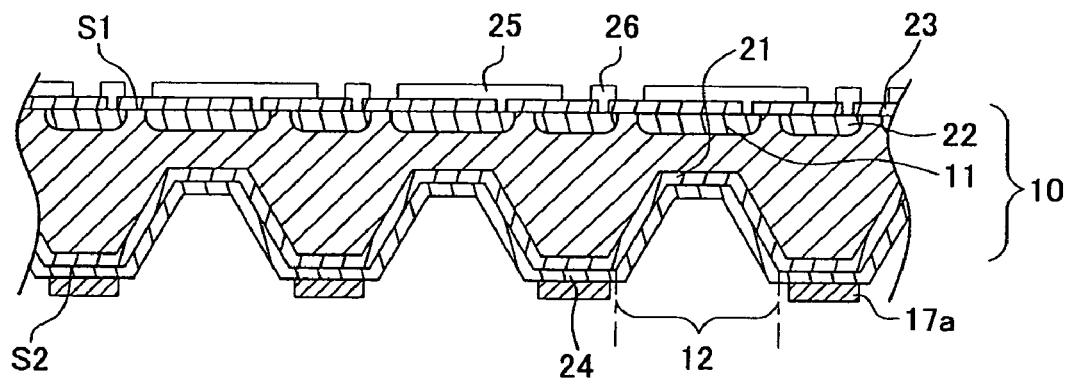
FIG. 60 is a step chart showing a method for manufacturing the back illuminated photodiode 6 shown in FIG. 58.
Figure 61:
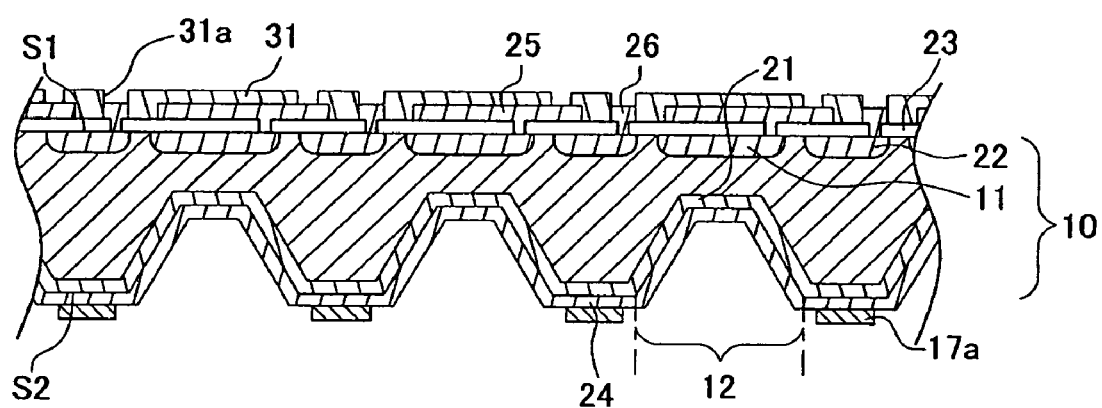
FIG. 61 is a step chart showing a method for manufacturing the back illuminated photodiode 6 shown in FIG. 58.

An exemplary method for manufacturing the back illuminated photodiode 6 shown in FIG. 58 will here be described with reference to FIG. 59 to FIG. 68. There is prepared an N-type semiconductor substrate 10. In the N-type semiconductor substrate 10 are then formed $N^+$-type highly-doped impurity semiconductor regions 22, $P^+$-type impurity semiconductor regions 11, and recessed portions 12, and on the upper surface S1 and the rear surface S2 are formed, respectively, insulating films 23 and 24. The steps so far are the same as the manufacturing method shown in FIG. 3 to FIG. 6, FIG. 7, and FIG. 8. Contact holes for electrodes are also formed in the insulating film 23 (FIG. 59). Next, after aluminum is deposited on the upper surface S1, a predetermined pattern is made to form anode electrodes 25 and cathode electrodes 26. On the outer edge portions 14 are further formed metal layers 17a (FIG. 60). In addition, a passivating film 31 is deposited on the upper surface S1 of the N-type semiconductor substrate 10, on which the anode electrodes 25 and the cathode electrodes 26 are formed, by a plasma-CVD method or the like. Also, through-holes 31a are formed in portions corresponding to bumps 35a and 35b within the passivating film 31 (FIG. 61). Additionally, the metal layers 17a may be formed after the passivating film 31.

Figure 62:
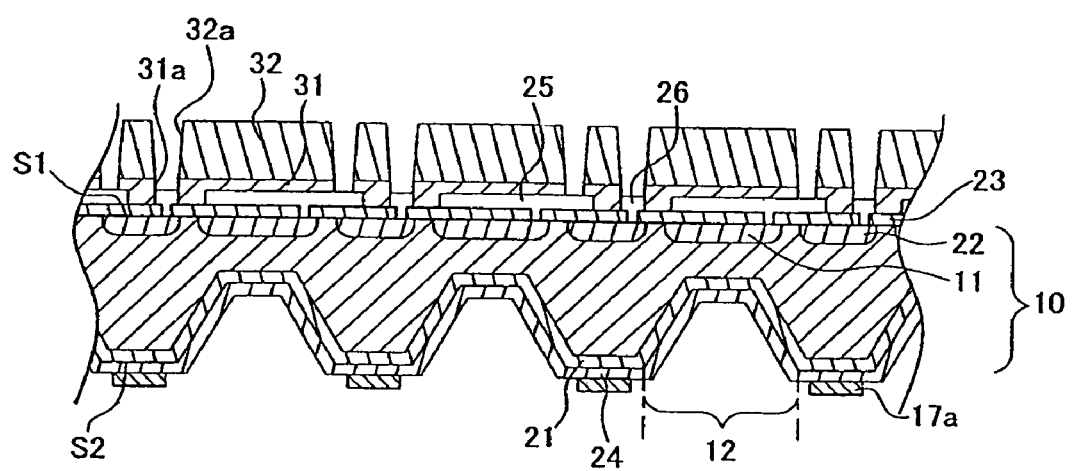
FIG. 62 is a step chart showing a method for manufacturing the back illuminated photodiode 6 shown in FIG. 58.
Figure 63:
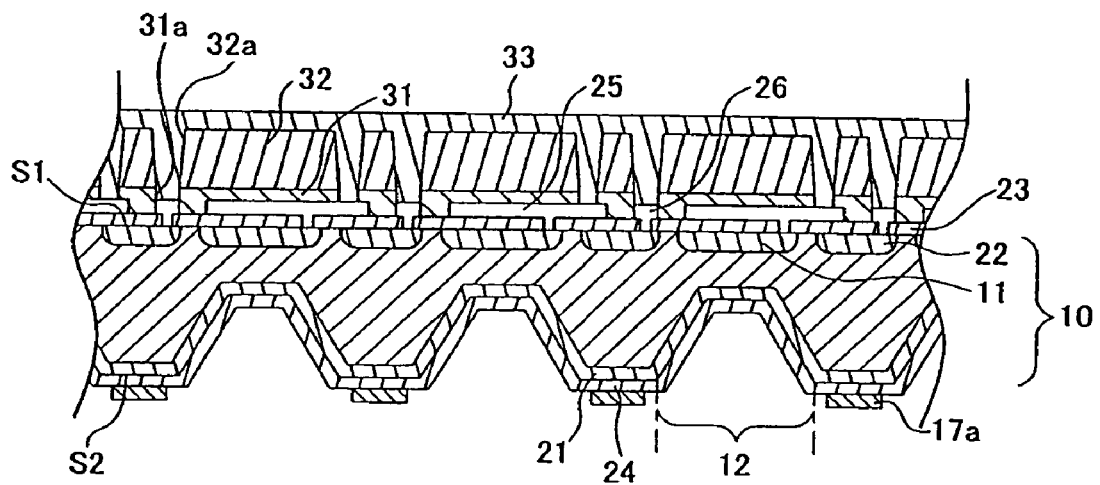
FIG. 63 is a step chart showing a method for manufacturing the back illuminated photodiode 6 shown in FIG. 58.
Figure 64:
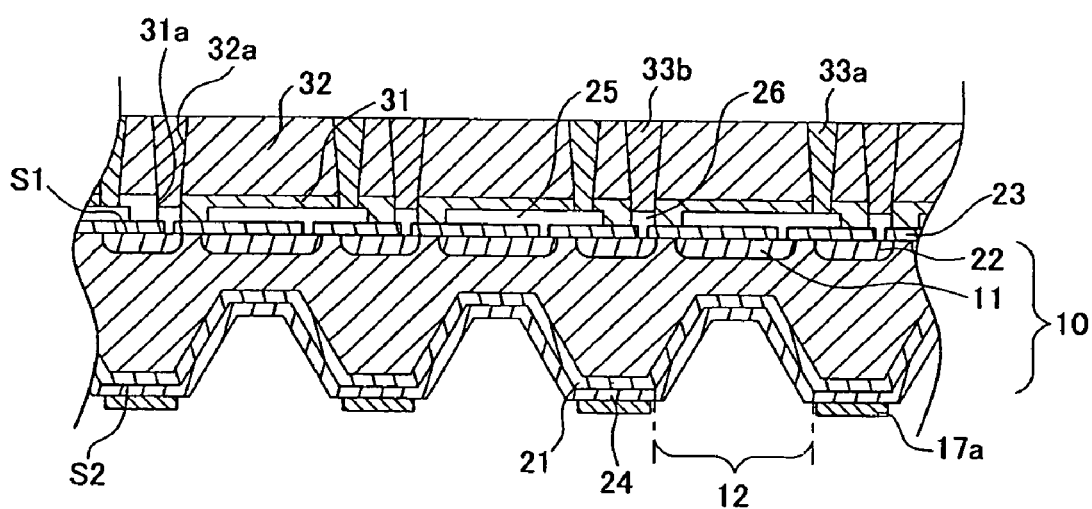
FIG. 64 is a step chart showing a method for manufacturing the back illuminated photodiode 6 shown in FIG. 58.

Next, a supporting film 32 is formed on the upper surface S1, and through-holes 32a are formed in the portions corresponding to the through-holes 31a in the passivating film 31 (FIG. 62). Also, a conductive material 33 is deposited on the upper surface S1 in such a manner as to fill the through-holes 31a and 32a. On the anode electrodes 25 and the cathode electrodes 26 are provided intermediate metals (not shown in the figure) for improving the bonding to the conductive material 33 (FIG. 63). Further, the surface of the conductive material 33 is polished to remove the conductive material 33 deposited on the supporting film 32. Thus, filling electrodes 33a and 33b are formed (FIG. 64). Additionally, instead of filling the through-holes, a thin film electrode (having a thickness of about 0.5 to 10 μm, for example, and preferably about 1 μm) may be formed in such a manner as to cover the sidewalls of the through-holes 31a and 32a, although not shown in the figure. In this case, it is possible to omit the polishing step.

Figure 65:
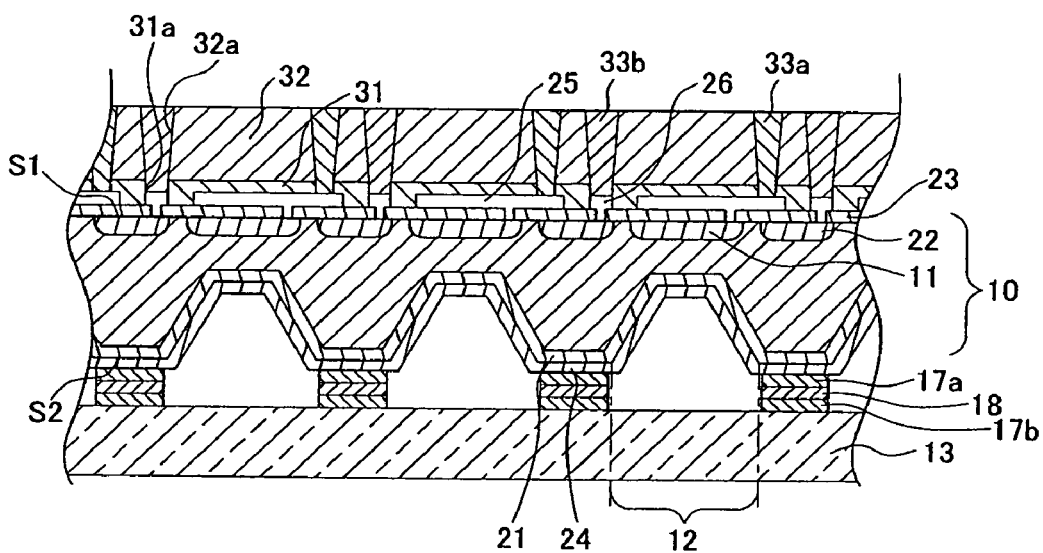
FIG. 65 is a step chart showing a method for manufacturing the back illuminated photodiode 6 shown in FIG. 58.
Figure 66:
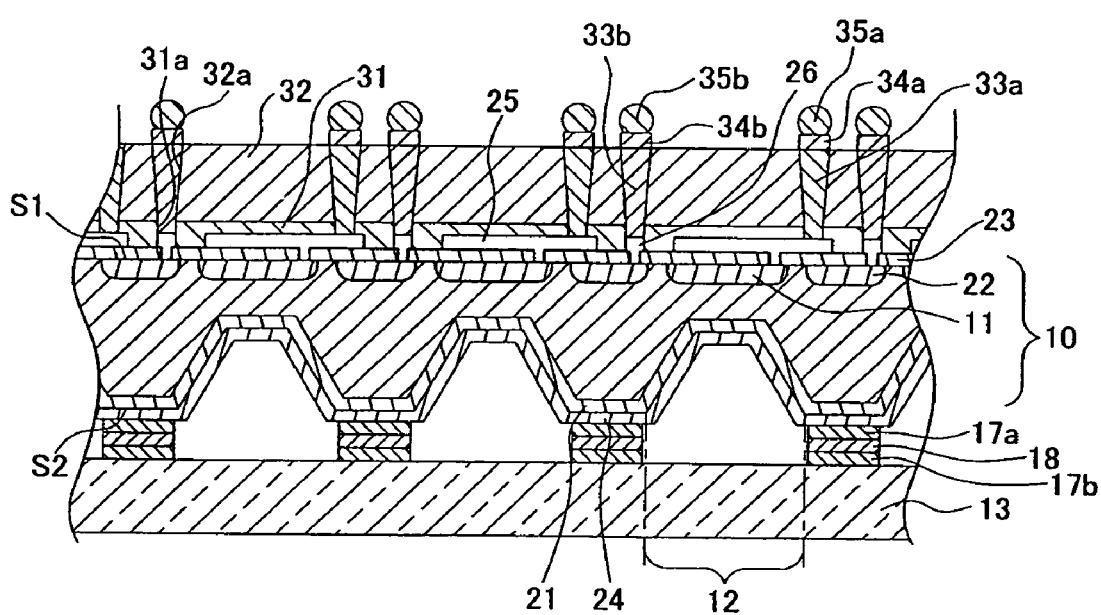
FIG. 66 is a step chart showing a method for manufacturing the back illuminated photodiode 6 shown in FIG. 58.

Next, while the window plate 13 is in contact with the outer edge portions 14 with the metal layers 17a formed thereon, the window plate 13 is bonded to the outer edge portions 14 (window plate bonding step). The bonding is to be performed by preliminarily forming metal layers 17b at the positions within the window plate 13 corresponding to the outer edge portions 14, and then by metal bonding the metal layers 17a on the outer edge portions 14 and the metal layers 17b on the window plate 13 to each other via intermediate metal layers 18. Additionally, the metal bonding is preferably performed under a dry inert gas -atmosphere such as dry $N_2$ gas or under a vacuum atmosphere (FIG. 65). In addition, UBMs 34a and 34b are formed on the filling electrodes 33a and 33b on the upper surface S1 by electroless plating. Further, bumps 35a and 35b are formed on-the UBMs 34a and 34b by printing or a ball-mounting method, etc. (FIG. 66).

Figure 67:
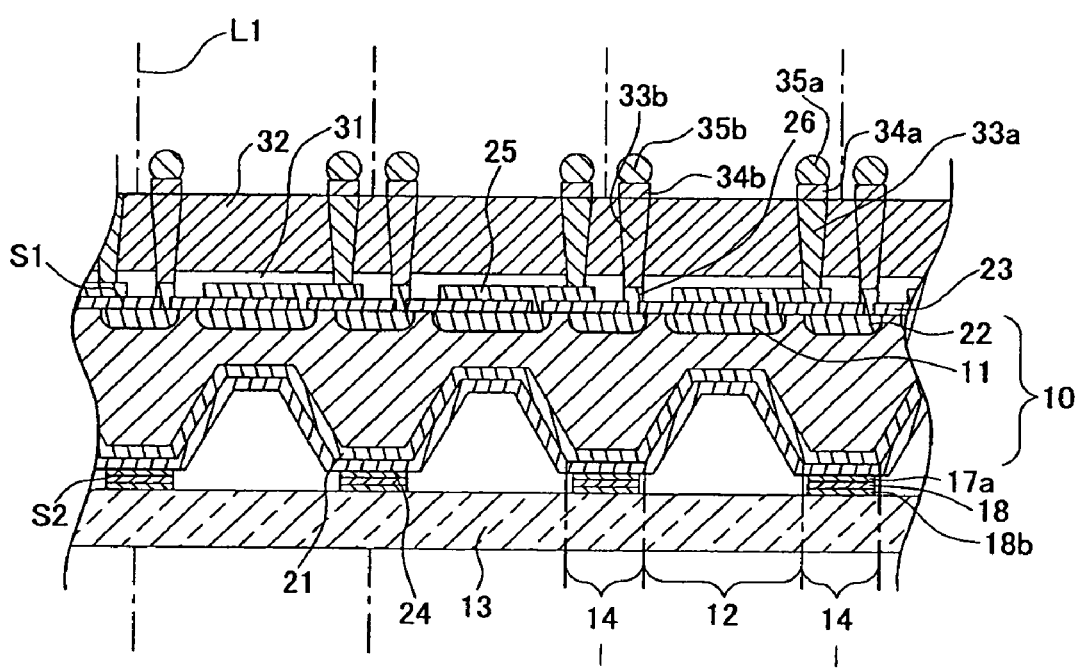
FIG. 67 is a step chart showing a method for manufacturing the back illuminated photodiode 6 shown in FIG. 58.
Figure 68:
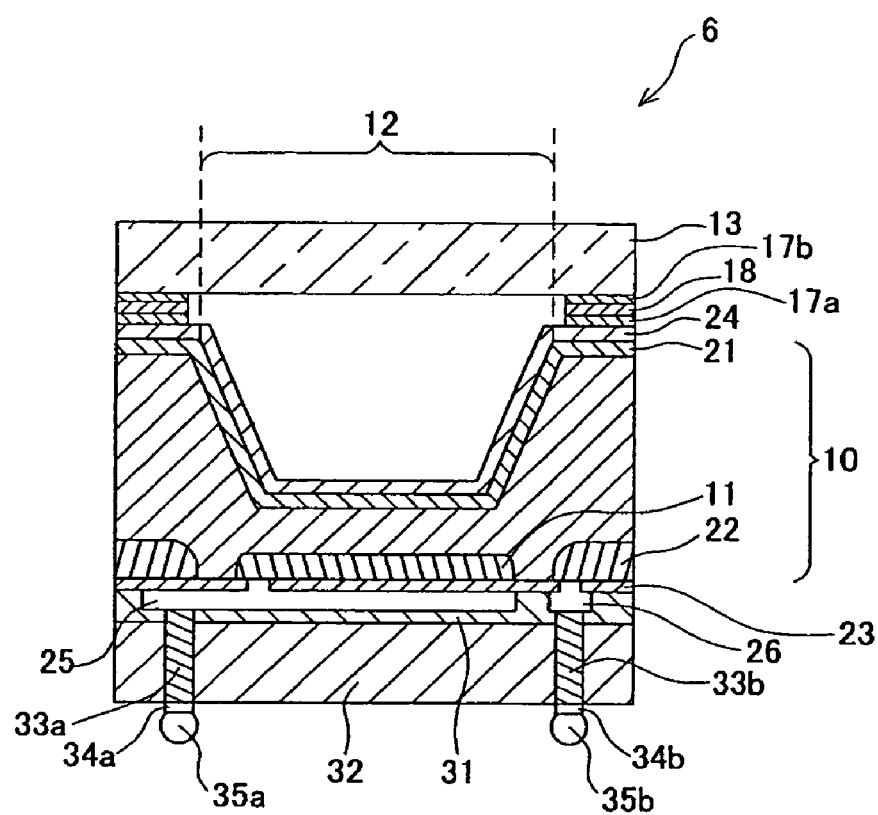
FIG. 68 is a step chart showing a method for manufacturing the back illuminated photodiode 6 shown in FIG. 58.

Finally, in order to obtain individually separated back illuminated photodiodes 6, dicing is performed along the alternate long and short dashed lines L1 shown in FIG. 67 (dicing step). Thus, the wafer shown in FIG. 67 is to be separated individually to obtain back illuminated photodiodes 6 (FIG. 68).

In accordance with the manufacturing method shown in FIG. 59 to FIG. 68, the window plate 13 is bonded to the outer edge portions 14 of the N-type semiconductor substrate 10 in the window plate bonding step (refer to FIG. 65). This eliminates the use of an external package such as a ceramic package, whereby it is possible to obtain a chip-sized back illuminated photodiode 6. In accordance with the present manufacturing method, it is therefore possible to achieve a back illuminated photodiode 6 having a sufficiently small package. Since this also eliminates the use of a step of packing a back illuminated photodiode 6 into a ceramic package, etc., the manufacturing process for the entire back illuminated photodiode 6 is simplified.

Further, the window plate 13 is bonded to the outer edge portion 14 via the metal layers 17a and 17b, which are formed, respectively, on the outer edge portion 14 and the window plate 13. This allows the window plate 13 and the outer edge portion 14 to be bonded solidly by metal bonding. In addition, the metal bonding can hermetically seal the rear surface S2 of the N-type semiconductor substrate 10, resulting in a further improvement in reliability for the back illuminated photodiode 6.

The back illuminated photodetector according to the present invention is not restricted to the above-described embodiments, and various modifications may be made. For example, in the back illuminated photodiode 1 shown in FIG. 1, a P-type semiconductor substrate may be used instead of the N-type semiconductor substrate 10. In this case, the impurity semiconductor region 11 has N-type conductivity, while the highly-doped impurity semiconductor layer 21 and the highly-doped impurity semiconductor region 22 have P-type conductivity.

Although in FIG. 12 an example of depositing a conductive material 33 made of Cu is shown, Ni may be used instead of Cu to perform electroless plating of Ni directly on the surface of the anode electrodes 25 and the cathode electrodes 26 that are exposed from the through-holes 31a and 32a. In this case, it is possible to omit the step of polishing the surface of the conductive material 33 illustrated in FIG. 13.

Although in FIG. 15 an example of forming UBMs 34a and 34b as well as bumps 35a and 35b on the filling electrodes 33a and 33b is shown, there is also a method of employing the filling electrodes 33a and 33b themselves as bumps. That is, $O_2$, etc., is used to dry etch the surface of the supporting film 32 with the through-holes 32a being filled with the filling electrodes 33a and 33b (refer to FIG. 14). Thus, since the filling electrodes 33a and 33b partially protrude from the surface of the supporting film 32, the protruding portions can be used as bumps. In this case, it is also not necessary to form UBMs 34a and 34b. Alternatively, as a conductive material for forming the filling electrodes 33a and 33b, a conductive resin may be used. This allows the operation of filling the through-holes with electrodes by printing, etc., to be completed in a short time.

Although in FIG. 25 an arrangement that chamfered portions 13a are formed at the four corners of the window plate 13 is shown, it is only required that at least one corner of the window plate 13 is formed into a chamfered portion 13a. Also, in this case, it is possible to reduce the possibility of chipping relative to the case where no chamfered portion 13a is provided.

Also, in FIG. 29, as the N-type semiconductor substrate 20, as a bonded wafer in which an $N^+$-type highly-doped impurity semiconductor region and an N-type impurity semiconductor region having an impurity concentration lower than that of the $N^+$-type highly-doped impurity semiconductor region are bonded to each other may be used. In this case, the N-type impurity semiconductor region is to be provided on the upper surface S1 side, while the $N^+$-type highly-doped impurity semiconductor layer on the rear surface S2 side of the N-type semiconductor substrate 20.

Further, the window plate bonding step shown in FIG. 38 may be performed after the step of forming a passivating film 31 (refer to FIG. 40). Alternatively, the window plate bonding step may be performed after the step of polishing the surface of the conductive material 33 (refer to FIG. 43). In this case, since it is possible to perform anodic bonding with the thinned portions in the N-type semiconductor substrate 10 being protected by the supporting film 32, it is possible to prevent the N-type semiconductor substrate 10 from being physically damaged in an anodic bonding operation.

Although in the window plate bonding step shown in FIG. 49, the anodic bonding is performed with the insulating film 24 being formed in the entire rear surface S2 of the N-type semiconductor substrate 10, the anodic boding may be performed with the outer edge portions 14 of the N-type semiconductor substrate 10 being exposed by removing the insulating film 24 on the outer edge portions 14. In this case, the strength of the bonding between the window plate 13 and the outer edge portions 14 will be further improved.

Also, the window plate bonding step shown in FIG. 49 may be performed after the step of forming a passivating film 31 (refer to FIG. 51). Alternatively, the window plate bonding step may be performed after the step of polishing the surface of the conductive material 33 (refer to FIG. 54). In this case, since it is possible to perform anodic bonding with the thinned portions in the N-type semiconductor substrate 10 being protected by the supporting film 32, it is possible to prevent the N-type semiconductor substrate 10 from being physically damaged in an anodic bonding operation.

Although in FIG. 49, the Pyrex glasses 16 are formed only at the positions within the window plate 13 corresponding to the outer edge portions 14, a Pyrex glass 16, having a small thickness, may be formed on the entire window plate 13 because it never blocks optical transmission.

Also, the window plate bonding step shown in FIG. 65 may be performed immediately after the step of forming metal layers 17a on the outer edge portions 14 (refer to FIG. 60).

INDUSTRIAL APPLICABILITY

In accordance with the present invention, it is possible to achieve a back illuminated photodetector having a sufficiently small package as well as being capable of suppressing the scattering of to-be-detected light and method for manufacturing the same.

The invention claimed is:

1. A back illuminated photodetector comprising:
a first conductive type semiconductor substrate;
a second conductive type impurity semiconductor region provided in a first superficial surface layer of the semiconductor substrate;
a recessed portion for incidence of to-be-detected light formed in a second surface of the semiconductor substrate and in an area opposite the impurity semiconductor region; and
a window plate bonded to an outer edge portion of the recessed portion in such a manner as to cover the recessed portion to transmit the to-be-detected light,
wherein a stepped portion is formed in a side surface of the semiconductor substrate or in a side surface of the window plate.

2. The back illuminated photodetector according to claim 1, further comprising a supporting film provided on the first superficial surface layer of the semiconductor substrate to support the semiconductor substrate.

3. The back illuminated photodetector according to claim 2, further comprising a filling electrode penetrating through the supporting film and connected electrically to the impurity semiconductor region at one end thereof.

4. The back illuminated photodetector according to claim 1, wherein the window plate is made of an optically transparent material and is bonded to the outer edge portion by anodic bonding.

5. The back illuminated photodetector according to claim 4, wherein the optically transparent material is quartz, and wherein the window plate is bonded to the outer edge portion via a member containing alkali metal.

6. The back illuminated photodetector according to claim 1, wherein the window plate is bonded to the outer edge portion via a metal layer.

7. The back illuminated photodetector according to claim 1, wherein a highly-doped impurity semiconductor layer with impurities of the first conductive type added thereto at a high concentration is provided in the second surface in an outer edge portion of the semiconductor substrate.

8. The back illuminated photodetector according to claim 1, wherein a highly-doped impurity semiconductor layer with impurities of the first conductive type added thereto at a high concentration is provided in a bottom portion of the recessed portion within the second surface of the semiconductor substrate.

* * * * *